(12) United States Patent
Taketomi et al.

(10) Patent No.: US 6,806,498 B2
(45) Date of Patent: Oct. 19, 2004

(54) SEMICONDUCTOR THIN FILM, METHOD AND APPARATUS FOR PRODUCING THE SAME, AND SEMICONDUCTOR DEVICE AND METHOD OF PRODUCING THE SAME

(75) Inventors: Yoshinao Taketomi, Kytanabe (JP); Keizaburo Kuramasu, Kyotanabe (JP); Masumi Izuchi, Hirakata (JP); Hiroshi Satani, Yawata (JP); Hiroshi Tsutsu, Osaka (JP); Hikaru Nishitani, Nara (JP); Mikihiko Nishitani, Nara (JP); Masashi Goto, Moriguchi (JP); Yoshiko Mino, Nara (JP)

(73) Assignee: Matsushita Electric Industrial Co., Ltd. (JP)

( * ) Notice: Subject to any disclaimer, the term of this patent is extended or adjusted under 35 U.S.C. 154(b) by 13 days.

(21) Appl. No.: 10/218,310

(22) Filed: Aug. 15, 2002

(65) Prior Publication Data
US 2003/0022471 A1 Jan. 30, 2003

Related U.S. Application Data

(62) Division of application No. 09/581,768, filed as application No. PCT/JP98/05701 on Dec. 17, 1998, now Pat. No. 6,528,397.

(30) Foreign Application Priority Data

| Dec. 17, 1997 | (JP) | ............................................. | 9-347464 |
| Jan. 21, 1998 | (JP) | ........................................ | 10-009467 |
| Mar. 13, 1998 | (JP) | ........................................ | 10-062801 |
| Mar. 18, 1998 | (JP) | ........................................ | 10-067993 |
| May 20, 1998 | (JP) | ........................................ | 10-138318 |
| Jun. 11, 1998 | (JP) | ........................................ | 10-163130 |

(51) Int. Cl.[7] ............................................. H01L 31/036

(52) U.S. Cl. ............................ 257/64; 257/65; 257/66; 257/67; 257/255

(58) Field of Search ........................... 257/255, 67, 66, 257/65, 64

(56) References Cited

U.S. PATENT DOCUMENTS

| 5,294,811 A | 3/1994 | Aoyama et al. |
| 5,569,610 A | 10/1996 | Zhang et al. |

(List continued on next page.)

FOREIGN PATENT DOCUMENTS

| JP | 57-104217 | 6/1982 |
| JP | 58-178565 | 10/1983 |
| JP | 59-161014 | 9/1984 |

(List continued on next page.)

OTHER PUBLICATIONS

"SOI Structure Forming Techniques." Furukawa, S. Tokyo: Sangyo Tosho, 1987. p. 41. (Complete translation).

(List continued on next page.)

*Primary Examiner*—Richard Elms
*Assistant Examiner*—Doug Menz
(74) *Attorney, Agent, or Firm*—Parkhurst & Wendel, L.L.P.

(57) ABSTRACT

In a polycrystalline silicon thin film transistor, a semiconductor device having a high field effect mobility is achieved by increasing a grain size of a silicon thin film. First, an insulation layer having a two-layer structure is formed on a transparent insulated substrate 201. In the insulation layer, a lower insulation layer 202, which is in contact with the transparent insulating substrate 201, is made to have a higher thermal conductivity than an upper insulation layer 203. Thereafter, the upper insulation layer 203is patterned so that a plurality of stripes are formed thereon. Subsequently, an amorphous silicon thin film 204 is formed on the patterned insulation layer, and the insulation layer is irradiated with a laser light scanning in a direction parallel to the stripe pattern on the upper insulation layer 203. Thus, the amorphous silicon thin film 203 is formed into a polycrystalline silicon thin film 210.

4 Claims, 68 Drawing Sheets

U.S. PATENT DOCUMENTS

| | | | |
|---|---|---|---|
| 5,604,360 A | 2/1997 | Zhang et al. | |
| 5,605,846 A | 2/1997 | Ohtani et al. | |
| 5,612,251 A | 3/1997 | Lee | |
| 5,619,044 A | 4/1997 | Makita et al. | |
| 5,624,873 A | 4/1997 | Fonash et al. | |
| 5,661,311 A | 8/1997 | Takemura et al. | |
| 5,663,579 A | 9/1997 | Noguchi | |
| 5,674,757 A | 10/1997 | Kim | |
| 5,696,003 A | 12/1997 | Makita et al. | |
| 5,714,404 A | 2/1998 | Mitlitsky et al. | |
| 5,721,171 A | 2/1998 | Ping et al. | |
| 5,756,364 A | 5/1998 | Tanaka et al. | |
| 5,767,003 A | 6/1998 | Noguchi | |
| 5,985,741 A * | 11/1999 | Yamazaki et al. | 438/486 |
| 6,137,048 A | 10/2000 | Wu et al. | 136/260 |
| 6,160,279 A | 12/2000 | Zhang et al. | 257/255 |
| 6,190,949 B1 | 2/2001 | Noguchi et al. | 438/149 |
| 6,258,666 B1 | 7/2001 | Mizutani et al. | 438/258 |

FOREIGN PATENT DOCUMENTS

| | | |
|---|---|---|
| JP | 60-195976 | 10/1985 |
| JP | 62-003089 | 1/1987 |
| JP | 62-47113 | 2/1987 |
| JP | 63-031108 | 2/1988 |
| JP | 64-001273 | 1/1989 |
| JP | 64-050569 | 2/1989 |
| JP | 02-206173 | 8/1990 |
| JP | 03-022409 | 1/1991 |
| JP | 03-060043 | 3/1991 |
| JP | 03-114220 | 5/1991 |
| JP | 03-222324 | 10/1991 |
| JP | 03-290924 | 12/1991 |
| JP | 04-124813 | 4/1992 |
| JP | 04-365316 | 12/1992 |
| JP | 04-373171 | 12/1992 |
| JP | 05-021339 | 1/1993 |
| JP | 05-152334 | 6/1993 |
| JP | 06-029212 | 2/1994 |
| JP | 06-140323 | 5/1994 |
| JP | 06-140324 | 5/1994 |
| JP | 06-163406 | 6/1994 |
| JP | 06-177033 | 6/1994 |
| JP | 08-051074 | 2/1996 |
| JP | 08-083765 | 3/1996 |
| JP | 08-227855 | 9/1996 |
| JP | 08-293466 | 11/1996 |
| JP | 09-162121 | 6/1997 |
| JP | 09-199417 | 7/1997 |
| JP | 09-213651 | 8/1997 |
| JP | 02-695462 | 9/1997 |
| JP | 09-293687 | 11/1997 |
| JP | 10-064815 | 3/1998 |
| JP | 10-064842 | 3/1998 |
| JP | 08-107066 | 4/1998 |

OTHER PUBLICATIONS

"XeCl Excimer Laser Annealing Used in the Fabrication of Poly–Si TFTs." Sameshima, S., et al. *IEEE Electron Device Letters*. vol. EDL–7, No. 5, May, 1986. pp. 276–278.

"High Performance Poly–Si TFTs Fabricated Using Pulsed Laser Annealing and Remote Plasma CVD with Low Temperature Processing." Kohno Atsushi, et al. *IEEE Transactions on Electron Devices*. vol. 42, No. 2, Feb. 1995. pp. 251–257.

"Enlargement of P–Si Film Grain Size by Exclmer Laser Annealing and Its Application to High–Performance P–Si TFT." Noguchi, S., et al. Extended Abstracts of the 1991 International Conference on Solid State Devices and Materials, Yokohama, 1991. pp. 623–625.

"Improving the Uniformity of Poly–Si Films Using a New Excimer Laser Annealing Method for Giant–Microelectronics." Kurtyama, Hiroyuki, et al. *Japanese Journal of Applied Physics*. vol. 31 (1992), pp. 4550–4554, Part I, No. 12B, Dec. 1992.

"Poly–Silicon Thin–Film Transistors with Uniform Performance Fabricated by Excimer Laser Annealing." Asai, Ichirou, et al. *Japanese Journal of Applied Physics*. vol. 32 (1993), pp. 474–481, Part I, No. 1B, Jan. 1993.

* cited by examiner

FIG. 2
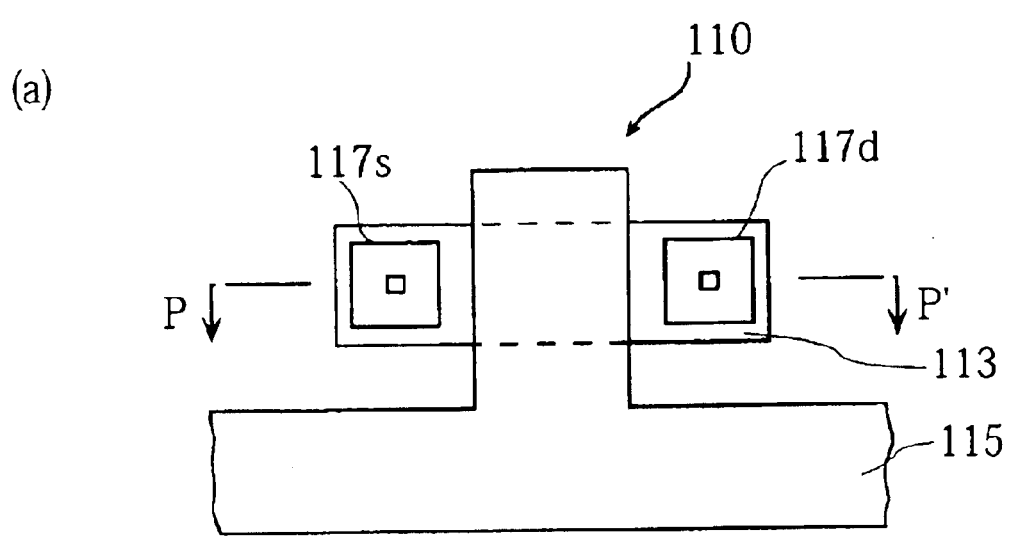
(a)
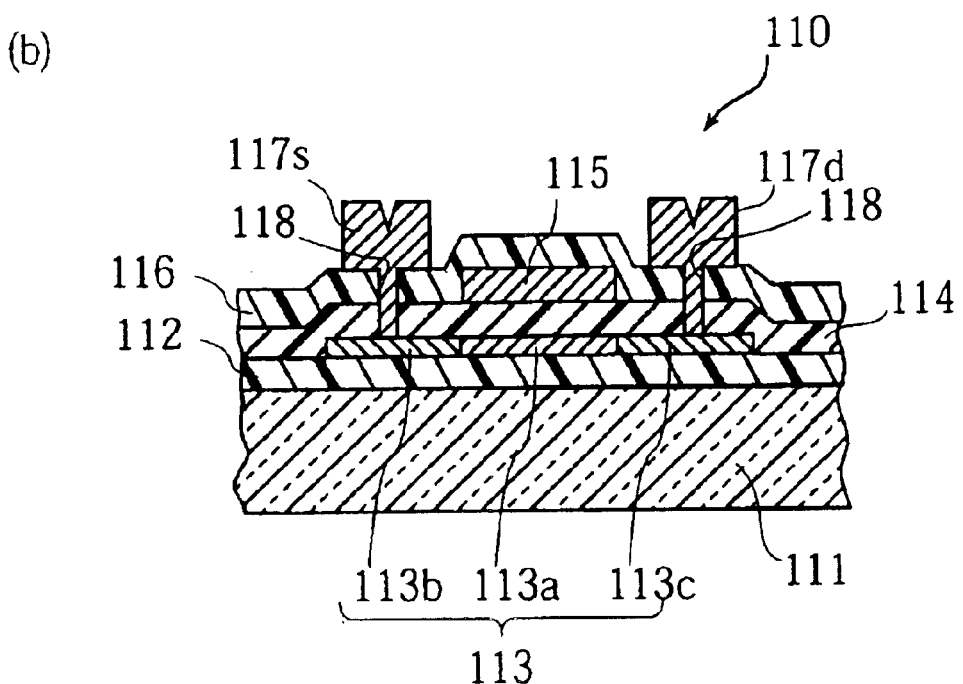
(b)

x(y) coodinate position in the region to be irradiated (a) Energy density distribution in laser irradiation (b) Temperature distribution in silicon thin film (c) State of crystallization in polycrystalline silicon thin film FIG. 14
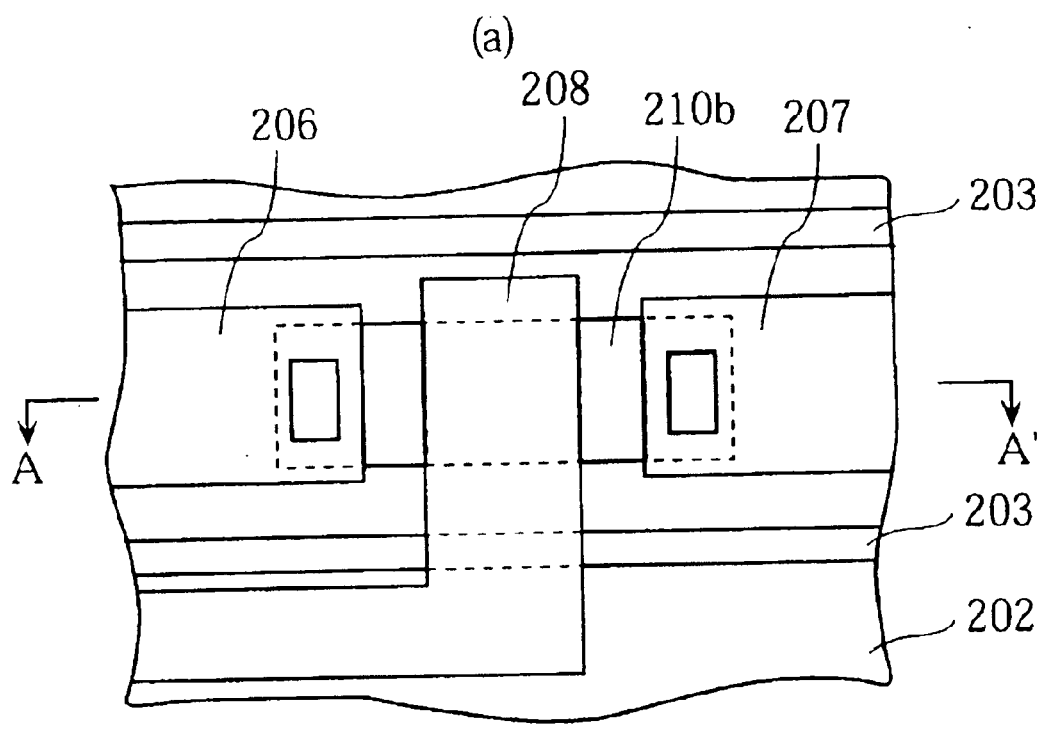
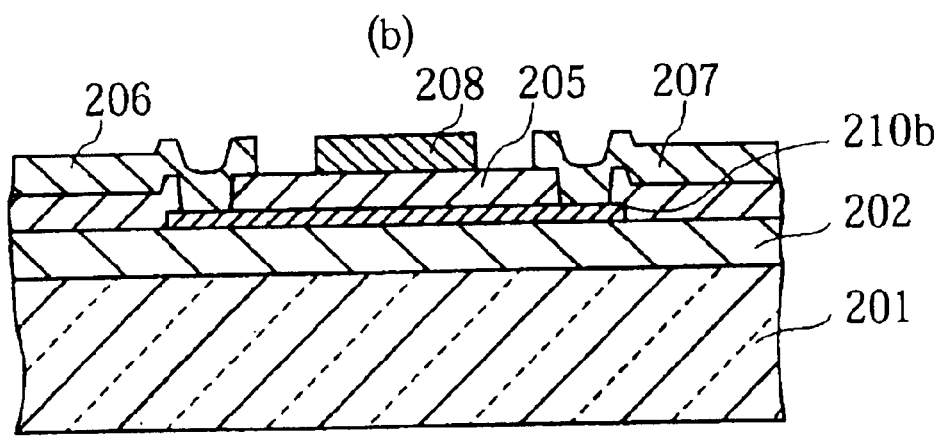

FIG. 16
(a)
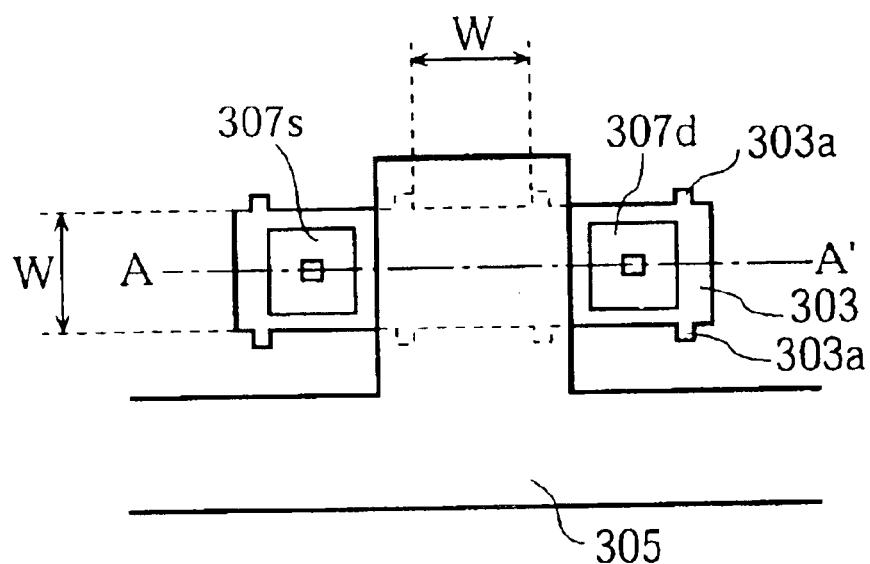
(b)
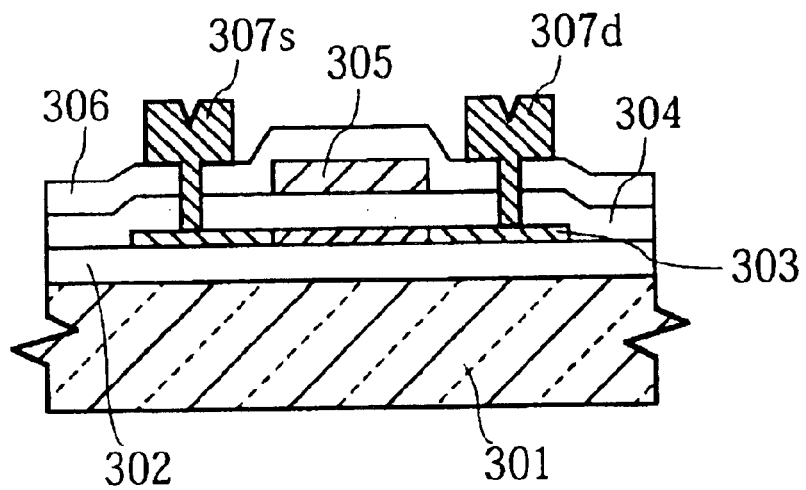

FIG. 17
(a)
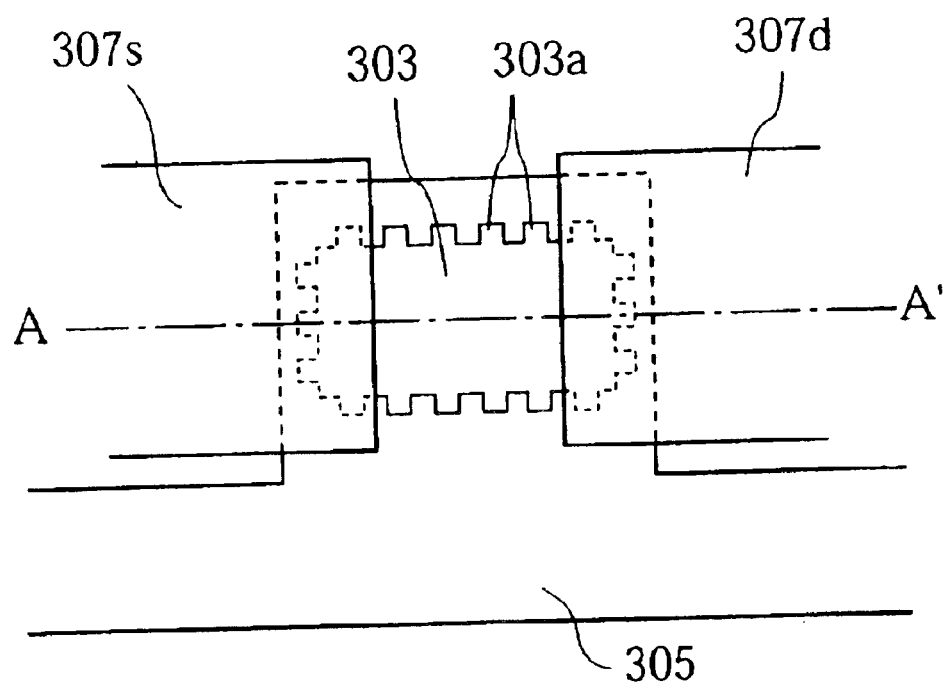
(b)
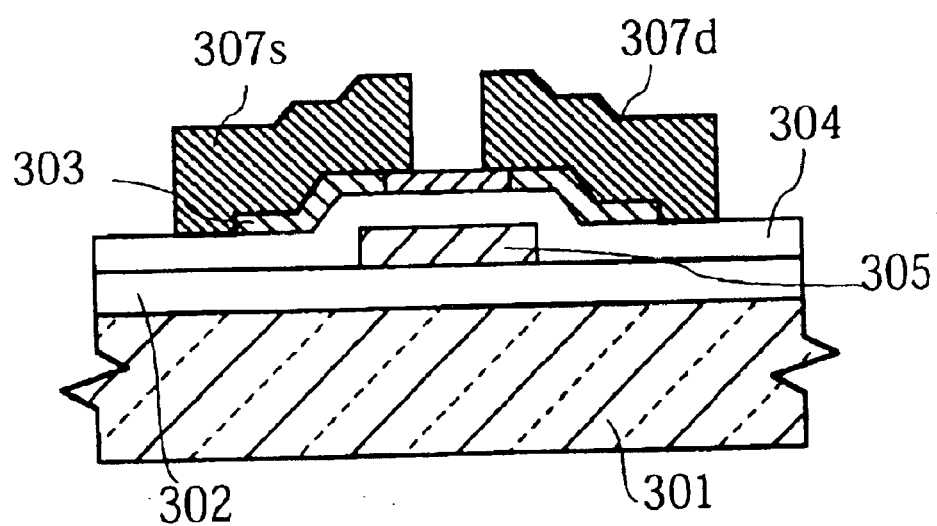

FIG. 20
(a)
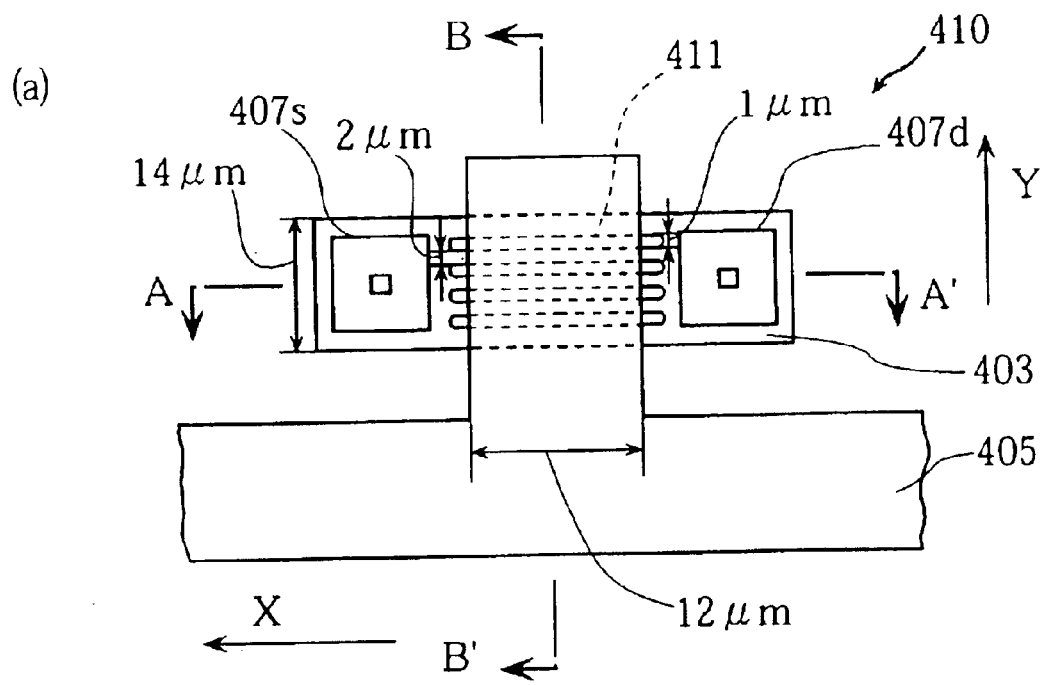
(b)
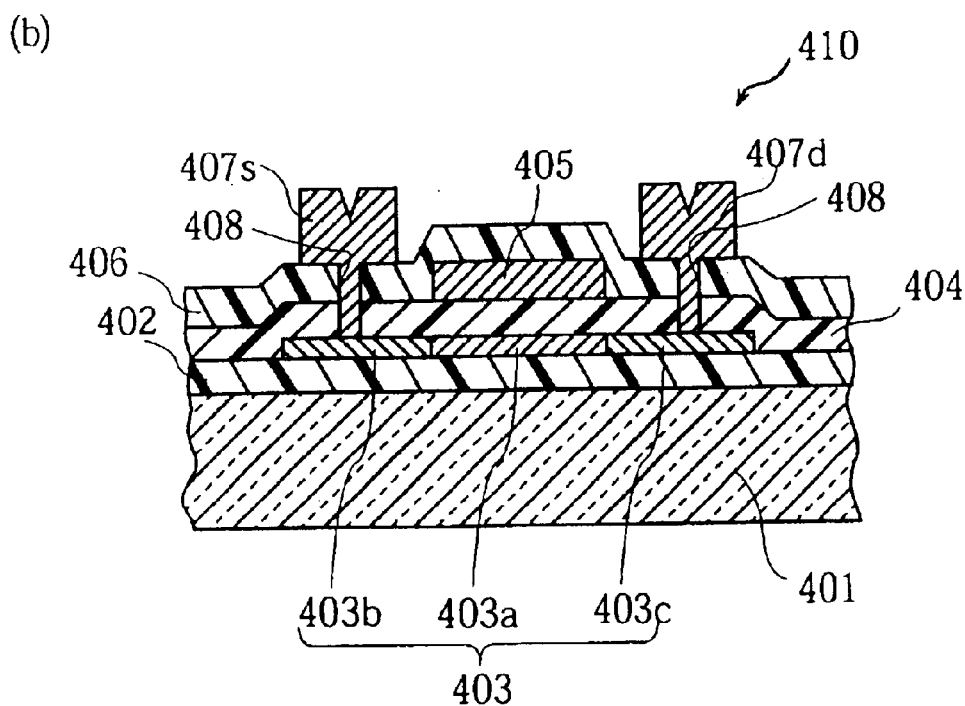

FIG. 23
(a)
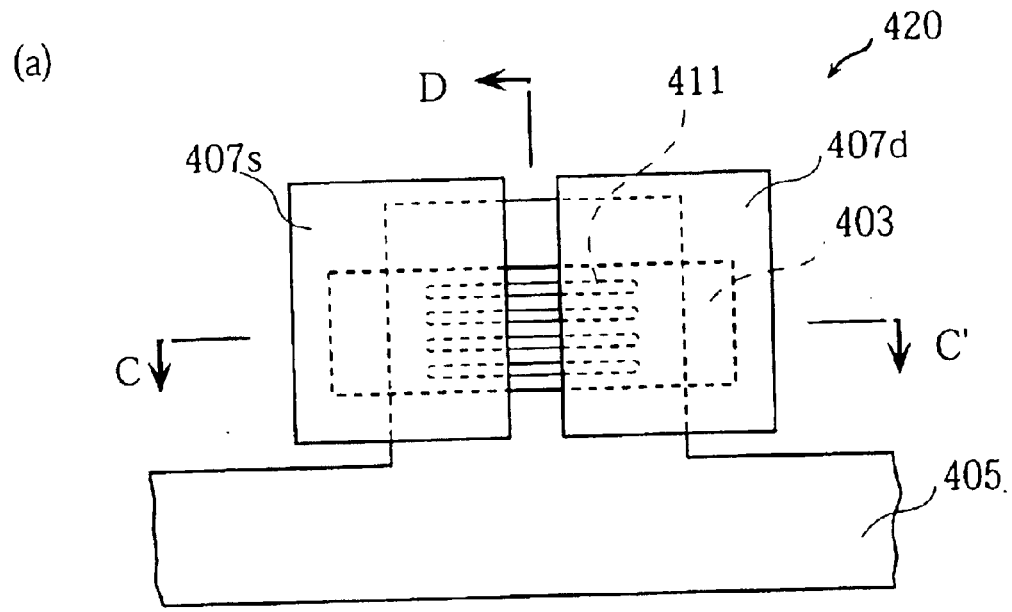
(b)
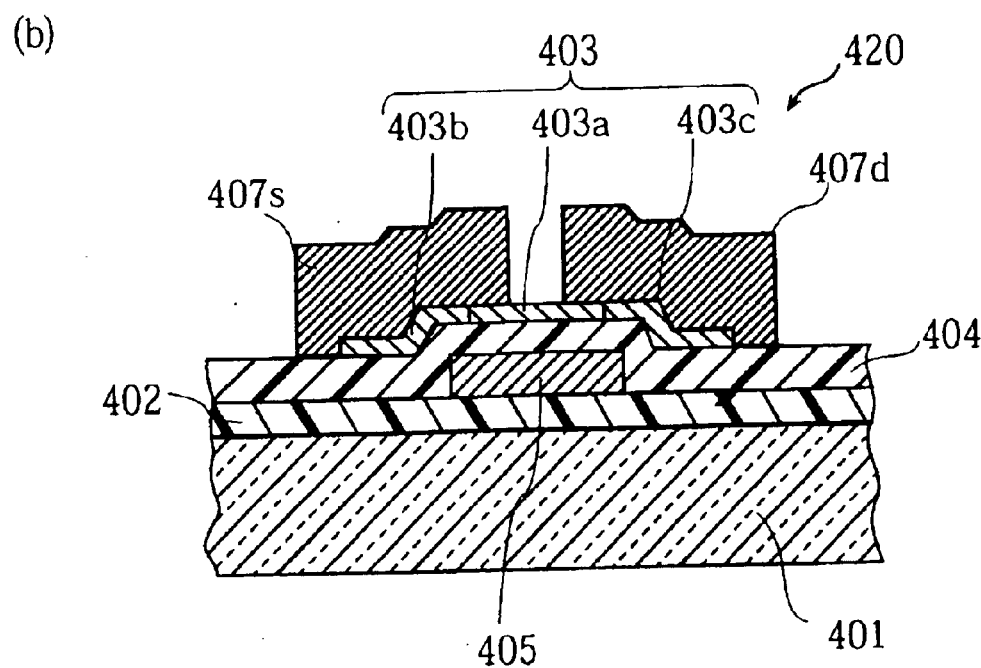

FIG. 25
(a) 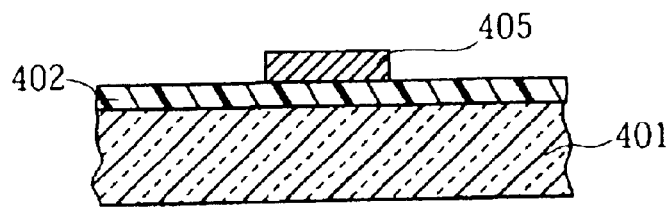
(b) 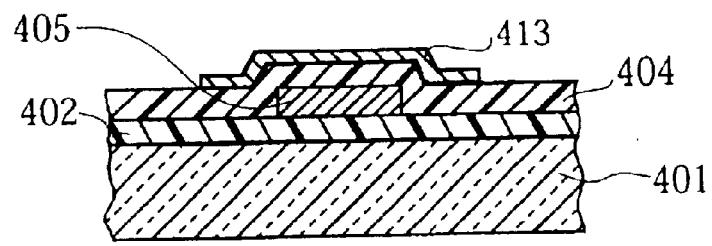
(c) 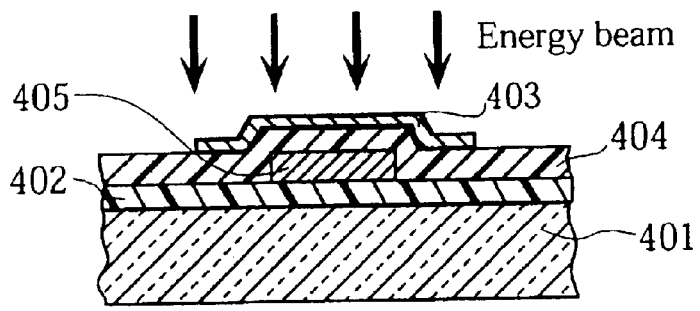
(d) 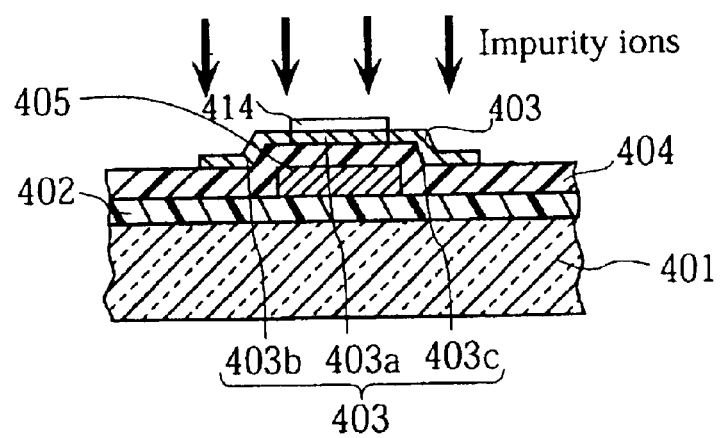
(e) 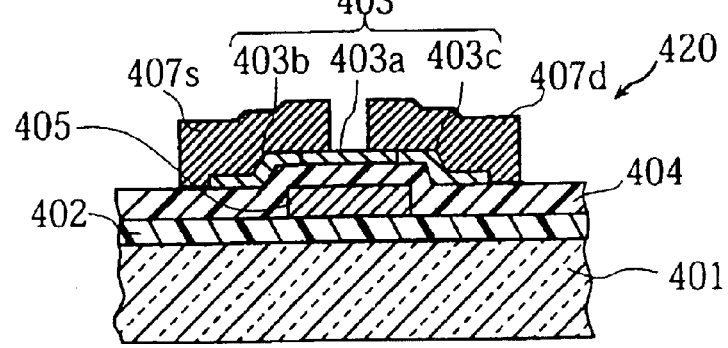

FIG. 62
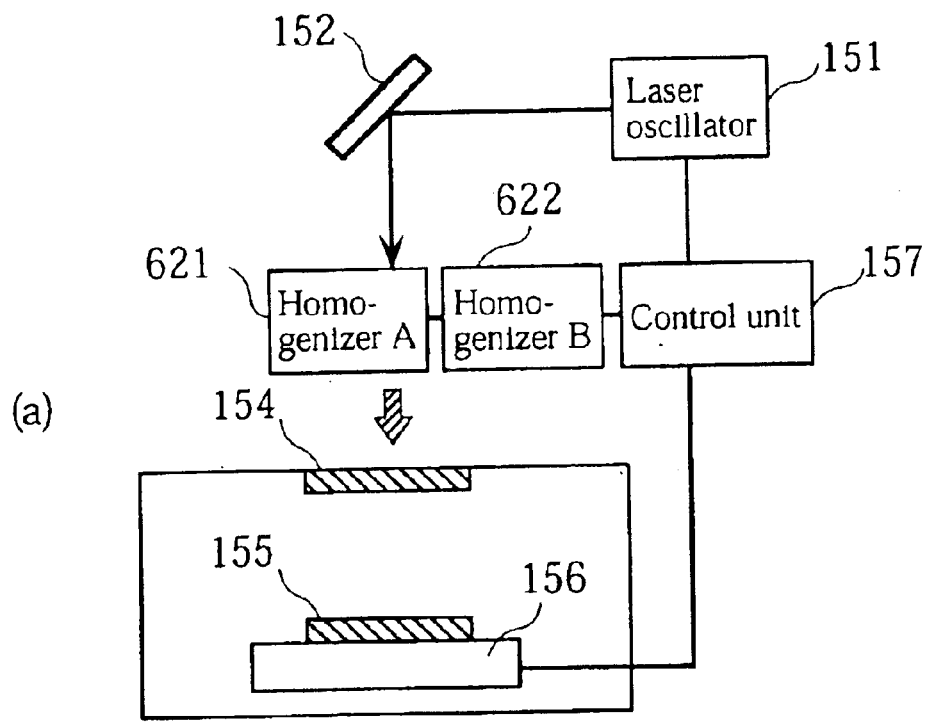
(a)
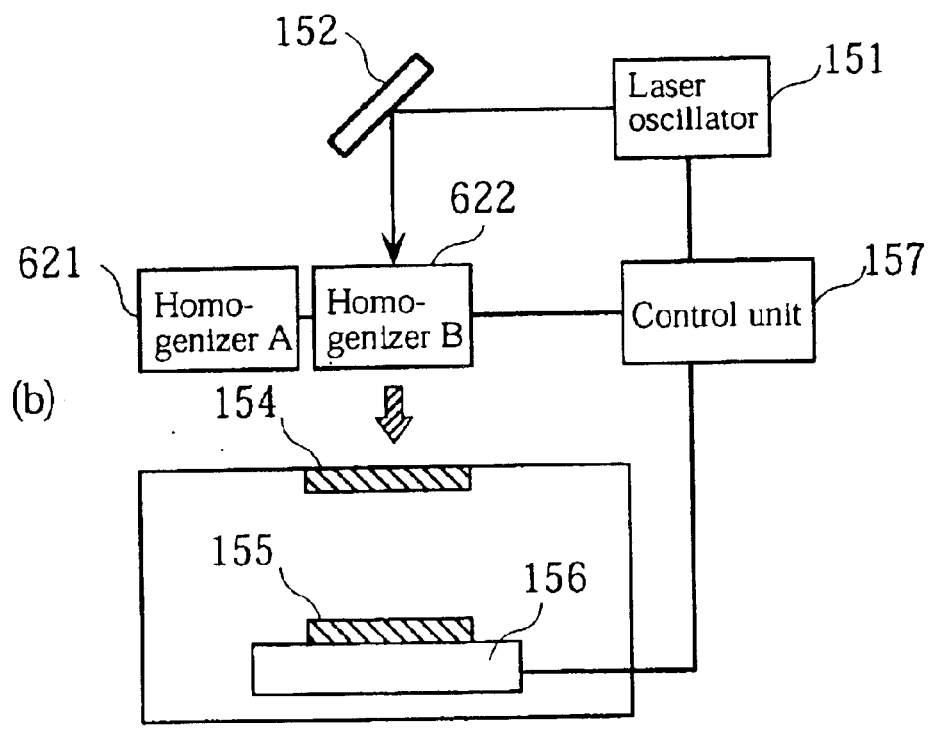
(b)

SEMICONDUCTOR THIN FILM, METHOD AND APPARATUS FOR PRODUCING THE SAME, AND SEMICONDUCTOR DEVICE AND METHOD OF PRODUCING THE SAME

This is a divisional of application Ser. No. 09/581,768 filed Jun. 16, 2000, now U.S. Pat. No. 6,528,397, which in turn is a U.S. national application of PCT/JP98/05701 filed Dec. 17, 1998.

TECHNICAL FIELD

The present invention relates to a semiconductor film for use in thin film transistors (TFTs) used in liquid crystal displays, photosensors such as linear sensors, photovoltaic devices such as solar cells, memory LSIs for SRAMs (static random access memories) and the like. The invention also relates to a method and an apparatus for producing the semiconductor film. More particularly, the semiconductor film is a crystalline semiconductor thin film formed on, for example, a glass substrate or the like, by laser annealing an amorphous material or the like. The invention further relates to semiconductor device using the semiconductor thin film and a method of producing the device.

BACKGROUND ART

Conventionally, high-quality silicon semiconductor thin films used in thin film transistors (TFTs) or the like have been fabricated on an amorphous insulating substrates by using plasma CVD methods and plasma CVD apparatuses utilizing glow discharge. The hydrogenated amorphous silicon (a-Si) films produced by these manufacturing methods and apparatuses have been improved over many years of research and development and reached to a standard applicable as high quality semiconductor thin films. The hydrogenated amorphous thin films have found use in electric optical devices such as switching transistors for pixels in active matrix liquid crystal displays for lap-top or note-type personal computers, engineering workstations, and automobile navigation systems, photosensors for image sensors in facsimile machines, and solar batteries for electronic calculators, and in various integrated circuits. One of the most significant advantages of the hydrogenated amorphous silicon is that the formation with high reproducibility and stability on a large-area substrate is achieved at a process temperature as low as 300° C.

Meanwhile, the recent advancement of increased device sizes and greater pixel densities (higher definitions) in displays and image sensors has led to the demand for silicon semiconductor thin films that can achieve further high speed driving. In addition, in order to reduce device weight and manufacturing cost, such thin films should be applicable to driver elements formed in the peripheral circuit area of a liquid crystal display, which also requires the thin films to be capable of operating at high speed. However, the foregoing amorphous silicon shows a field effect mobility of 1.0 cm$^2$/V·sec at best and thus cannot attain electric characteristics that can meet the requirements as mentioned above.

In view of the problems, research has been conducted on techniques for improving the field effect mobility and the like by forming a semiconductor thin film having crystallinity, and the developed manufacturing processes include:

(1) a manufacturing method in which by mixing a silane gas with hydrogen or SiF$_4$, and employing a plasma CVD method, the deposited thin film is crystallized; and (2) a manufacturing method in which by using amorphous silicon as a precursor, the crystallization of the film is effected.

In the method (1), the crystallization proceeds along with the formation of the semiconductor thin film, and the substrate must be heated to a relatively high temperature (600° C. or higher). This necessitates the use of a heat-resistant substrate such as costly quartz substrates, makes it difficult to use low-priced glass substrates, and therefore has a drawback of high manufacturing cost. Specifically, for example, Corning 7059 glass widely used in active matrix type liquid crystal displays has a glass transition temperature of 593° C., and therefore if subjected to a heating treatment at 600° C. or higher, the glass substrate will undergo considerable mechanical deformations such as shrinkage and strain, which makes it difficult to appropriately perform the forming processes of semiconductor circuits and the producing processes of liquid crystal panels. Furthermore, when a multi-dimensional integration is desired, there is a possibility of thermally damaging the previously-formed circuit area.

In the method (2) above, an amorphous silicon thin film is formed on a substrate, and the formed thin film is heated to obtain a polycrystalline silicon (polycrystal silicon: p-Si) thin film. This method generally utilizes a solid phase epitaxy method in which the heat treatment is performed at approximately 600° C. for a long time, and a laser annealing method (especially an excimer laser annealing method).

In the solid phase epitaxy method, the substrate on which an amorphous thin film is formed needs to be heated and maintained at a temperature of 600° C. or higher for 20 hours or longer, and thus this method also has drawbacks of high manufacturing cost and so forth.

In the excimer laser annealing method, an amorphous silicon thin film is irradiated with an excimer laser light, which is a UV light having a large light energy, to cause crystallization, as disclosed in, for example, IEEE Electron Device Letters, 7 (1986) pp. 276–8, IEEE Transactions on Electron Devices, 42 (1995) pp. 251–7. This method thereby achieves, without directly heating the glass substrate, a polycrystalline silicon thin film having relatively good electrical characteristics such as a high field effect mobility (higher than 100 cm$^2$/V·sec). More specifically, amorphous silicon has a transmissivity characteristic as shown in FIG. 1 and, for example, shows an absorption coefficient of about 10$^6$ cm$^{-1}$ for a laser beam having a wavelength of 308 nm by a XeCl excimer laser. Therefore, most of the laser beam is absorbed in the layer from the surface to a depth of about 100 Å, the substrate temperature is not raised significantly (to approximately not higher than 600° C.), and amorphous silicon alone is brought to a high temperature to cause crystallization (polycrystallization or single crystallization). This allows the use of low-cost glass substrates. In addition, it is possible to irradiate a limited area of the substrate with the light beam to crystallize, and this allows a multi-dimensional integration in which a pixel region not requiring high speed characteristics so much is left to be an amorphous thin film, while a peripheral region of the pixel region is crystallized so as to form a driver circuit thereon. Further, it is also possible to form high quality crystalline thin films in a specific region on a substrate one after another, without thermally damaging the circuits already formed on the substrate. Furthermore, this technique permits the integration of CPUs (central processing units) and the like on the same substrate.

As an example of a semiconductor device using p-Si as described above, explained below is a typical construction of a TFT and a manufacturing method thereof.

FIGS. 2(a) and 2(b) schematically show a TFT 110 having a coplanar structure. FIG. 2(a) is a plan view of the TFT 110, and FIG. 2(b) is a cross sectional view thereof taken along the line P-P' in FIG. 2(a). As shown in FIGS. 2(a) and 2(b), the TFT 110 has an insulating substrate 111 on which there are provided a undercoat layer 112, a p-Si film 113, a first insulating film (gate insulating film) 114, a second insulating film 116, and three electrodes, namely, a gate electrode 115, a source electrode 117s, and a drain electrode 117d. The p-Si film 113 is a crystalline semiconductor layer composed of Si (silicon). The p-Si film 113 is formed on the undercoat layer 112, patterned in a predetermined shape. The p-Si film 113 comprises a channel region 113a, a source region 113b, and a drain region 113c, and the source region 113b and the drain region 113c are disposed on both sides of the channel region 113a. The source region 113b and drain region 113c are formed by doping impurity ions such as phosphorus ions and boron ions.

The first insulating film 114 is made of, for example, silicon dioxide ($SiO_2$), and is formed over the p-Si film 113 and the undercoat layer 112. The gate electrode 115 is a metal thin film made of, for example, aluminum (Al) or the like. The gate electrode 115 is disposed above the first insulating film 114 at the position corresponding to the channel region 113a of the p-Si film 113. The second insulating film 116 is made of, for example, $SiO_2$, and stacked above the gate electrode 115 and the first insulating film 114.

The first insulating film 114 and the second insulating film 116 each have a contact hole 118 formed so as to reach the source region 113b or the drain region 113c in the p-Si film 113. Via the contact hole 118, the source electrode 117s and the drain electrode 117d are in contact with the source region 113b or the drain region 113c. In a region not being the cross section shown in the figure, the gate electrode 115, the source electrode 117s, and the drain electrode 117d are patterned in a predetermined shape to form a wiring pattern.

The TFT 110 is produced in the following manner. First, the undercoat layer 112, made of for example $SiO_2$, is formed on the insulating substrate 111. This prevents impurities from diffusing into a p-Si film 133 to be formed later. Next, on the undercoat layer 112, an a-Si film (not shown) as the foregoing amorphous silicon is deposited by, for example, a plasma CVD method. The a-Si film is then patterned into a predetermined shape by etching. It is noted that the patterning may be performed after the crystallization. Thereafter, the a-Si film is irradiated with an excimer laser having a short wavelength, and cooled (laser annealing). Thereby, the a-Si film is modified, i.e., the a-Si film is polycrystallized to form a p-Si film 113. Note here that the a-Si film has a large light absorption coefficient in a short wavelength range, and therefore, by employing an excimer laser as the energy beam, it is possible to selectively heat the a-Si film alone. Accordingly, temperature rise of the insulating substrate 111 is suppressed, and this leads to an advantage that low-cost substrates such as glass substrates can be employed for the insulating substrate 111.

On the p-Si film 113 thus formed, the first insulating film 114 is deposited by an atmospheric pressure CVD (chemical vapor deposition) method, and the gate electrode 115 is formed on the first insulating film 114. Thereafter, using the gate electrode 115 as a mask, impurity ions for serving as either donors or acceptors, specifically, such impurity ions as phosphorus ions and boron ions, are implanted into the p-Si film 113 by using, for example, an ion doping method. Thus, on the p-Si film 113, the channel region 113a, the source region 113b, and the drain region 113c are formed.

Next, the second insulating film 116 is formed on the gate electrode 115. Thereafter the contact holes 118 are formed, and aluminum, for example, is deposited, and patterning is performed to form the source electrode 117s and the drain electrode 117d.

The pulsed type laser such as the excimer laser used in the forming process of p-Si films as described above has a large output power, and by irradiating the substrate with the laser light in such a manner that the substrate is scanned by the laser light with a line-like shape while the substrate is being moved, a large-area amorphous silicon can be crystallized at one time, which is an advantage in the large-scale production of semiconductor devices. However, such a laser has a drawback that it is difficult to improve quality of the formed crystals. Specifically, a laser of this type has a very short irradiation time for 1 pulse, namely approximately several ten nanoseconds, and causes a large temperature difference between a time during which the irradiation is performed and a time during which the irradiation is not performed is large, and thereby, the fused silicon film crystallizes during the process of being rapidly cooled. Accordingly, the control of a degree of crystal growth and a crystal orientation is difficult, which leads to many drawbacks as follows: sufficient crystal growth tends not to occur, thereby crystal grain sizes are reduced and densities of grain boundaries are increased, unevenness in crystals is increased, and further crystal defects tend to increase. More specifically, in the process of cooling after the irradiation with the laser, crystal nuclei are formed in a disorderly manner, and the disorderly-formed crystal nuclei in turn grow in disorderly directions. The crystal growth stops in a state where crystal grains collide with each other. The crystal grains formed through such a growth process results in small grains having random shapes. Consequently, in the resulting poly-Si film, a large number of grain boundaries are present and therefore charge carriers cannot transfer smoothly, which causes the film to have poor TFT characteristics such as field effect mobilities.

Now, the mechanism of the crystal growth and the reasons why a good crystal growth is difficult to attain are detailed below. The aforesaid excimer laser is generated by exciting a mixed gas containing a rare gas such as Xe and Kr and a halogen such as Cl and F with the use of an electron beam. However, the laser as it is cannot be suitably used. By using an optical system called a beam homogenizer, the light beam generally used in laser annealing is shaped into a light beam having a homogeneous light intensity and having a line-like shape or a rectangular shape with each line segment being about several centimeters. The light beam thus shaped is employed for the technique in the crystallization of non-single crystalline thin films (normally, amorphous thin films), the technique in which the substrate is scanned with the light beam.

Yet, this technique has several problems to be solved, such as poor uniformity in crystal grain sizes and in crystallinity, unstable transistor characteristics, and low field effect mobilities. In view of these problems, the following techniques have been suggested.

(1) By covering part of the surface to be irradiated with a reflective film or absorption film so as to control light absorption on the surface of the thin film, a light intensity distribution is formed to guide an orientation of crystal growth.

(2) A substrate is heated (at 400° C.), and the laser is applied to the heated substrate, so that a smooth crystallization takes place. (Extended Abstracts of the 1991 International Conference on Solid State Devices and Materials, Yokohama, 1991, pp. 623–5)

Additionally, a technique disclosed in Jpn. J. Appl. Phys. 31 (1992) pp. 4550–4 is also known.

As shown in FIG. 3, a glass substrate 121 having a precursor semiconductor thin film 122 formed thereon is placed on a substrate stage 124. With a substrate stage 124 heated at about 400° C. by a substrate heater 125, a laser beam 123a of an excimer laser 123 is applied to the precursor semiconductor thin film 122. The additional heating of the glass substrate in the irradiation with laser beam achieves high crystal quality, i.e., relatively large and uniform crystal grains, thereby improving the electrical characteristics.

Technique (1) described above can be employed to obtain a single crystal, whereas technique (2) above is relatively easy to implement and can suppress the variation of field effect mobilities within ±10%. However, these techniques have the following problems and cannot meet the requirements in recent technical trends towards multi-dimensional integration and further cost reduction.

Specifically, technique (1) above requires a step of providing a reflective film etc., which complicates the manufacturing process and adds the manufacturing cost. Furthermore, since providing a reflective film etc. in a narrow, limited space is difficult, crystallization of specific regions with a very small size is accordingly problematic.

On the other hand, technique (2) involves a step of heating the substrate, which reduces the productivity. Although the substrate is not heated at such a temperature as required in a solid phase epitaxy method, the step of heating and cooling the substrate takes a long time (30 minutes to 1 hour, for example), which reduces the throughput. This problem becomes more serious as a substrate area increases, since a larger substrate requires a longer time for heating and cooling to alleviate the deformation of the substrate. In addition, this technique can reduce the variation of field effect mobilities to a certain extent, but cannot sufficiently increase the field effect mobilities per se, and therefore it is not suitable for producing circuits in which high speed operation is required. In order not to cause the deformation etc. of the glass substrate, the substrate cannot be heated in excess of 550° C., and therefore it is difficult to attain further higher crystal quality. Moreover, this technique involves heating the entire substrate, and therefore is not suitable for the crystallization in a limited region (specific region) on the substrate.

As has been described above, both techniques (1) and (2) above have problems such as high manufacturing cost. Particularly, techniques (1) and (2) above (including other prior art techniques) have a significant problem of the difficulty in realizing diverse and multi-dimensional layer stacking. In other words, the methods for controlling the temperature distribution employed by these techniques are not suitable for selectively forming on a single substrate both a circuit region where high speed operation is required (polycrystallized region) and another circuit region where not such high speed is required (amorphous region). For this reason, by these techniques, it is difficult to achieve both a high degree of integration and cost reduction at the same time.

The technique capable of crystallizing only a predetermined limited region is useful, and this will be elaborated upon now. Prior art laser annealing methods have employed a light beam having such a characteristic that the side (edge) of the beam is steep, and the top is flat (the energy intensity per unit area is uniform), as shown in FIG. 4. Poly-Si thin films produced with the use of such a light beam have been conventionally seen as sufficient for the requirements for forming switching circuits and the like for pixel electrodes, for which such high speed operation is not required.

However, in the case of integrally forming the elements requiring high speed operation such as CPUs as well as a gate driving circuit and a source driving circuit on a single substrate, the polycrystalline thin films of the quality realized by the prior art technique are unsatisfactory. For example, the pixel region of LCDs generally requires a mobility of about 0.5–10 $cm^2/Vs$, whereas the peripheral driving circuits for controlling the pixels, such as gate circuits and source circuits, require a mobility as high as about 100–300 $cm^2/Vs$. In spite of such requirements, the prior art technique utilizing the light beam having the above-described characteristic cannot achieve high mobilities constantly. In other words, generally in polycrystalline silicon thin films, higher transistor characteristics are attained as the crystal grain size is increased, but the above-described polycrystallization treatment cannot attain sufficient transistor characteristics.

The reason is that when the light beam having the above-described characteristic is employed, unevenness in crystal grains and crystallinity is increased, and in addition, when the irradiation intensity and the number of times of the irradiation are increased to improve the crystallization, the crystal grain sizes become more uneven, further varying the crystallinity. The cause of this problem will now be discussed in detail below.

FIG. 5 schematically shows the distribution of crystallinity in the case where the above-described rectangular light beam is applied to an amorphous silicon thin film formed on a substrate. In FIG. 5, the numeral 1701 refers to the boundary of the irradiation beam, the numerals 1702 and 1704 refer to the portions where the crystallinity is low, and the shaded portion 1703 indicates the portion where the crystallinity is high. As shown in FIG. 5, by the prior art method utilizing an excimer laser having a uniform energy intensity, the crystallinity shows such a distribution pattern that only the shaded portion 1703 slightly inside the boundary of the irradiation light shows high crystallinity, whereas the crystallinity is low in the other portions (the adjacent portion 1702 to the boundary, and the central portion 1704) show low crystallinity. This has been confirmed by micro-Raman spectroscopy.

FIG. 6 shows the measurement result of Raman intensity on the portion along the line A—A in FIG. 5. The abrupt peaks in FIG. 6 existing slightly inside the boundary indicate that the crystallinities in these portions are high. In addition, the absence of peaks in the central portion shows that the crystallinity in the central portion is low.

Referring now to FIG. 7, the mechanism of such unevenness in crystallinity will be discussed below. An amorphous silicon thin film is irradiated with a light beam to heat the thin film so that the temperature of the thin film is increased above the melting point temperature of silicon (about 1400° C. or higher), and thereafter the light irradiation is stopped. Thereby, the temperature of the thin film decreases by heat dissipation, and in this process, the fused silicon crystallizes. Here, when the light beam has a uniform distribution of the light intensity as in FIG. 7(a), the surface of the irradiated thin film shows a temperature distribution pattern as in FIG. 7(b). That is, a flat temperature region in which no temperature gradient is present is formed in the central portion, and an abrupt temperature gradient is formed in the peripheral regions since the heat escapes outside. In this case, when the temperature of the central portion is higher than the melting point of silicon, the temperature in the portions adjacent to the intersection points of the temperature distribution curve

1901 and the crystallization temperature line 1902 (adjacent portions to the boundary) reaches the crystallization temperature first after the irradiation is stopped. Therefore, crystal nuclei 1903 are formed in the vicinity of these portions (see FIG. 7(c)). In other words, the temperature of the amorphous silicon film is increased at a temperature higher than the melting point, and when the amorphous silicon thin film is fused and then solidified in the regions heated above the melting point, crystallization occurs, resulting in polycrystallization. Following this, as the temperature further decreases (FIG. 7(d)), the crystallization further proceeds from the crystal nuclei 1903 as the starting points towards the central portion, where the temperature has not yet reach the crystallization temperature (FIG. 7(e)). In the case of using the light beam having a uniform energy intensity, the temperature decreases in such a manner that no temperature gradient in the surface direction in the central portion is present, as shown in FIGS. 7(b), 7(d), and 7(f). Accordingly, at a certain point during the temperature decrease, a relatively wide region reaches the crystallization temperature at one time (FIG. 7(f)), and the crystal nuclei can be formed at any point of the wide region 1904 with an equal probability. Therefore, as shown in FIG. 7(g), micro crystal nuclei are simultaneously formed on the entire surface of the region 1904, and as a result, a poly-Si thin film made of a multiplicity of microcrystal grains is formed. Such a poly-Si thin film inevitably has a large density of grain boundaries. Therefore, the degree of carriers being caught in the grain boundaries increases, reducing the field effect mobility. It is noted that in FIG. 7(c), the numeral 1900 represents a cross section of the thin film.

The above-described mechanism for the unevenness of crystallinity being caused also applies to the case of employing a line-like laser beam for the irradiation, as shown in FIG. 8. FIG. 8(a) illustrates the distribution of energy densities in the directions x and y of an excimer laser to be used. FIG. 8(b) shows the distribution of the increased temperatures of the amorphous silicon thin film irradiated with the excimer laser having such energy densities. FIG. 8(c) is a perspective view of a polycrystalline silicon thin film transistor irradiated with the laser as shown in FIGS. 8(a) and 8(b). As seen from these figures, since the laser having such an energy distribution as shown in FIG. 8(a) is employed, the region to be irradiated shows a temperature distribution almost uniform along the y direction, but shows such a temperature distribution in the x direction that the central portion is high and both side portions are low, as shown in FIG. 8(b). Due to such a temperature distribution, the crystallization proceeds from the peripheral regions towards the central region along the x direction, and the crystallization growth fronts of the numerous formed crystal nuclei from both peripheral regions meet at the central region. Therefore, as shown in FIG. 8(c) which schematically illustrates the state of the crystallization in the polycrystalline silicon thin film, although the crystal grain size is large in the regions where the line beam energy density of the laser beam is low, the grain size becomes small in the region where the energy density is high (the central region). For reference, in FIG. 8(c), the numeral 131 designates the transparent insulating substrate, the numeral 134 the polycrystal silicone thin film, and the numeral 141 the crystal grains. The numeral 139 refers to an insulating film which generally composed of a silicon dioxide ($SiO_2$) film, and the numeral 140 represents the amorphous silicon thin film.

Although, for the sake of brevity, the above-described example describes a case where the energy beam is applied only one time, the same explanation applies to such cases that the energy beam is applied a plurality of times In addition to the difficulty in improving field effect mobilities, prior art laser annealing methods have other drawbacks of the difficulty in improving the uniformity in quality of semiconductor films and of the difficulty in meeting both these requirements.

Referring now to FIG. 9, a prior art leaser annealing apparatus is described below. In FIG. 9, the numeral 151 designates a laser oscillator, the numeral 152 a reflector, the numeral 153 a homogenizer, the numeral 154 a window, the numeral 155 a substrate having an amorphous silicon layer formed thereon, the numeral 156 a stage, and the numeral 157 a control unit. The laser annealing apparatus is so constructed that a laser light emitted from the laser oscillator 151 is guided to the homogenizer 153 by the reflector 152, and the laser beam shaped by the homogenizer 153 in a predetermined shape with a uniform energy is applied through the window 154 onto the substrate 155 fixed on the stage 156 in the treatment chamber.

When performing an annealing treatment with the use of the above-described annealing apparatus, because it is difficult to irradiate the entire substrate surface with a laser beam at one time, the regions to be irradiated is in turn staggered so that the region to be irradiated overlaps with the already irradiated region, in order to irradiate the entire substrate surface under the same condition. See for example, I. Asai, N. Kato, M. Fuse, and T. Hamano, Jpn. J. Apl. Phys. 32 (1993) p. 474. However, in such a laser annealing method, in which the laser beam is applied in such a manner that the regions to be irradiated are in turn staggered so that the region to be irradiated overlaps with the already irradiated region, increasing the laser energy density can lead to an increase in the mobility, which is one of the evaluation standards for semiconductor film characteristics, thereby increasing the film quality as a whole. However, the increased laser energy density also increases non-uniformity of the film quality at the overlapped regions, thus degrading the uniformity of the semiconductor film as a whole. On the other hand, when a relatively low energy density is employed in the laser irradiation, improving the uniformity of the film quality becomes easier, but because of the low energy density, increasing the field effect mobility becomes difficult.

Accordingly, in the case of employing a substrate having TFTs formed thereon for a liquid crystal display as schematically shown in FIG. 10, it has been difficult to form a semiconductor film which satisfies both uniformity of the film quality, required for an image display region 158 having a relatively large area, and field effect mobilities, required for a peripheral circuit (driver circuit) region 159. It is to be noted here that as a solution to this problem, U.S. Pat. No. 5,756,364 suggests that the image display region 158 and the peripheral circuit region 159 be irradiated with laser beams with different intensities. However, by merely varying the laser beam intensities, it is still difficult to obtain a field effect mobility sufficient for the peripheral circuit region 159.

Hence, as has been described above, prior art laser annealing methods have the following drawbacks. Controlling crystal grain sizes and crystal orientations is difficult and thereby forming semiconductor thin films having high crystal quality, i.e., large and uniform crystal grain sizes and few crystal defects. In addition, the reduction in manufacturing cost by increasing throughputs is difficult. Furthermore, prior art methods cannot achieve the improvement in film characteristics of semiconductor thin films (field effect mobilities etc.) and the uniformity of the film quality at the same time.

In view of the foregoing and other problems of prior art, it is an object of the present invention to provide a method of producing a semiconductor thin film that can achieve a semiconductor thin film having a high crystal quality without sacrificing throughputs, and can also achieve both an improvement in film characteristics and a uniformity in film quality in the semiconductor thin film at the same time.

It is another object of the present invention to provide an apparatus for producing such a semiconductor thin film.

It is further another object of the present invention to provide a thin film transistor having excellent TFT characteristics such as field effect mobilities and the like, by utilizing the semiconductor thin film.

It is yet another object of the present invention to provide a method for producing such a thin film transistor.

It is to be noted here that the term "crystallization" as used herein means both single crystallization and polycrystallization, and that a method for producing a crystalline semiconductor thin film according to the present invention is particularly useful in producing poly-Si thin films.

DISCLOSURE OF THE INVENTION

In view of the foregoing and other problems of prior art, it is an object of the present invention to provide a method of producing a semiconductor thin film that can achieve a semiconductor thin film having a high crystal quality without causing the reduction in throughputs, and can also achieve both an improvement in film characteristics and a uniformity in film quality in the semiconductor thin film at the same time.

It is another object of the present invention to provide an apparatus for producing such a semiconductor thin film.

It is further another object of the present invention to provide a thin film transistor having excellent TFT characteristics such as field effect mobilities and the like, by utilizing the semiconductor thin film It is yet another object of the present invention to provide a method for producing such a thin film transistor.

In order to provide a solution to the foregoing problems, the present inventors have, as a result of intensive studies, found a method of forming at least a region in which a transistor is formed into a polycrystalline silicon thin film having a large grain size, based on the consideration that a cause of crystal grains in a polycrystalline silicon thin film being undesirably small is a temperature variation in the silicon thin film heated by irradiating with an excimer laser.

More specifically, the present inventors have reached the following idea; when performing a polycrystallization treatment by laser, by providing a region having a high thermal conductivity on both sides of the region in which a transistor is formed so as to sandwich the transistor-forming region, the temperature of the peripheral regions sandwiching the transistor-forming region is made higher than the temperature of the transistor-forming region, which makes the temperature of the transistor forming region lower relative to the peripheral regions, and thereby the silicon film in the transistor-forming region is initially crystallized to increase crystal grain sizes.

Accordingly, in accordance with a first aspect of the invention, there is provided a method of producing a semiconductor thin film comprising the steps of stacking on a substrate a first insulating film having a first thermal conductivity and a second insulating film having a second thermal conductivity being different from the first thermal conductivity, the second insulating film selectively formed in a partial region on the substrate, stacking a non-single crystal semiconductor thin film over the first insulating film and the second insulating film, and irradiating the non-single crystal semiconductor thin film with an energy beam to effect a crystal growth.

Specifically, for example, in an insulating film under an amorphous silicon thin film, a thermal conductivity of a region in which a transistor is formed is made different from a thermal conductivity of other regions, and thereby a thermal conductive performance of the amorphous silicon thin film in the region in which a transistor is formed is made higher than that of the amorphous silicon thin film in the other regions.

By employing this method, in the polycrystallization, the temperature of the silicon thin film in the region where a transistor is formed is lower than that of the other regions, and as a result, crystallization starts from the region in which a transistor is formed. Consequently, a grain size of the polycrystalline silicon in the region in which a transistor is formed can be made large.

In accordance with another aspect of the invention, in at least a part of a peripheral edge of the semiconductor thin film, at least one protruding part extending towards a horizontal direction with respect to the semiconductor film may be provided.

Now, for a better understanding of the present invention, an approach which the inventors have taken to reach the present invention is described below. First, the present inventors made strenuous efforts in order to discover the cause of the foregoing problems in prior art, and reached the following factors as the cause. Generally, the generation of crystal nuclei and the crystal growth are effected by heating a semiconductor film by an annealing treatment and thereafter cooling the semiconductor film. In the prior art, the semiconductor film is almost uniformly cooled after the annealing treatment regardless of whether it is in the central region or in the peripheral region, and as a result, crystal nuclei start to develop at random positions almost at one time. It is considered that this makes it difficult to control crystal grain sizes and crystal orientations. Also for the same reason, crystal nuclei start to develop at relatively adjacent positions almost at one time and thereby the crystals tend to interfere with each other in the process of crystal growth. This makes it difficult to obtain a sufficient crystal grain size.

Based on the above factors, the present inventors have made strenuous studies and reached a technical idea of the present invention that "the formation of crystal nuclei in the peripheral region in the semiconductor film is started earlier than the formation of crystal nuclei in the central region, and thereafter the crystal nuclei formed in the peripheral region are grown towards the central region before crystal nuclei start to form or grow, in order to control crystal grain sizes and crystal orientations and to obtain a sufficient crystal grain size by preventing the crystals undergoing crystal growth from interfering with each other."

More specifically, in accordance with this aspect of the invention, in the semiconductor film after the annealing treatment, the heat accumulated in the protruding part in the peripheral edge diffuses in a plurality of outward directions with regard to a horizontal plane (for example, in three directions in the case of the protruding part having a rectangular shape), whereas the heat accumulated in the central region can escape, with regard to a horizontal plane, only in the directions towards the peripheral edge, which has not yet been cooled, and therefore the peripheral edge region, including the protruding part, can be cooled sufficiently earlier than the central region.

Accordingly, the crystal nuclei in the peripheral edge region start to form earlier than those in the central region, and the crystal nuclei in the peripheral region grow towards the central region before crystal nuclei are formed or grown in the central region, which makes it possible to control crystal grain sizes and crystal orientations. Thereby, it is prevented that the crystals in the process of crystal growth interfere with each other, and a sufficient crystal grain size can be obtained.

In another embodiment of this aspect of the invention, the protruding part may have a size such that one crystal nucleus is formed when crystal growth takes place by irradiating with the energy beam. Accordingly, only one crystal nucleus is formed in the protruding part, and the crystal nucleus is grown to be a crystal. In still another embodiment of this aspect of the invention, a length of said protruding part in a direction of protruding is greater than a film thickness of said semiconductor thin film, and equal to or less than 3 μm, or a width of the protruding part in a width direction perpendicular to the direction of protruding is greater than the film thickness of the semiconductor thin film, and equal to or less than 3 μm. Accordingly, the crystal grain size is further finely adjusted, and it is ensured that one crystal nucleus is formed in each protruding part.

In another embodiment of this aspect of the invention, the semiconductor thin film may be formed in a shape having a pair of line segments opposed to each other; two or more of the protruding parts may be formed in each of the pair of line segments; and an interval of the protruding parts next to each other in each of the pair of line segments may be set to be approximately equal to an interval of the opposing line segments.

Accordingly, the crystal nucleus formed and grown in the protruding part further grows towards the central region, and it is expected that crystal growth is effected such that both the crystals grown from the protruding parts next to each other towards the central region and the crystals grown from the protruding parts in the opposed line segments towards the central region are grown with a minimum interference with each other.

In another embodiment of this aspect of the invention, there is provided a semiconductor device comprising a semiconductor thin film wherein crystals are grown by irradiating a non-single crystal semiconductor thin film with an energy beam, characterized in that a protruding part is formed in a peripheral edge region of the semiconductor thin film, the protruding part extending outwardly in the same plane as a plane of the semiconductor thin film.

In the above device, a thin film transistor having a source region, a gate region, and a drain region each made of the semiconductor thin film may be formed, and the protruding part may be formed at least in a peripheral edge region of the gate region.

Accordingly, the protruding part is provided in the region corresponding to the gate electrode, and thereby a good electrical conductivity is obtained.

In another embodiment of the invention, there is provided a method of producing a semiconductor thin film, comprising the steps of forming a non-single crystal semiconductor thin film having a protruding part extending outwardly in the same plane as a plane of the non-single crystal semiconductor thin film, and growing crystals in the non-single crystal semiconductor thin film by irradiating with an energy beam.

In a semiconductor film produced according to the above-described method, the same advantageous effects as described above are attained.

In another embodiment of the invention, crystal nuclei in a peripheral region in the non-single crystal semiconductor thin film are formed earlier than crystal nuclei in a central region in the non-single crystal semiconductor thin film, and thereafter, the crystal nuclei in the peripheral region are grown towards the central region before the crystal nuclei in the central region start to be formed or grown. Thereby, it is made possible to control crystal grain sizes and crystal orientations.

This achieves a sufficient crystal grain size since it is prevented that crystals in the process of crystal growth interfere with each other.

In order to the foregoing and other problems in prior art, the present invention also provides a crystalline thin film transistor including a crystalline semiconductor layer formed on a substrate, the crystalline semiconductor layer comprising a channel region, a source region disposed at both sides of the channel region, and a drain region, wherein the crystalline semiconductor layer is such that a non-single crystalline thin film is crystallized, and at least in the channel region in the crystalline semiconductor layer, a gap for controlling an orientation of crystal growth is provided.

In the above-described configuration, a gap for controlling an orientation of crystal growth formed in the channel region controls an orientation of crystal growth in the channel region when the non-single crystalline thin film is crystallized. Accordingly, in the crystalline semiconductor layer having such a gap for controlling an orientation of crystal growth, shapes and density of grain boundaries of the crystals are preferably controlled, and hence the crystalline thin film transistor exhibits excellent TFT characteristics, such as field-effect mobility.

It is to be noted here that the gaps for controlling an orientation of crystal growth is a depressed part formed on the surface of crystalline semiconductor layer (non-single crystalline thin film in the process of fabrication), and the depressed part may extend to a lower layer under the crystalline semiconductor layer (the surface of the substrate or the undercoat layer) or may not extend to the lower layer. The sizes and shapes thereof are not particularly restricted, and therefore may be suitably adjusted depending on the surface area and thickness of the crystalline semiconductor layer, a desired field effect mobility, and so forth. Examples of the surface shapes thereof include a circular shape, a square-shaped hole, a long and narrow groove, and so forth, and examples of the cross-sectional shape thereof include a C-like shape, a V-like shape, and an angular C-like shape. The detail of the gap for controlling an orientation of crystal growth will be described later.

In another embodiment of the invention, there is provided a crystalline thin film transistor including a crystalline semiconductor layer formed on a substrate, the crystalline semiconductor layer comprising a channel region, a source region disposed at both sides of the channel region, and a drain region, wherein the crystalline semiconductor layer is such that a non-single crystalline thin film is crystallized, wherein the gap for controlling an orientation of crystal growth is divided into two or more arrays of groove-like gaps provided in a direction linking the source region and the drain region.

In this configuration, two or more arrays of groove-like gaps functions so that the orientation of crystal growth is guided in the direction linking the source region and the drain region, and the resulting poly-Si film becomes an aggregate of large crystal grains longitudinally extending in the direction linking the source region and the drain region.

Such a poly-Si film has a small density of grain boundaries in the direction linking the source region and the drain region and therefore exhibits a high carrier mobility. In other words, the crystalline thin film transistor having the above-described configuration has excellent characteristics such as carrier mobilities.

Now, referring to FIGS. 11 and 20, there is detailed the reason why by providing the gap for controlling an orientation of crystal growth, large crystal grains in which the orientation of crystal growth is controlled are obtained.

As shown in FIGS. 20(a) and 20(b), on a surface of non-single crystalline thin film, which is a precursor material of the crystalline semiconductor layer, two or more arrays of groove-like gaps for controlling an orientation of crystal growth (denoted by the reference numeral 411) are formed in the direction linking the source region and the drain region, and thereafter an energy beam capable of being absorbed is applied to the thin film in a conventional manner. The resulting temperature distribution on the surface of the thin film is as follows; the gaps for controlling, the region adjacent thereto, and the peripheral edge region show a low temperature, and the main portion of the channel region (a region of the thin film where the gap for controlling an orientation of crystal growth is not formed) shows a high temperature.

The reason is that, since the groove region (gaps for controlling an orientation of crystal growth) has a smaller film thickness than the other regions or has no thin film thereon, less energy beam is absorbed in the groove region, and as a result the temperature of the groove region becomes lower than the other regions. In addition, normally, because no thin film exists outside the semiconductor thin film, which leads to less absorbed energy beam, and also because heat diffuses outward in the peripheral edge region, the temperature of the peripheral edge region becomes lower than the central region of the thin film.

There is now described below a process of crystal growth in the non-single crystalline thin film having a temperature distribution such that the gap for controlling an orientation of crystal growth and the peripheral edge region show a low temperature. It is noted that in prior art as well, the peripheral edge region of non-single crystalline thin film shows a low temperature, and therefore the explanation here concerns with the relationship between orientations of crystal growth and the gap for controlling an orientation of crystal growth, with reference to FIGS. 11(a) and 11(b).

FIGS. 11(a) and 11(b) schematically illustrate a state of the crystal growth. First, crystal nuclei are formed in a peripheral region of the gap for controlling an orientation of crystal growth, where the temperature is lower than that of the main portion. Then, the crystal nuclei grow in a direction towards a region having a higher temperature, i.e., in a direction away from the groove-like gap for controlling an orientation of crystal growth (a perpendicular direction to the groove), as the temperature of the whole thin film falls. Note here that in the above-described configuration, two or more array of the gaps for controlling an orientation of crystal growth are provided in the direction linking the source region and the drain region, and therefore, the crystal nuclei formed in the regions adjacent to the two gaps an orientation of crystal growth opposed to each other grow towards the center of the main portion of the channel region from the opposite directions. Therefore, both crystal grains collide with each other in the vicinity of the center of the main portion of the channel region. However, the central region, being far from the gap for controlling an orientation of crystal growth, has still a higher temperature than the other regions and therefore is in a state where molecules therein can still freely move. Accordingly, the orientation of crystal growth is guided to the direction in which the collision is avoided, i.e., the direction linking the source region and the drain region (the direction parallel to the groove, see FIG. 11a). As a result, a large crystal grain is formed so as to longitudinally extend in the direction linking the source region and the drain region (see FIG. 11b). When the channel region is composed of an aggregate of the crystal grains having such a shape, the density of grain boundaries in the direction linking the source region and the drain region becomes small, and therefore a crystalline thin film transistor having excellent TFT characteristics such as field effect mobility can be formed.

In another embodiment of the invention, the gap for controlling an orientation of crystal growth may be divided into a plurality of gaps discontinuously provided in a direction linking the source region and the drain region.

When a plurality of gaps for controlling an orientation of crystal growth are discontinuously arranged, crystal growth is more finely controlled, and in particular, when two or more arrays of gaps for controlling an orientation of crystal growth are arranged, grain sizes and shapes of the crystals are further finely controlled. The reasons for this are as follows.

As described above, crystal nuclei are formed in the vicinity of the gap for controlling an orientation of crystal growth, in which the temperature decreases to a crystallization temperature earlier. Here, if the intervals between the crystal nuclei are narrow, the crystal growth is hindered since crystals collide with other crystals before they sufficiently grow, and this results in a polycrystal made of a multiplicity of micro-crystal grains and a distorted crystal structure in the vicinity of the boundaries where crystal grains collide with each other. For this reason, desired TFT characteristics cannot be obtained. Accordingly, in order to improve TFT characteristics such as field effect mobility, it is necessary that the density of crystal nuclei to be formed should be appropriately controlled, in addition to the control of the orientation of crystal growth.

Here, if the gaps are arranged in a discontinuous manner, although crystal nuclei are formed in the vicinity of the gaps, they are not easily formed in intermediate regions between a gap and the next gap. Thus, by adjusting the number of the gaps and/or the intervals between the gaps, the density of crystal nuclei to be formed can be controlled. It is noted that the reason why crystal nuclei are not easily formed in the intermediate region between a gap and the next gap is that the intermediate region (the region where the thin film material is present) is sufficiently heated by laser irradiation.

In accordance with another aspect of the invention, there is provided a semiconductor device including a crystalline semiconductor layer formed on a substrate, the crystalline semiconductor layer comprising a channel region, a source region disposed at both sides of the channel region, and a drain region, the semiconductor device wherein the crystalline semiconductor layer is such that a non-single crystalline thin film is crystallized and at least in the channel region, an early-crystallization region in which a crystallization-starting temperature is higher than that in a main portion of the channel region is provided.

By employing the above-described configuration, the early-crystallization region serves to control the crystal growth in the main portion of the channel region, and as a result, high quality crystalline semiconductor layer having a small density of grain boundaries can be formed. The reason is as follows.

Because the crystallization-starting temperature is high in the early-crystallization region, crystal nuclei start to be formed earliest in the early-crystallization region. The crystal nuclei become the center of the crystal growth to take place thereafter. Accordingly, by providing the early-crystallization region, the phenomenon that multiple crystal nuclei are formed at once can be prevented, and as a result, a polycrystalline semiconductor layer in which large crystal grains are aggregated can be formed.

It is preferable that the early-crystallization region be arranged at least one or more in the channel region, and it is also preferable that a plurality of early-crystallization regions be provided at positions where the transfer of carriers in the direction linking is not hindered. When a plurality of early-crystallization regions are provided on the surface of the thin film at appropriate positions and intervals, the density of crystal nuclei to be formed can be appropriately controlled, resulting in further desirable results. It is to be noted that the phrase "a crystallization-starting temperature is high" mentioned above means that crystallization starts to take place at a higher temperature than that in the main portion of the channel region.

In another embodiment of the invention, the early-crystallization region has a shape longitudinally extending in a direction linking the source region and the drain region.

Since the early-crystallization region is not a region where carrier transfer takes place, the region is preferable to have a narrow width in the direction linking the source region and the drain region. If the early-crystallization region extends longitudinally in the direction linking the source region and the drain region, the early-crystallization region can become a factor that hinders carrier mobilities.

In another embodiment of the invention, the early-crystallization region is such that an impurity is contained in a component constituting the main portion of the channel region.

In a technique of raising the crystallization-starting temperature by adding an impurity to the semiconductor layer, the early-crystallization region can be formed relatively easily. Accordingly, the crystalline thin film transistor having the above-described configuration not only exhibits excellent TFT characteristics such as field effect mobility but also achieves a reduced cost.

In another embodiment of the invention, the crystalline semiconductor layer is substantially composed of silicon or a compound of silicon and germanium.

Silicon and a compound of silicon and germanium are readily available and easy to crystallize. Accordingly, the above-described configuration achieves a high quality crystalline thin film transistor at a low cost.

The methods of producing a semiconductor device which will be described below relate to the crystalline thin film transistors which has been described above, and the advantageous effects by the methods are almost the same as those described above. For this reason, the detailed explanation for the advantageous effects will not be repeated below.

In accordance with another aspect of the invention, there is provided a method of producing a crystalline thin film transistor including a crystalline semiconductor layer, the crystalline semiconductor layer comprising a channel region, a source region disposed at both sides of the channel region, and a drain region, the method comprising at least the steps of depositing a non-single crystalline thin film on an insulating substrate, forming a plurality of gaps for controlling an orientation of crystal growth in the non-single crystalline thin film, and irradiating the thin film in which the plurality of gaps are formed with an energy beam to crystallize the thin film.

In the above-described method, the gaps for controlling an orientation of crystal growth may be formed in a direction linking the source region and the drain region so as to have a groove-like shape, and in addition, the gap for controlling an orientation of crystal growth may be divided into a plurality of gaps discontinuously formed in a direction linking the source region and the drain region. By employing these methods, the foregoing crystalline thin film transistors can be produced.

In accordance with another aspect of the invention, there is provided a method of producing a crystalline thin film transistor including a crystalline semiconductor layer, the crystalline semiconductor layer comprising a channel region, a source region disposed at both sides of the channel region, and a drain region, the method comprising at least the steps of; depositing a non-single crystalline thin film on an insulating substrate, forming an early-crystallization region by ion-implanting an impurity in a partial region in the non-single crystalline semiconductor thin film, the impurity for raising a crystallization-starting temperature of the partial region, and after the step of forming an early-crystallization region, irradiating the thin film with an energy beam to crystallize the thin film.

In the above-described method, the early-crystallization region may have a belt-like shape longitudinally extending in a direction linking the source region and the drain region, and in addition, the early-crystallization region is divided into a plurality of early-crystallization regions discontinuously disposed in a direction linking the source region and the drain region. By employing these methods, the foregoing crystalline thin film transistors can be produced.

In addition, in each of the foregoing producing methods, the energy beam may be an excimer laser beam.

Excimer lasers have a large light energy, and is well absorbed by silicon since they are UV lights. Therefore, by using an excimer laser beam, crystallization of the non-single crystalline semiconductor layer can be efficiently performed. In particular, when the non-single crystalline semiconductor layer is composed of a material capable of absorbing ultraviolet rays such as silicon, it is possible to selectively heat and fuse only the semiconductor layer. Therefore, the crystallization of the semiconductor layer can be effected without causing adverse effects by heat on the regions not irradiated with the beam, and moreover, it is made possible to employ glass substrates, which are low in cost. Furthermore, when an excimer laser and a thin film material capable of absorbing UV are used in combination, the temperature difference between the gap for controlling an orientation of crystal growth and the main portion of the semiconductor layer becomes large, and thereby the function of the gap for controlling an orientation of crystal growth (function for controlling the orientation of crystal growth) can be fully exploited.

The present inventors have also carried out a study on methods for sufficiently growing crystals based on the foregoing considerations regarding the mechanism of crystallization. As a consequence, the inventors have found that by intentionally making uneven a distribution of the light intensity within the light beam width, crystallization can smoothly progress, and thereby a high quality crystalline thin film can be obtained. Based on this view, the following aspects of the present invention have been accomplished.

In accordance with another aspect of the invention, there is provided a method of producing a semiconductor device wherein a thin film of a non-single crystalline material formed on a substrate is irradiated with a light beam whereby the non-single crystalline material is crystallized or recrystallized to form a crystalline semiconductor thin film, the method characterized in that the light beam is such that a distribution pattern of a light energy intensity of the light beam is adjusted so that a temperature gradient or an unevenness of temperature distribution is caused, and the light beam is applied in a stationary state.

In the above-described method, unevenness of the temperature gradient or temperature distribution is caused on the surface of the non-single crystalline thin film irradiated with the light beam, and thereby it is made possible to prevent the phenomenon that micro crystal nuclei are simultaneously formed in a wide region, the phenomenon explained previously referring to FIGS. 7(f) and 7(g). Therefore, relatively large crystal grains are obtained, and evenness in the degree of crystallinity is increased. Consequently, the density of grain boundaries becomes small, and field effect mobility is improved.

In another embodiment of this aspect of the invention, a distribution pattern of the light energy intensity may be such a distribution pattern that a light intensity within a beam width monotonously increases from one side to the other, or monotonously decreases from one side to the other.

In this configuration, the temperature gradient on the surface of the non-single crystalline thin film to be irradiated is formed correspondingly to the light energy intensity, and the crystallization is guided in a direction from a region where the temperature is low towards a region where the temperature is high. Thus, disorderly formation of crystal nuclei and disorderly crystal growth are prevented, and consequently it is ensured that the phenomenon explained with FIGS. 7(f) and 7(g) is prevented.

In the case of employing the crystalline thin film for, for example, a semiconductor circuit comprising a source region—a channel region—and a drain region, it is preferable that the intensity gradient of the light energy be formed in the direction parallel to the source-drain direction. Thereby, the direction of crystal growth is restricted to the direction parallel to the direction of the transfer of carriers, and the density of grain boundaries becomes small. Accordingly, by employing this technique, a mobility of, for example, 300 cm$^2$/Vs or higher can be achieved.

In another embodiment of this aspect of the invention, a distribution pattern of the light energy intensity may be such that, in a beam width, a part having a relatively stronger light intensity and a part having a relatively weaker light intensity are alternately arrayed in a plane.

When a light beam having a striped pattern made of a part having a strong light intensity and a part having a weak light intensity is applied, a striped temperature distribution pattern made of a part having a high temperature and a part having a low temperature is formed on the irradiated surface. In such a striped temperature distribution pattern, crystal growth is guided in the direction from a region where the temperature is low (normally formed in a belt-like shape) towards a region where the temperature is high. Then, crystal grains collide with each other in the vicinity of the center of the region (belt) where the temperature is high, forming a continuous line of grain boundaries (a continuous line like a mountain range) there, and crystal grains are formed so as to longitudinally extending in the direction parallel to the continuous line.

Hence, in this configuration as well, the phenomenon explained with FIGS. 7(f) and 7(g) is prevented, and moreover, the same advantageous effects as described in the above-described configuration employing such an intensity distribution monotonously increasing or decreasing are also obtained. Specifically, crystallization is effected while arranging a region with a relatively strong light intensity and a region with a relatively weak light intensity parallel to the source-drain direction. Thereby, the collision line of crystal grains becomes parallel to the source-drain direction, and it is prevented that carriers cross the collision line of crystal grains (the line of grain boundary), which causes a considerable decrease in the mobility. Thus, a channel region having a high mobility can be formed.

In the above-described method, a distribution pattern of the light energy intensity may be formed by causing a light interference by simultaneously irradiating with at least two coherent lights.

In this method utilizing a light interference, it is possible to form a fine light intensity distribution, and as a result to form a fine striped temperature distribution on the surface to be irradiated. Accordingly, this method achieves a smooth crystallization in a relatively wide region.

In another embodiment of the invention, a distribution pattern of the light energy intensity of may be a wave-motion-like interference pattern formed by simultaneously irradiating with at least two coherent lights and by dynamically modulating a phase of at lease one of the two coherent lights.

In this method utilizing a dynamic light interference pattern, the energy intensity distribution of the light beam varies in a wave-motion-like manner, and the temperature of the irradiated surface correspondingly varies in a wave-motion-like manner so that the temperature moves in one direction. Accordingly, by employing this method, impurities contained in the non-crystalline thin film can be gradually expelled outside the effective area, and consequently a crystalline thin film having a high purity and a high mobility can be formed.

It is noted that in the methods of producing a crystalline thin film according to this aspect of the invention, the light beam may be applied as the beam is being moved relative to the non-single crystalline thin film on the substrate. In this method in which a light beam is applied while being moved relative to the surface of the thin film, the light beam having a light energy intensity distribution pattern being adjusted so that a temperature gradient or an unevenness of the temperature distribution is caused on the surface to be irradiated (the surface of the non-single crystalline thin film), the orientation of crystal growth can be finely guided. Therefore, a high quality crystalline thin film having a high uniformity in the degree of crystallinity and a small density of grain boundaries can be obtained.

In accordance with another aspect of the invention, there is provided a method of producing a semiconductor thin film wherein a thin film comprising a non-single crystalline material formed on a substrate is irradiated with a light beam and thereafter cooled whereby the non-single crystalline material is crystallized or recrystallized, the method characterized in that a pressure of an atmosphere gas is maintained at more than a predetermined value to cause an uneven temperature distribution on a surface of the thin film irradiated with the light beam.

In this method, at a moment when the molecules of the gas constituting the atmosphere gas collide with the surface of the thin film and detach therefrom, the molecules deprive the thin film of heat, forming a low temperature region in a limited area. Thus, crystal nuclei are formed in the region, and the formed crystal nuclei facilitate the crystal growth, consequently preventing the phenomenon explained with FIGS. 7(f), and 7(g).

In the above-described method, the pressure of the atmosphere gas to be maintained at more than a predetermined value may be $10^{-5}$ torr or higher where the atmosphere gas is a hydrogen gas.

When a laser annealing treatment is performed under a hydrogen gas pressure of $10^{-5}$ torr or higher, the above-described advantageous effect is ensured by the movement of hydrogen molecules, which have a high specific heat.

In order to provide a solution to the foregoing and other problems, the invention also provides a method of producing a semiconductor film comprising the step of crystallizing a precursor semiconductor film, the step wherein the precursor semiconductor film formed on a substrate is irradiated with a first energy beam supplying the precursor semiconductor film with at least such an energy that the precursor semiconductor film can be crystallized, and with a second energy beam such that an absorption index of said precursor semiconductor film is smaller than an absorption index by said first energy beam and an energy supplied by said second energy beam is smaller than an energy capable of crystallizing said precursor semiconductor film.

According to this method, the second energy beam can easily reach a lower portion of the precursor semiconductor film and further the substrate. Thereby, the precursor semiconductor film is heated through the thickness direction and the substrate is also heated, reducing the temperature difference between the point while the first energy beam is being applied and the point after the irradiation with the beam is completed Thus, the precursor semiconductor film heated and fused by being irradiated with the first energy beam is crystallized after the irradiation is completed, while being annealed. Therefore, the crystal growth is facilitated, and it is made possible to form relatively large crystal grains and reduce crystal defects, which improves electrical characteristics of the semiconductor film In the above-described method, the precursor semiconductor film may be an amorphous silicon thin film Thereby, a polycrystalline silicon thin film having good crystal quality and good electrical characteristics such as field effect mobility can be readily produced.

Further in the above-described method, the first energy beam may be such that an absorption coefficient of the precursor semiconductor film is approximately equal to or greater than the reciprocal of a film thickness of the precursor semiconductor film, and the second energy beam may be such that an absorption coefficient of the precursor semiconductor film is approximately equal to or less than the reciprocal of a film thickness of the precursor semiconductor film By employing this method, much of the first energy beam is absorbed in the vicinity of the surface of the precursor semiconductor film, whereas much of the second energy beam reaches the lower portion of the precursor semiconductor film and the substrate, and thus the precursor semiconductor film is efficiently heated as well as the substrate. Thus, after the irradiation with the first energy beam is completed, the precursor semiconductor film is annealed and the crystal growth is facilitated. Therefore, it is ensured that relatively large crystal grains are formed, and a semiconductor film having good crystal quality is formed.

Further in the above-described method, the first energy beam may be such that an absorption coefficient of the precursor semiconductor film is approximately 10 times or greater than the reciprocal of a film thickness of the precursor semiconductor film, and the second energy beam may be such that an absorption coefficient of the precursor semiconductor film is approximately the reciprocal of a film thickness of the precursor semiconductor film.

By employing this method, the precursor semiconductor film can be more efficiently heated, and a semiconductor film having further higher quality can be formed.

In the above-described method, the first and second energy beams have a different wavelength from each other.

By employing this method, the difference of the absorption coefficients as described above can be readily realized.

The foregoing energy beams having a different wavelength from each other may be, for example, such that the first energy beam is an energy beam having a single wavelength, and the second energy beam includes at least a wavelength component in a visible light range.

More specifically, the first energy beam and the second energy beam may be, for example, a laser light and an infrared lamp, a laser light and an incandescent light, or a laser light and an excimer lamp light.

In addition, as the foregoing lights having a different wavelength from each other, for example, the second energy beam may contain at least a wavelength component from a visible light range to an ultraviolet range, such as a xenon flash lamp light.

In addition, the first energy beam and the second energy beam may be a laser light.

When the laser beam is employed, the irradiation with the energy beam having a large energy density can be readily performed, and thereby it is made easy to efficiently heat the precursor semiconductor film and the substrate.

More specifically, for example, in the case where the precursor semiconductor film is an amorphous silicon thin film, the first energy beam may be one laser light selected from an argon fluoride excimer laser, a krypton fluoride excimer laser, a xenon chloride excimer laser, and a xenon fluoride excimer laser, and the second energy beam may be a laser light of an argon laser.

In addition, for example, in the case where the substrate is a glass substrate and the precursor semiconductor film is an amorphous silicon thin film, the first energy beam is one laser light selected from an argon fluoride excimer laser, a krypton fluoride excimer laser, a xenon chloride excimer laser, and a xenon fluoride excimer laser, and the second energy beam is a laser light of a carbon dioxide gas laser.

Each of the excimer lasers mentioned above is easy to obtain a large power and is easily absorbed in the vicinity of the surface of the amorphous silicon thin film. The laser light of an argon laser transmits through the amorphous silicon film to a certain degree and is easily absorbed throughout the thickness direction of the amorphous silicon thin film. The carbon dioxide gas laser transmits through the amorphous silicon thin film relatively well and is easily absorbed by the glass substrate. Hence, the amorphous silicon thin film can be efficiently heated, a polysilicon thin film having good crystal quality can be readily formed, and the productivity can be readily improved.

In the method according to this aspect of the invention, the first energy beam and the second energy beam may be applied to a belt-like shaped region in the precursor semiconductor film.

By applying the beams to the belt-like shaped region, heating can be performed with a uniform temperature distribution, and thereby it is made possible to easily form a semiconductor film having a uniform crystal quality and to reduce the time required for the process of crystallization.

In the method according to this aspect of the invention, a region in the precursor semiconductor film to be irradiated with the second energy beam may be larger than a region in the precursor semiconductor film to be irradiated with the first energy beam, and may include the region to be irradiated with the first energy beam.

In this method as well, heating can be performed with a uniform temperature distribution, and thereby it is made possible to easily form a semiconductor film having a uniform crystal quality.

In the method according to this aspect of the invention, the first energy beam and the second energy beam are incident approximately perpendicular to the precursor semiconductor film.

When each of the energy beams are incident approximately perpendicular to the precursor semiconductor film as described above, a variation in the irradiation with each energy beam is reduced, and thereby it is made possible to easily form a semiconductor film having a uniform crystal quality.

In the method according to this aspect of the invention, the second energy beam is applied at least prior to applying the first energy beam. Such applying of the second energy beam prior to applying the first energy beam may be performed by controlling the timings of applying of the energy beams, and further, may be performed in such a manner that the substrate on which the precursor semiconductor film is formed is moved, and the second energy beam is applied to a more forward position in the precursor semiconductor film with respect to a direction of moving of the substrate than a position where the first energy beam is applied.

By performing such applying of the energy beams, crystallization is effected by the first energy beam in a state where the semiconductor film and the substrate are sufficiently heated by the second energy beam, resulting in an efficient crystallization process.

In the method according to this aspect of the invention, the first energy beam may be intermittently applied, and the second energy beam may be continuously applied.

Specifically, the first energy beam may be a pulsed laser light, and the second energy beam may be a continuous-wave laser light or a lamp light.

By continuously applying the second energy beam as described above, it is made easy to heat the substrate and the precursor semiconductor film at a predetermined stable temperature, and in addition, by intermittently applying the first energy beam, heat conduction to the substrate is suppressed to prevent the fusion or distortion of the substrate caused by overheating the substrate. Thereby it is ensured that the crystallization of the precursor semiconductor film can be readily attained.

In the method according to this aspect of the invention, the first energy beam and the second energy beam may be synchronized with each other and intermittently applied Specifically, as the timings of the irradiation, it is preferable that a time of irradiating with the first energy beam should be within a time of irradiating with the second energy beam, and should be two-thirds or shorter of an irradiation cycle of the second energy beam. For the energy beams, specifically, the first energy beam may be a pulsed laser light, and the second energy beam may be a pulsed laser light or an intermittently-operated lamp light.

By intermittently applying the first energy beam and the second energy beam as described above, it is easily made possible to irradiate a unit area with a large light energy, and therefore heating with a large energy can be performed while preventing the fusion and distortion of the substrate caused by overheating the substrate, which easily ensures the crystallization of the precursor semiconductor film. In particular, the pulsed laser can easily attain a large power and thereby readily heat a large area at a high temperature. Therefore, the time required for the step of crystallization can be easily reduced to improve productivity.

In the method according to this aspect of the invention, the first energy beam and the second energy beam may be applied so that the precursor semiconductor film is heated at a temperature of 300° C. to 1200° C., or more preferably at a temperature of 600° C. to 1100° C.

By heating the precursor semiconductor substrate at the temperature in the above-described range, the temperature variation in crystallization is made gentle and the crystal growth is facilitated while preventing crystal defects and uneven crystallization caused by the formation of microcrystals in a partial region, and the formation of large crystal grains are readily made possible.

In addition, the method according to this aspect of the invention may further comprise a step of heating the substrate on which the precursor semiconductor film is formed with a heater. More specifically, for example, it is preferable that the substrate on which the precursor semiconductor film is formed should be heated at a temperature of 300° C. to 600° C.

By heating the substrate with the heater in addition to the second energy beam, the precursor semiconductor substrate is more efficiently heated, and in addition, the crystal growth is readily facilitated by annealing. Moreover, in comparison with the conventional case of heating the substrate with the heater only, a predetermined heating temperature can be obtained within a shorter time, which easily achieves an improvement in productivity.

In the method according to this aspect of the invention, the first energy beam may be applied to a plurality of regions in the precursor semiconductor film, and the second energy beam may be applied to only a part of the plurality of regions.

By applying the second energy beam to only a partial region, crystallinity can be improved in a limited region, for example, which requires particularly high electrical characteristics, and therefore a necessary and sufficient crystallization can be effected by a crystallization process with a short time, which easily achieves an improvement in productivity.

In the method according to this aspect of the invention, the second energy beam may be such that an absorption index of the substrate is larger than an absorption index of the precursor semiconductor film. In addition, it is preferable that the first energy beam be such that an absorption coefficient of the precursor semiconductor film is approximately 10 times or greater than the reciprocal of a film thickness of the precursor semiconductor film.

More specifically, in the case where the substrate is a glass substrate, the precursor semiconductor film is an amorphous silicon thin film, the first energy beam may be one laser light selected from an argon fluoride excimer laser, a krypton fluoride excimer laser, a xenon chloride excimer laser, and a xenon fluoride excimer laser, and the second energy beam may be a laser light of a carbon dioxide gas laser.

By employing this method, much of the first energy beam is absorbed in the vicinity of the surface of the precursor semiconductor film, whereas much of the second energy beam is absorbed by the substrate, and thus the precursor semiconductor film is efficiently heated as well as the substrate. Thus, after the irradiation with the first energy beam is completed, the precursor semiconductor film is annealed and the crystal growth is facilitated. Therefore, it is ensured that relatively large crystal grains are formed, and a semiconductor film having good crystal quality is formed.

In accordance with another aspect of the invention, there is provided an apparatus for producing a semiconductor film by crystallizing a precursor semiconductor film formed on a substrate, comprising a first irradiating means emitting a first energy beam, and a second irradiating means emitting a second energy beam resulting in a smaller absorption index of said precursor semiconductor film than said first energy beam.

By employing the above-described apparatus, the second energy beam can easily reach a lower portion of the precursor semiconductor film and further the substrate. Thereby, the precursor semiconductor film is heated through the thickness direction and the substrate is also heated, reducing the temperature difference between the point while the first energy beam is being applied and the point after the irradiation with the beam is completed. Thus, the precursor semiconductor film heated and fused by being irradiated with the first energy beam is crystallized after the irradiation is completed, while being annealed. Therefore, the crystal growth is facilitated, and it is made possible to form relatively large crystal grains and reduce crystal defects, which improves electrical characteristics of the semiconductor film.

In the above-described apparatus according to this aspect of the invention, the second irradiating means is a lamp radially emitting the second energy beam, and the apparatus further comprises a concave reflector collecting the second energy beam.

By employing the above-described apparatus, efficient heating of the substrate and so forth is easily performed with a uniform temperature distribution, and thereby it is made possible to easily form a semiconductor film having a uniform crystal quality.

The above-described apparatus for producing a semiconductor film may further comprise a reflective plate in which one of the first energy beam and the second energy beam is reflected and the other one of the first energy beam and the second energy beam is allowed to transmit, the apparatus wherein the first energy beam and the second energy beam are incident perpendicular to the precursor semiconductor film.

When each of the energy beams are incident approximately perpendicular to the precursor semiconductor film as described above, a variation in the irradiation with each energy beam is reduced, and thereby it is made possible to easily form a semiconductor film having a uniform crystal quality.

In the above-described apparatus, specifically, in the case where the precursor semiconductor film is an amorphous silicon thin film, the first irradiating means may be one of an argon fluoride excimer laser, a krypton fluoride excimer laser, a xenon chloride excimer laser, and a xenon fluoride excimer laser, and the second irradiating means may be an argon laser.

In addition, in the case where the substrate is a glass substrate and the precursor semiconductor film is an amorphous silicon thin film, the first energy beam may be one laser light selected from an argon fluoride excimer laser, a krypton fluoride excimer laser, a xenon chloride excimer laser, and a xenon fluoride excimer laser, and the second energy beam may be a laser light of a carbon dioxide gas laser.

In order to provide a solution to the foregoing and other problems of prior art, the present invention also provides, in another aspect of the invention, a method of producing a semiconductor thin film comprising a step of irradiating a non-single crystal semiconductor thin film with an energy beam, said non-single crystal semiconductor thin film formed on a substrate having an image display region and a driving circuit region, said method characterized in that a first irradiation of said image display region is performed by using an energy beam having a line-like cross-sectional shape, and a second irradiation of said driving circuit region is performed at a higher energy density than said first irradiation by using an energy beam having a square-like cross-sectional shape.

The present invention also provides a method of producing a semiconductor thin film comprising a step of irradiating a non-single crystal semiconductor thin film with an energy beam, said non-single crystal semiconductor thin film formed on a substrate having an image display region and a driving circuit region, said method characterized in that a first irradiation of said image display region is a scanning irradiation such that said substrate is scanned by said energy beam in a relative manner and a region to be irradiated with said energy beam is shifted with a predetermined overlap, and a second irradiation of said driving circuit region is a stationary irradiation with a higher energy density than said first irradiation such that said energy beam is fixed with respect to said substrate in a relative manner.

Specifically, for example, in the thin film transistors constituting a liquid crystal display device, different laser irradiation methods are employed for a pixel region which requires a uniformity of semiconductor film characteristics and for a driving circuit region which requires characteristics (particularly high mobility). Specifically, when performing a laser annealing in which amorphous silicon is irradiated with a laser light so as to fuse and crystallize the amorphous silicon to form polycrystalline silicon, the energy density of the laser light applied to the driving circuit region in the substrate plane is made higher than the energy density of the laser light applied to the pixel region, so as to form polycrystalline silicons in the driving circuit region and in the pixel region each having different characteristics from each other. More specifically, for example, a first laser light irradiation is performed for the pixel region alone or for the entire surface of the substrate, and thereafter a second laser light irradiation is performed for the driving circuit region using a laser light having a higher energy density than the laser light used in the first laser light irradiation.

According to this method, the mobility of the polycrystalline silicon in the driving circuit region becomes higher than the mobility of the polycrystalline silicon in the pixel region, and the characteristics of the polycrystalline silicon in the pixel region can be made uniform in the plane.

In the above-described method, the first irradiation may be performed by using an energy beam having a line-like cross-sectional shape, and the second irradiation may be performed by using an energy beam having a square-like cross-sectional shape. Thereby, the laser annealing can be performed without rotating 90 degrees the stage for fixing the substrate.

Additionally, in the above-described method, the first irradiation may be a scanning irradiation such that a laser beam is applied a plurality of times while a position to be irradiated with the laser beam is being shifted, and the second irradiation may be a stationary irradiation such that the position to be irradiated is fixed. Thereby, the mobility of the polycrystalline silicon can be increased, and in addition, the uniformity is attained.

Further, the laser annealing may be performed in such a manner that a plurality of regions in the driving circuit region are irradiated with laser lights having different energy densities from each other, thereby forming polycrystalline silicons having different characteristics from each other. In this case, it is preferable that the laser annealing be performed so that a region in which a transfer gate in the latch or shift resistor and the other regions are respectively irradiated with laser lights having different energy densities.

Further, in the above-described laser annealing methods, it is preferable that the edge of the laser beam not fall on the TFT pattern.

In accordance with another aspect of the invention, there is provided an apparatus for producing a semiconductor thin film comprising an energy beam generating means, and means for homogenizing an energy beam emitted from the energy beam generating means by shaping the energy beam so as to have a predetermined cross-sectional beam shape and a homogeneous energy, the apparatus wherein a non-single crystal semiconductor thin film formed on a substrate is irradiated with the energy beam to effect crystal growth the apparatus characterized in that the apparatus further comprises a filter having a plurality of transmissivities different from each other, and the energy beam is applied through the filter to a plurality of regions in the non-single crystal semiconductor thin film in such a manner that each of the plurality of regions receives a different energy density from each other.

By employing this method, it is made possible to form a plurality of polycrystalline semiconductor film having different characteristics on a single substrate plane.

In the above-described method, the apparatus may be a laser annealing apparatus in which transmissivities of the mask are varied by an optical thin film so as to have the plurality of transmissivities different from each other, and this enables the distribution of transmissivities to accurately formed. In addition, the apparatus may be a laser annealing apparatus in which the mask and the window for applying the laser light to the substrate in the treatment chamber are integrated, and this enables the apparatus to have a simple construction and to reduce attenuation of the light energy.

In another embodiment of the invention, there is provided an apparatus for producing a semiconductor thin film comprising an energy beam generating means, and means for homogenizing an energy beam emitted from the energy beam generating means by shaping the energy beam so as to have a predetermined cross-sectional beam shape and a homogeneous energy, the apparatus wherein a non-single crystal semiconductor thin film formed on a substrate is irradiated with the energy beam to effect crystal growth, the apparatus characterized in that, the means for homogenizing is capable of selectively shaping the energy beam into a plurality of cross-sectional beam shapes.

By employing this method, a laser light with the most appropriate shape is applied to each position on the substrate.

BRIEF DESCRIPTION OF THE DRAWINGS

FIG. 2(a) is a schematic plan view showing a prior art thin film transistor (TFT), and FIG. 2(b) is a schematic cross sectional view thereof.

FIG. 14(a) is a plan view of a TFT of Example 1-2, and FIG. 14(b) is a cross sectional view thereof.

FIG. 16(a) is a plan view of a TFT of Example 2-1, and FIG. 16(b) is a cross sectional view thereof.

FIG. 17(a) is a plan view of a TFT of Example 2-2, and FIG. 17(b) is a cross sectional view thereof.

FIGS. 20(a) and 20(b) are a plan view and a cross sectional view showing a construction of a TFT of Example 3-1.

(FIG. 20(a) is the plan view, and FIG. 20(b) is a cross sectional view taking along the line A-A' in FIG. 20(a).)

FIGS. 23(a) and 23(b) are a plan view and a cross sectional view showing a construction of a TFT of Example 3-2.

(FIG. 23(a) is the plan view, and FIG. 20(b) is a cross sectional view taking along the line C-C' in FIG. 23(a).)

FIGS. 25(a) to 25(e) illustrate production steps for the TFT of Example 3-2.

FIGS. 62(a) and 62(b) are schematic views showing a laser annealing apparatus in Example 6-2.

BEST MODE FOR CARRYING OUT THE INVENTION

Now, with reference to the figures, preferred embodiments of the present invention are detailed below.

EXAMPLE 1-1

Figure 12:
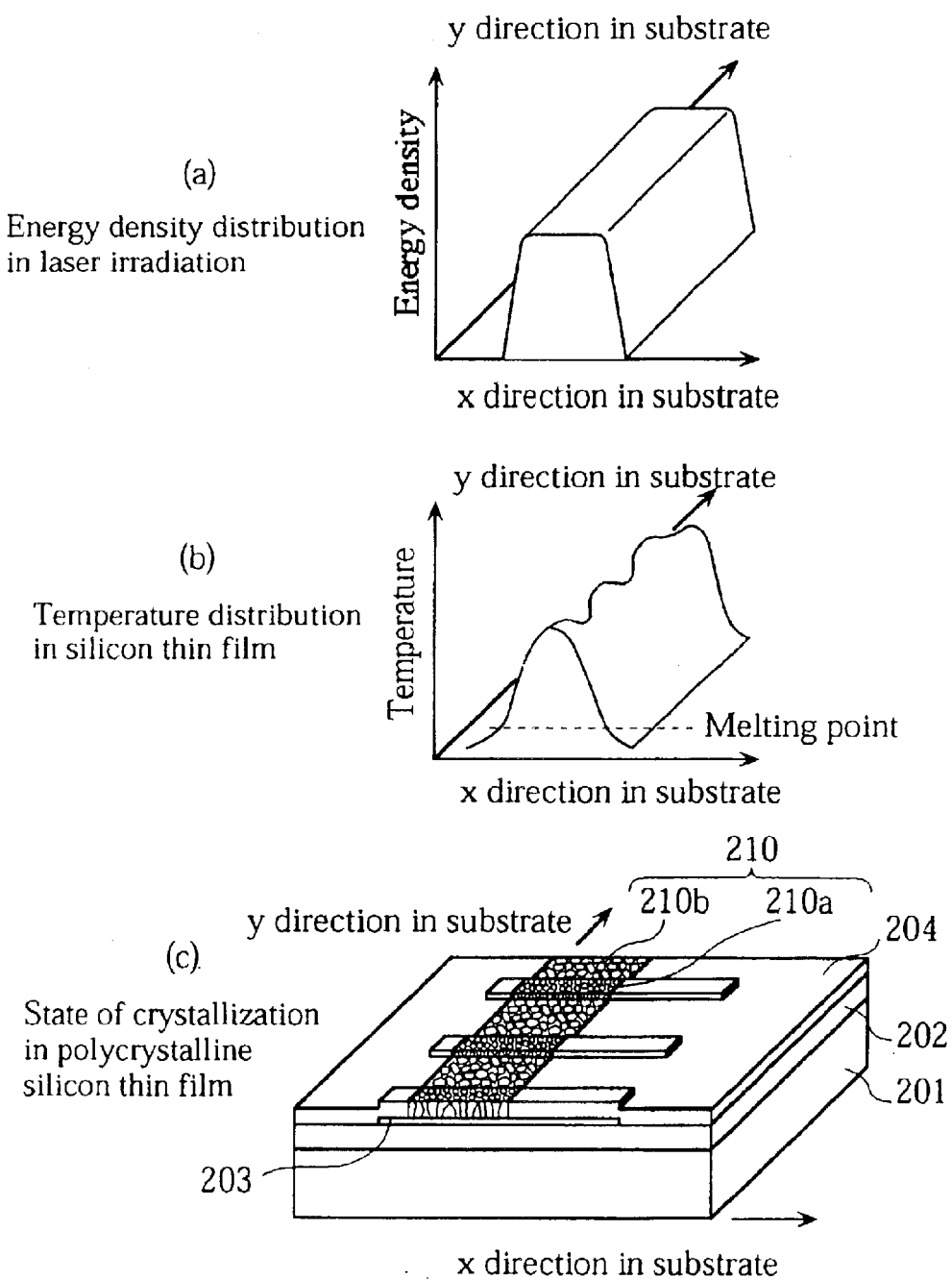
FIGS. 12(a) to 12(c) illustrate a principle of polycrystallization in Example 1-1.

Referring now to FIGS. 12(a) to 12(c), detailed below is an example in which crystal growth is controlled by providing on a substrate a plurality of regions each having a different thermal conductivity and thereby allowing a semiconductor thin film to have a temperature distribution.

As shown in FIG. 12(c), a lower insulating film 202 is formed on the entire region of a transparent insulating substrate 201 composed of, for example, a glass substrate. On a part of the lower insulating film 202, a stripe-like shaped upper insulating film 203 is formed. The upper insulating film 203 is composed of a material having a smaller thermal conductivity than the lower insulating film 203. On the lower insulating film 202 and the upper insulating film 203, an amorphous silicon thin film 204 is formed.

By irradiating the amorphous silicon thin film 204 with a line-like laser light having an energy density distribution in the x and y directions as shown in FIG. 12(a), a polycrystalline silicon thin film 210 is formed. In the formation of the polycrystalline silicon thin film 210, since the thermal conductivity of the upper insulating film 203 is lower than that of the lower insulating film 202, the temperature of a region in the amorphous silicon thin film 204 over the upper insulating film 203 becomes higher than the temperature of a region in the amorphous silicon thin film 204 over an interval of the upper insulating films 203, as shown in FIG. 12(b). Therefore, the crystallization of the amorphous silicon thin film 204 starts from the region over the interval of the upper insulating films 203, and the crystal growth proceeds towards the regions over the upper insulating films 203. As a result, in the region over the interval of the upper insulating films 203, a collision of the crystal grains each other rarely occurs, and a large crystal grain region 210b in which crystal grains are relatively large is thereby formed. On the other hand, in the region over the upper insulating film 203, each of the crystal grains grown from both sides of the upper insulating films 203 collides with each other, and consequently a small crystal grain region 210a is formed.

In order to compare the degree of crystallinity, a polycrystalline silicon thin film 210 thus formed and a prior art polycrystalline silicon thin film polycrystallized in accordance with a prior art method were both subjected to a Raman spectroscopy, the peak strengths of Raman spectrum were compared. The results are shown in FIG. 13.

For this measurement, the polycrystalline silicon thin film 210 of the present example employs a silicon nitride thin film having a thickness of 200 nm (thermal conductivity: 0.19 W/cm·° C.) as the lower insulating film 202 and a silicon oxide thin film having a thickness of 30 nm and a width of approx. 5 $\mu$m (thermal conductivity: 0.014 W/cm·° C.) as the upper insulating film 203 with an interval between each of the upper insulating films 203 being 20 $\mu$m On the other, the prior art polycrystalline silicon thin film employs a single layer of a silicon oxide thin film having a thickness of 200 nm. In each of the polycrystalline silicon thin films, the thickness of the amorphous silicon thin film was made to be 85 nm. In each of the films, the measuring points of the Raman peak strengths were the central region of the region to be irradiated along an x direction in FIGS. 12(a) to 12(c).

Figure 13:
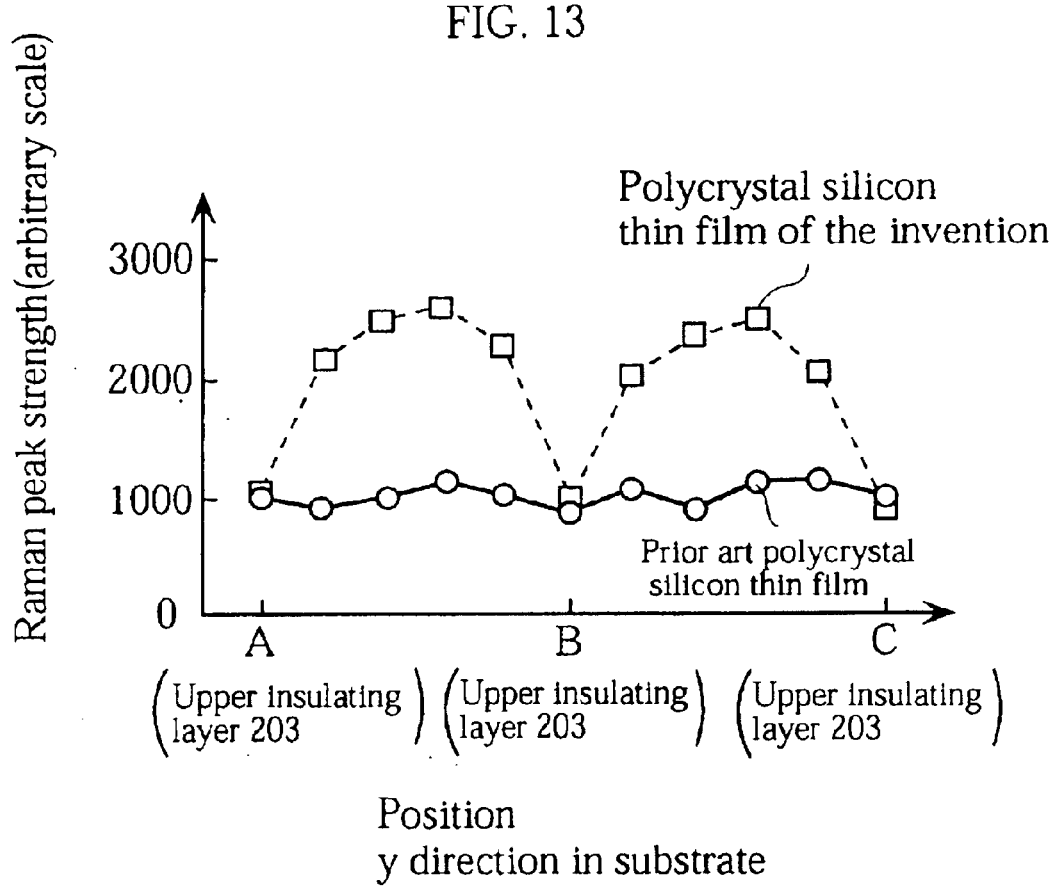
FIG. 13 is a graph showing a degree of crystallinity in a polycrystalline silicon thin film of Example 1-1.
Figure 15:
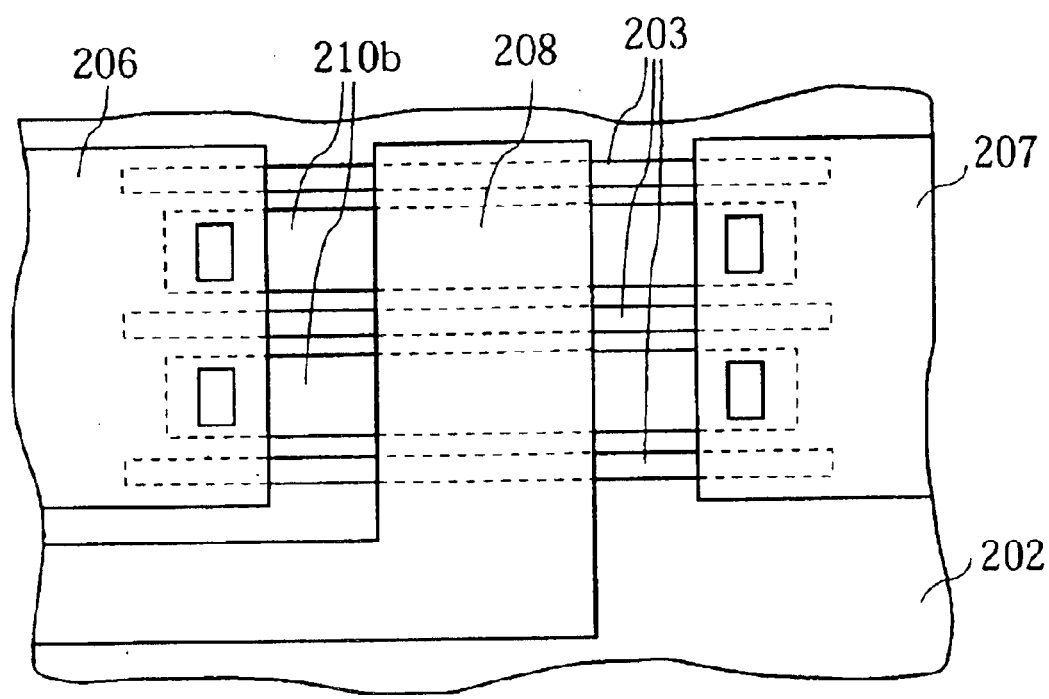
FIG. 15 is a plan view of a TFT of Example 1-3.

As apparent from FIG. 13, in the case of the polycrystalline silicon thin film made by a prior art method, the degree of crystallinity is relatively small over the entire region. By contrast, in the case of the method according to the present invention, whereas the degree of crystallinity is small in the regions over the upper insulating film 203, which are denoted by A, B, and C in the figure, the regions over the lower insulating film 202 sandwiched by the upper insulating films 203 show large Raman peak strengths. This indicates that the degree of crystallinity is remarkably improved by the method according to the present invention.

It is noted that the optimal value for the interval between each of the stripe-like shaped upper insulating films 203 varies depending upon thermal conductivities of the lower insulating film 202 and the upper insulating film 203, energy densities of the light to be irradiated, and so forth. However, in the example described above, it is preferable to make the interval to be within the range of 5–50 $\mu$m, more preferably within the range of 10–30 $\mu$m, in order to reliably obtain large crystals.

The description above shows an example in which the surface of the silicon thin film has a temperature distribution with respect to the y direction in FIGS. 12(a) to 12(c). However, in the case where a laser beam is applied in a stationary state, the temperature distribution may be also given with respect to the x direction in like manner. In the case of the laser beam applied by scanning in the x direction, the influence by the sequential movement of the region to be irradiated on the temperature distribution should be taken into consideration. In addition to utilizing the difference of thermal conductivities as described above, an adjustment of the temperature distribution may be performed by varying an energy density distribution in each of the regions.

In the example described above, the thermal conductivity of the upper insulating film 203 is made smaller than the thermal conductivity of the lower insulating film 202, so as to increase the grain size in the regions under which the upper insulating film 203 is absent. Conversely, the thermal conductivity of the upper insulating film may be made larger than the thermal conductivity of the lower insulating film, thereby to increase the grain size in the regions under which the upper insulating film is present. Nevertheless, the former method can more readily increase an area of the region in which the thermal conductivity is high, i.e., the surface temperature of the silicon thin film is low, therefore can more readily increase the temperature gradient in the temperature distribution on the surface of the silicon.

The relationship between a stacking order and thermal conductivities of the insulating films is not limited to the manner described above, but may be the reverse order, insofar as a predetermined temperature distribution is attained.

In the case where the insulating film has a two-layer structure as described above, the upper insulating film can be easily formed into a desired shape (thickness) by setting an etching selective ratio (a ratio of etching rates) between the upper insulating film and the lower insulating film. Therefore, the upper insulating film can be made to have a uniform thickness over a wide area, and as a result, a polycrystalline silicon thin film having a uniform grain size in the entire surface of the substrate can be readily obtained.

In order to provide regions each having a different thermal conductivity, a thickness of the silicon thin film may be varied by etching or the like method. By employing this method, although relatively high accuracy is needed in the etching, the manufacturing steps can be simplified since forming two layers of insulating films becomes unnecessary.

In place of varying the thermal conductivities, the temperature distribution can be provided by forming a plurality of regions each having a different thermal capacity. This can also improve crystallinity of the silicon thin film

EXAMPLE 1-2

Example 1-2 describes an example of a polycrystalline silicon thin film transistor employing the semiconductor thin film made in accordance, with the foregoing example.

FIG. 14(a) shows a plan view of the polycrystalline silicon thin film transistor, and FIG. 14(b) shows a cross section taken along the line A-A' in FIG. 14(a). In FIG. 14(a), there are shown a transparent insulating substrate 201, a lower insulating film 202, a upper insulating film 203, a gate insulating film 205, a source electrode film 206, a drain electrode film 207, a gate electrode film 208, and a large crystal grain region 210b in a polycrystalline silicon thin film 210. The polycrystalline silicon thin film 210 is polycrystallized in the manner described in the above Example 1-1. In the polycrystalline silicon thin film transistor of the present example, only the large crystal grain region 210b sandwiched by the upper insulating films 203 is selectively left unremoved by etching or the like method, and a source-drain direction is made to be in parallel with a direction of a stripe-like pattern formed by the upper insulation films 203.

The gate insulating film 205, the source electrode film 206, the drain electrode film 207, and the gate electrode film 208 can be formed by the same methods as used for forming conventional thin film transistors, such as a thin film deposition and a patterning.

The polycrystalline thin film transistor thus obtained exhibited a field effect mobility of approximately 180 cm$^2$/V·sec, whereas a transistor made in accordance with a prior art method showed a field effect mobility of 70 cm$^2$/V·sec, which demonstrates that a remarkable improvement in TFT characteristics was achieved.

It is to be noted that the relationship between the direction of the upper insulating film 203 and the source-drain direction is not limited to the above-described relationship, in which both are directed to the same direction. Many variations are possible insofar as the source-drain direction is made to be in the lengthwise direction of the crystal grains formed according to the interval between each of the upper insulating films 203 and so forth.

EXAMPLE 1-3

Example 1-3 describes an example in which a polycrystalline silicon thin film transistor having a larger size than the transistor produced in accordance with the foregoing Example 1-2.

A polycrystalline silicon thin film transistor of Example 1-3 differs from the thin film transistor of the foregoing Example 1-2 in that two large crystal grain regions 210b formed between three upper insulating films 203 are employed to form the transistor. In addition, a silicon oxynitride thin film formed by a plasma CVD having a thickness of approximately 200 nm is used for the lower insulating film 202, and a silicon oxide thin film having a thickness of approximately 40 nm is used for the upper insulating films 203. Each of the large crystal grain regions 210b is formed by firstly forming an amorphous silicon thin film 204 having a thickness of 85 nm on the upper insulating film 203 formed by pattering, and then irradiating the amorphous silicon thin film 204 with an excimer laser as in Example 1-1 to obtain a polycrystalline silicon thin film.

When the interval of the upper insulating films 203 is increased in order to increase the size of the transistor to be produced, it becomes difficult in the polycrystallization treatment to form a sufficient temperature gradient between the region in which a transistor is to be formed and the peripheral regions sandwiching the region in which a transistor is to be formed, and as a result, there is a possibility that the size of crystal grains in the region in which a transistor is to be formed cannot be made sufficiently large. In view of this problem, the temperature gradient is deliberately increased instead of increasing the interval of the upper insulating films 203, and a plurality of large crystal grain regions 210b with a desirable crystal condition are formed. By combining these, a large-sized thin film transistor with desirable characteristics can be achieved. Specifically, for example, a transistor made in accordance with the present example exhibited a field effect mobility of approximately 200 cm$^2$/V·sec, which was a remarkably good characteristic.

As has been described thus far, according to a method for producing a polycrystalline silicon thin film transistor of the present invention, it is made possible to make large crystal grains exclusively in a region in which a transistor is to be formed. It is, however, to be noted that a material for the insulating film to be formed on the transparent insulating substrate is not limited to silicon nitride, silicon oxynitride, and silicon oxide. Other materials may be employed insofar as the materials have different thermal conductivities from each other and a selective etching for the materials is possible.

EXAMPLE 2-1

As a semiconductor device of Example 2-1, an example of a thin film transistor as a semiconductor device having large crystal grains is described below.

FIGS. 16(*a*) and 16(*b*) show schematic views of a thin film transistor. FIG. 16(*a*) shows a plan view thereof, and FIG. 16(*b*) shows a cross sectional view taken along the line A-A' in FIG. 16(*a*).

Referring to FIGS. 16(*a*) and 16(*b*), an insulating substrate 301 is shown. On the insulating substrate 301, an undercoat layer 302 is provided, and on the undercoat layer 302, a semiconductor layer 303 is formed by crystallizing an amorphous semiconductor film. In the semiconductor layer 303, a plurality of protruding parts 303a are formed with predetermined intervals, and each of the protruding parts 303a extends outwardly in the same plane as that of the semiconductor layer 303. Each protruding part 303a is so formed as to have an approximately rectangular shape, and the length (a length of a line protruding from the semiconductor layer 303) and the width (a length of a line perpendicular to the line protruding from the semiconductor layer 303) are made to be 1 µm. A first insulating layer 304 is provided over the semiconductor layer 303 so as to cover the semiconductor layer 303, and a gate electrode 305 as a first electrode is provided at a predetermined position on the first insulating layer 304. A second insulating layer 306 is provided so as to cover the gate electrode 305, and a source electrode 307s and a drain electrode 307d are provided at a predetermined position on the second insulating layer 306, as a pair of second electrodes electrically connected with the semiconductor layer 303.

It is noted here that the width of the protruding part 303a is not limited to 1 µm. However, in order to provide one crystal nucleus for each of the protruding parts 303a, it is preferable to make the width within the range of from a width approximately equal to or greater than the thickness of the semiconductor layer 303 (for example, 0.05 µm) to approximately 3 µm. The technical reason why the above range is preferred is as follows: on one hand, when the width of the protruding part 303a is smaller than the thickness of the semiconductor layer, there is a possibility that the crystal nucleus to be grown in the protruding part 303a is dragged into the semiconductor layer 303 by the effect of surface tension, and therefore the crystal nucleus cannot continue to exist; on the other hand, when the width of the protruding part 303a is larger than 3 µm, there is a possibility that two or more crystal nuclei are grown on the protruding part 303a. It is noted that the shape of the protruding part 303a may be other shapes than a rectangular shape, such as a semicircular shape and a triangular shape. In addition, the plurality of the protruding parts 303a need not be formed along the entire lengthwise line segments opposed to each other in the semiconductor layer 303, and may be provided, for example, only in the region corresponding to the gate electrode 305. That is, the protruding parts 303a should be provided at least in a channel region that affects the characteristics of the device. In addition, the protruding parts 303a may be so formed that they are disposed in the vicinity of an intermediate position between the source and the drain. An interval between each of the protruding parts 303a next to each other may be suitably selected depending upon such conditions as a desired grain size and so forth. In the present example, the interval between each of the protruding parts 303a is set to be approximately equal to the length (W) of a line segment perpendicular to the line segment along which the protruding parts 303a are provided. Such setting is preferable in that by such setting, a large crystal grain that has approximately the same lengths in both lengthwise and widthwise directions is likely to be formed. However, even if such setting is not employed, the advantageous effect that relatively large crystal grains are formed can be obtained since crystals are grown from the peripheral regions in a controlled manner.

Because of the provision of such protruding parts 303a in the semiconductor layer 303, the protruding parts 303a are cooled earlier after the semiconductor layer 303 is heated by the laser beam irradiation, which makes the formation of crystal nuclei easy to take place therein, and thereafter, crystals are grown from the formed crystal nuclei towards a central region of the semiconductor layer 303. During this process, the crystal grains grown from the adjacent protruding parts 303a next to each other and from the opposing protruding parts 303a tend to grow until they reach the vicinity of a central region of the semiconductor layer 303 without interfering each other, and consequently, relatively large crystal grains are formed. Hence, the field effect mobility is increased and TFT characteristics are improved.

Now, with reference to FIGS. 18(a) to 18(e), a method of producing the above-described thin film transistor is detailed below. FIGS. 18(a) to 18(e) illustrate the steps of producing such a thin film transistor described above.

Figure 18:
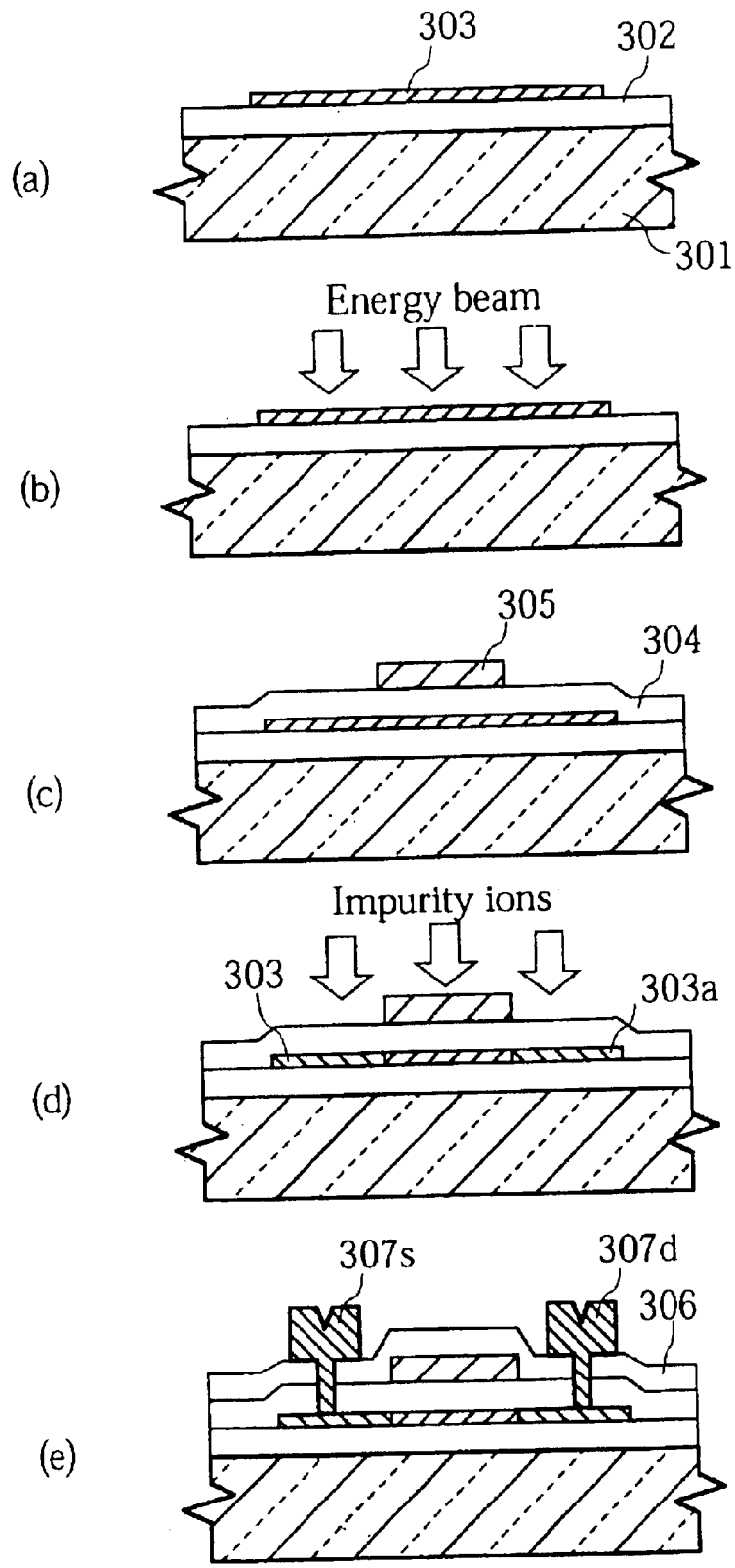
FIGS. 18(a) to 18(e) illustrate production steps for the TFT of Example 2-1.

Firstly, as shown in FIG. 18(a), an undercoat layer 302 is formed on an insulating substrate 301, and silicon is attached on the undercoat layer 302 to form an amorphous (non-single crystal) semiconductor layer 303. Secondly, a photoresist (not shown) is selectively formed in a predetermined shape, and using the photoresist as a mask, the amorphous semiconductor layer 303 is formed into such a shape as shown in the foregoing FIG. 16(a) that a plurality of the protruding parts 303a extending outwardly in the same plane as the amorphous semiconductor layer 303 are provided along the whole lengths of the opposed line segments of the amorphous semiconductor layer 303. Thereafter, the photoresist is removed.

Subsequently, as shown in FIG. 18(b), the amorphous semiconductor layer 303 is irradiated with an excimer laser as an energy beam to crystallize the amorphous semiconductor layer 303 into a modified layer of poly-Si. Here, after the laser light irradiation, the heat accumulated in a protruding part 303a situated in the peripheral region can diffuse in three outward directions in a plane parallel to the semiconductor layer 303, whereas the heat accumulated in the central region cannot diffuse except towards the peripheral region that is not yet cooled. Therefore, the peripheral region including the protruding part 303a is cooled sufficiently earlier than the central region. As a result, a crystal nucleus in the protruding part 303a is formed in an earlier stage than crystal nuclei in the central region, and the crystal nucleus formed in the peripheral region grows towards the central region before crystal nuclei are formed or grown in the central region. Thereby, it is made possible to control a crystal grain size and a crystal orientation. Thus, the interference between crystals during the process of crystal growth is prevented, and a sufficient crystal grain size can be easily obtained.

Subsequent to the above, as shown in FIG. 18(c), a first insulating layer 304 is formed on the semiconductor layer 303 and the undercoat layer 302, and a gate electrode 305 as a first electrode, is selectively formed on the first insulating layer 304.

Thereafter, as shown in FIG. 18(d), utilizing the gate electrode 305 as a mask, a source region 303s and a drain region 303d are formed by adding an impurity serving as a donor or an acceptor into the semiconductor layer 303 with the use of an ion implantation method or a non-mass separation ion doping method.

Finally, as shown in FIG. 18(e), a second insulating layer 306 is formed, and thereafter contact holes are opened and a source electrode 307s and a drain electrode 307d are selectively formed, thereby completing a thin film transistor.

Although Si is used for the semiconductor layer 303 in the present example, other materials such as a compound of Si and Ge may also be employed. Other combinations of group IV elements such as SiC, combinations of a group III element and a group V element such as GaAs, combinations of a group II element and a group VI element such as CdSe are also possible. In addition, although an example of a polycrystalline silicon thin film transistor has been described here, the present invention is not limited thereto and can be suitably applied to other various semiconductor devices.

Further, although an excimer laser is used as an energy beam to polycrystallize the amorphous semiconductor layer 303 in the present example, other energy beams may be employed. Examples of other energy beams include a laser light such as Ar laser, YAG laser, and so forth, ion beams, and electron beams.

EXAMPLE 2-2

Now, an example of an inverted staggered type thin film transistor is detailed as a semiconductor device of Example 2-2.

FIGS. 17(a) and 17(b) schematically show the thin film transistor according to Example 2-2. FIG. 17(a) shows a plan view of the thin film transistor, and FIG. 17(b) shows a cross-sectional view taken along the line A-A' in FIG. 17(a).

The thin film transistor of Example 2-2 differs from the thin film transistor of the foregoing Example 2-1 primarily in that the transistor has an inverted staggered structure and that the protruding parts 303a are formed along the whole perimeter line of the semiconductor layer 303.

Referring now to FIGS. 17(a) and 17(b), an insulating substrate 301 is shown. On the insulating substrate 301, an undercoat layer 302 is provided, and on the undercoat layer 302, a gate electrode 305 is provided as a first electrode. A first insulating layer 304 is provided over the gate electrode 305, and on the first insulating layer 304, a semiconductor layer 303 is provided. This semiconductor layer 303 has, as shown in FIG. 17(a), a plurality of protruding parts 303a extending outwardly in the same plane as the semiconductor layer 303, and the protruding parts 303a are formed along the whole perimeter line of the semiconductor layer 303 so as to have a predetermined interval between each of the protruding parts. The shape and other conditions of each protruding part 303a are the same as those in the foregoing Example 2-1. It is preferred that each of the intervals between the protruding parts 303a is approximately equal to the width of the semiconductor layer 303 as in the foregoing Example 2-1, although in FIG. 17(a), the intervals are drawn to be narrower for the sake of convenience in the drawing. It is noted, however, that even if the interval is made to be narrower as drawn in FIG. 17(a) or made to be wider, the advantageous effect that relatively large crystal grains are formed can be obtained since crystals are grown from the peripheral regions in a controlled manner. On the semiconductor layer 303, a source electrode 307s and a drain electrode 307d are formed, as a pair of second electrodes electrically connected with the semiconductor layer 303.

Now, with reference to FIGS. 19(a) to 19(e), a producing method of the above-described thin film transistor is described. FIGS. 19(a) to 19(e) illustrate the steps of producing the thin film transistor.

Figure 19:
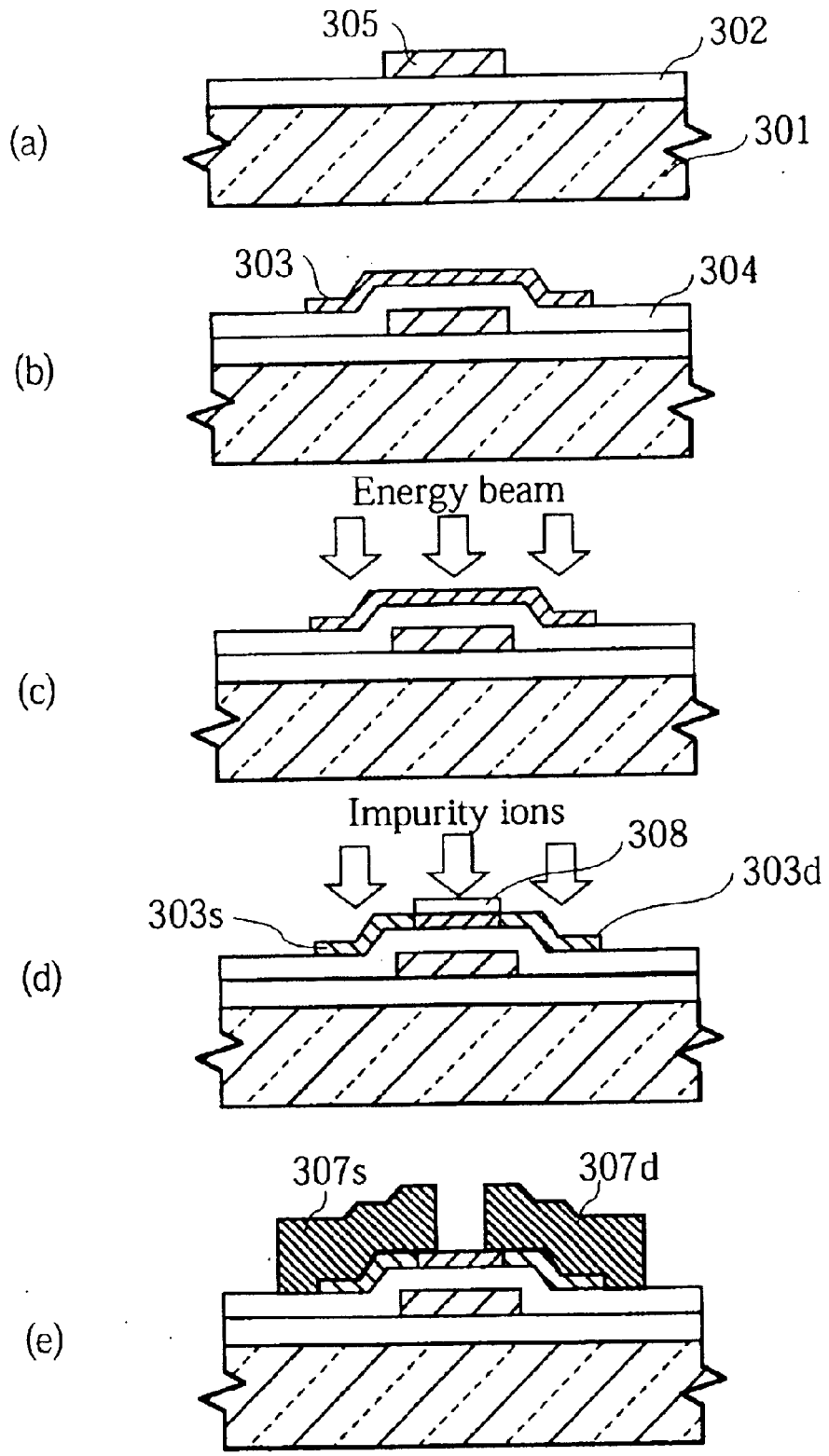
FIGS. 19(a) to 19(e) illustrate production steps for the TFT of Example 2-2.

Firstly, as shown in FIG. 19(a), an undercoat layer 302 is formed on a insulating substrate 301, and a gate electrode 305 as a first electrode is selectively formed on the undercoat layer 302.

Secondly, as shown in FIG. 19(b), a first insulating layer 304 is formed over the gate electrode 305 and the undercoat layer 302, and an amorphous (non-single crystalline) semiconductor layer 303 is formed by coating silicon on the first insulating layer 304. Then, a photoresist (not shown) is selectively formed on the semiconductor layer 303 into a predetermined shape, and using the photoresist as a mask, the amorphous semiconductor layer 303 is formed in such a shape that a plurality of protruding parts 303a extending outwardly in the same plane as the semiconductor layer 303 are provided along the whole perimeter line, as shown in the foregoing FIG. 17(a). Thereafter the photoresist is removed.

Subsequently, as shown in FIG. 19(c), the amorphous semiconductor layer 303 is irradiated with an excimer laser light as an energy beam to crystallize the amorphous semiconductor layer 303 into a modified layer of poly-Si. In this stage, because the protruding parts 303a are formed as described above, a sufficient crystal grain size can be readily achieved for the reasons described in the foregoing Example 2-1.

Thereafter, as shown in FIG. 19(d), a resist 308 serving as a mask against doping is selectively formed on the semiconductor layer 303 to have a predetermined shape, and utilizing the resist 308 as a mask, a source region 303s and a drain region 303d are formed by adding an impurity serving as a donor or an acceptor into the semiconductor layer 303 with the use of an ion implantation method or a non-mass separation ion doping method. Then, the resist 308 is removed.

Finally, as shown in FIG. 19(e), a source electrode 307s and a drain electrode 307d are selectively formed, and thus a thin film transistor is obtained.

It is to be noted that various modifications described in the foregoing Example 2-1 are also possible in Example 2-2.

In addition, the present example is not limited to the application to an inverted staggered type thin film transistor as described, and the same advantageous effects as those in the present example can be also obtained when a staggered type thin film transistor as in the foregoing Example 2-1 is produced accordingly. Further, instead of forming the protruding parts 303a along the whole perimeter line of the semiconductor layer 303 as described above, the protruding parts 303a may be formed only along the opposed lines as described in the foregoing Example 2-1.

EXAMPLE 3-1

Example 3-1 is now detailed with reference to FIGS. 20–22. A structure of a thin film transistor (TFT) according to Example 3-1 is detailed first.

FIGS. 20(a) and 20(b) schematically show the structure of a staggered type TFT 410. FIG. 20(a) shows a plan view of the TFT 410, and FIG. 20(b) shows a cross-sectional view taken along the line A-A' in FIG. 20(a). FIG. 21 shows a cross-sectional view taken along the line B-B' in FIG. 20(a). As shown in FIGS. 20(a) and 20(b), the TFT 410 comprises an insulating substrate 401, and on the insulating substrate 401, there are provided an undercoat layer 402, a p-Si film 403, a first insulating film 404, a second insulating film 406, a gate electrode 405, and three electrodes, namely a gate electrode 405, a source electrode 407s, and a drain electrode 407d.

The insulating substrate 401 is composed of, for example, a glass substrate having a thickness of 1.1 mm and a glass transition temperature of 593° C., and the undercoat layer 402 is composed of, for example, a thin film comprising $SiO_2$. The p-Si film 403 is a polycrystalline semiconductor layer, which is formed on the undercoat layer 402 by using the method of the present invention. The p-Si film 403 has a channel region 403a, a source region 403b, and a drain region 403c, and the channel region 403a is disposed between the source region 403b and the drain region 403c. The source region 403b and the drain region 403c are produced by doping impurity ions such as phosphorus ions, boron ions, and so forth.

Regarding the material for the p-Si film 403, silicon (Si), or a compound of silicon and germanium (Ge) may be employed. A thickness of the p-Si film 403 is preferable to be within the range of 200 Å–1500 Å, or more preferably within the range of 300 Å–1000 Å. If the thickness is less than 200 Å, a uniform film thickness is difficult to obtain. On the other hand, if the thickness is greater than 1500 Å, a problem of so-called photoconduction is caused, the problem in which an electric current flows between the source and drain by the light irradiation. However, when the thickness is within the range of 300 Å–1000 Å, both a uniform thickness and the suppression of photoconduction are achieved.

In addition, a width of the channel region 403a in a direction of the arrow X in FIG. 20(a) is, for example, approximately 12 μm, and a width of the p-Si film 403 in a direction of the arrow Y is, for example, approximately 14 μm.

Figure 21:
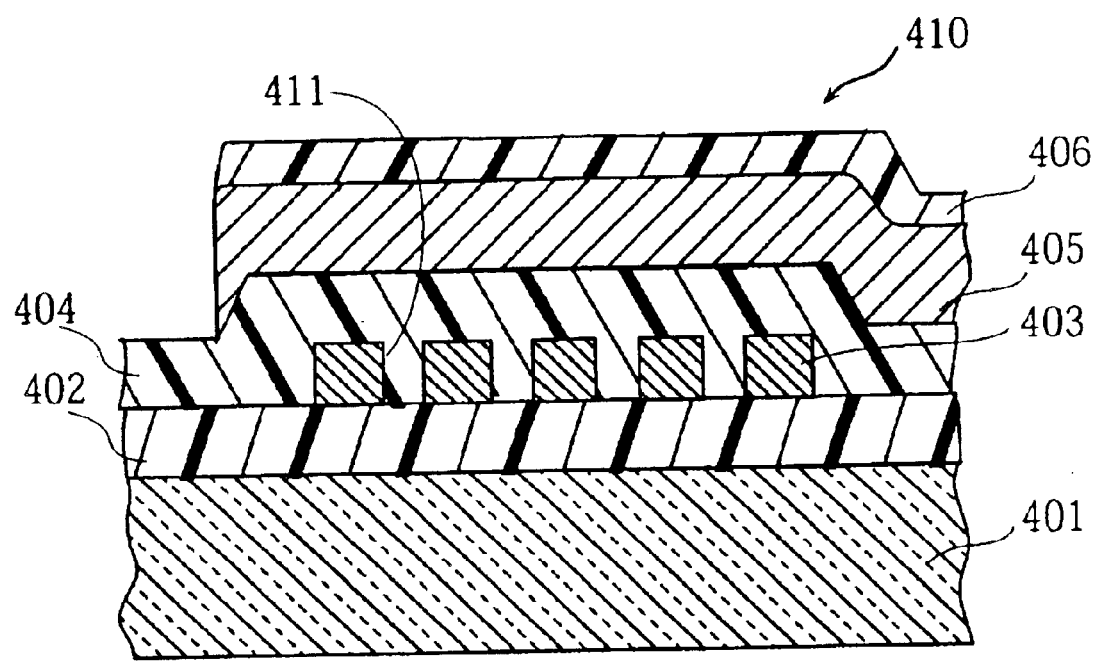
FIG. 21 is a cross sectional view taken along the line B-B' in FIG. 20(a) of Example 3-1.
Figure 22:
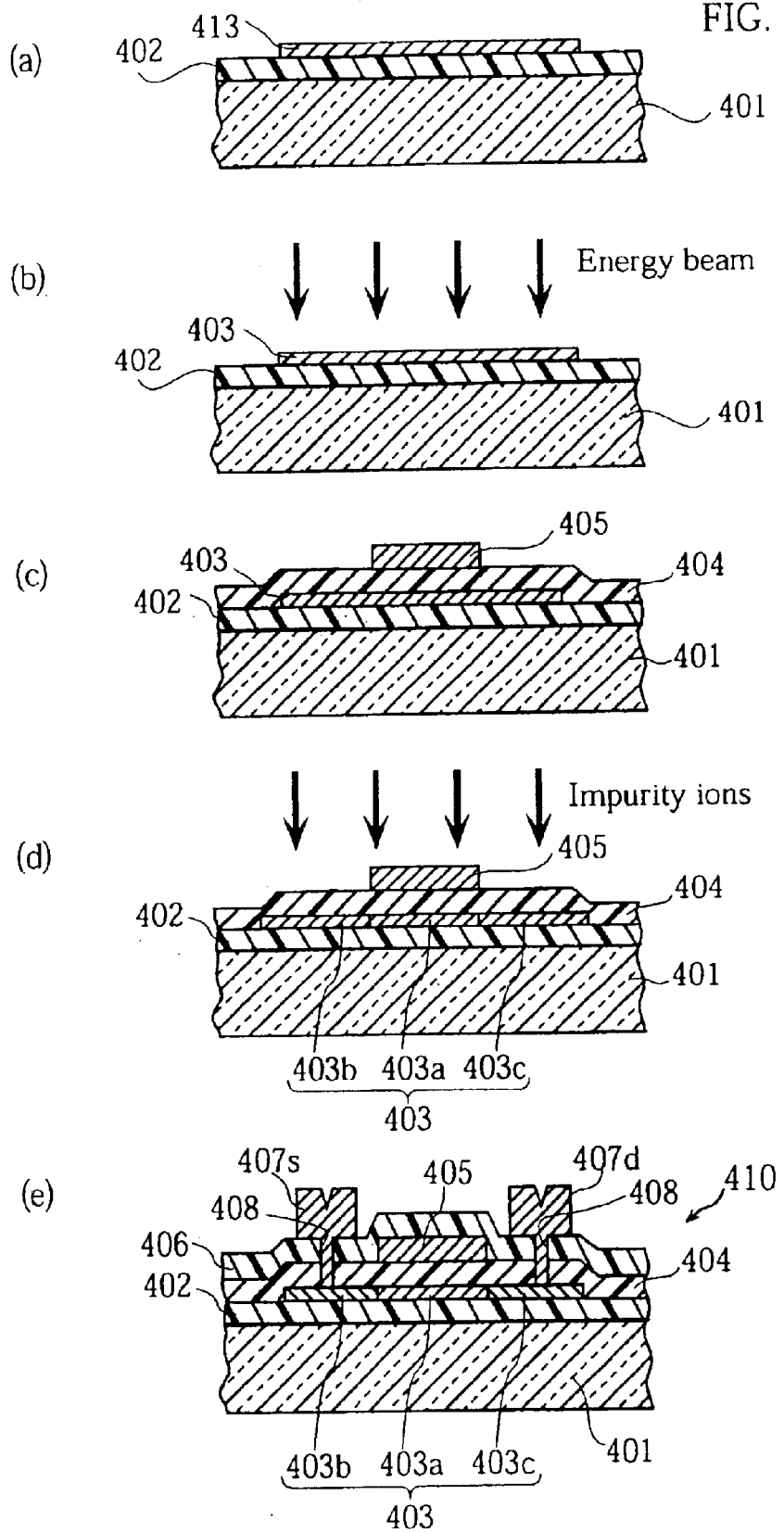
FIGS. 22(a) to 22(e) illustrate production steps for the TFT of Example 3-1.

In the channel region 403a, as shown in FIG. 20(a) and FIG. 21, a plurality of groove-like gaps 411 for controlling an orientation of crystal growth are formed so as to be parallel to a line linking the source region 403b and the drain region 403c. Each of the gaps 411 has a semicircular edge at both lengthwise edges and a middle portion having a rectangular parallelepiped shape, and a width of the groove in the middle portion (a width of the groove in a direction perpendicular to the lengthwise direction) is approximately 1 μm. It is noted, however, that the shape of the gaps 411 are not particularly restricted. For example, the gap 411 may be formed into a rectangle or the like shape, and made to be parallel to a line linking the source region 403b and the drain region 403c.

In the channel region 403a, each of the crystal grains results in a shape extending longitudinally and narrowly towards the source region 403b or the drain region 403c, and a multiplicity of such crystal grains constitute a polycrystalline semiconductor layer of the channel region 403a. In the channel region 403a having such a polycrystalline structure, a density of grain boundaries is small along the direction of a line connecting the source region 403b and the drain region 403c, and therefore charge carriers can be transferred at high speed.

The first insulating film 404 is composed of, for example, $SiO_2$, and is formed over the p-Si film 403 and the undercoat layer 402. The gate electrode 405 is composed of, for example, aluminum (Al) and the like, and is provided on the first insulating film 404 and at a position corresponding to the channel region 403a of the p-Si film 403. The second insulating film 406 is composed of, for example, $SiO_2$, and is stacked over the first insulating film 404 and the gate electrode 405.

In the first insulating film 404 and the second insulating film 406, contact holes 408 are formed, and each of the contact holes 408 reaches the source region 403b or the drain region 403c of the p-Si film 403. The source electrode 407s and the drain electrode 407d are composed of, for example, Al, and are so formed to be in contact with the source region 403b or the drain region 403c via the contact hole 408. The wiring pattern of the gate electrode 405, the source electrode 407s, and the drain electrode 407d is constructed by patterning into a predetermined shape in a position not the cross sectional surface shown in FIG. 21.

Now, with reference to the figures, a method of producing the TFT 410 according to Example 3-1 is detailed below.

FIGS. 22(a) to 22(e) schematically show cross sectional views for illustrating steps of producing the TFT 410. Firstly, as shown in FIG. 22(a), the undercoat layer 402 is formed on the insulating substrate 401 by an atmospheric pressure CVD method. A thickness of the undercoat layer 402 is, for example, 3000 Å.

On the undercoat layer 402, an Si layer is formed by, for example, a plasma CVD method, and on the Si layer, a photoresist (not shown) is selectively formed to have a predetermined shape. Then, using the photoresist as a mask, an exposure is carried out, and thereafter patterning is performed by etching to obtain a predetermined pattern. Thereafter, the photoresist is removed.

Thus, an —Si film 413 is formed as a non-single crystalline semiconductor layer having a plurality of gaps 411 for controlling an orientation of crystal growth. The thickness of the a-Si film 413 is made, for example, 650 Å. In the case where the gaps 411 need to be formed in a very small size, a high accuracy photoresist and an exposure to an interference pattern of coherent lights can serve the purpose.

Subsequent to the formation of the a-Si film 413, the a-Si film 413 is heated by irradiating the entire surface of the a-Si film 413 with one shot of an excimer laser as shown in FIG. 22(b), and thereafter cooled. The p-Si film 403 as a crystalline semiconductor layer is thereby formed.

By employing a crystallization method utilizing an excimer laser, the temperature of the main portion of the a-Si film 413 is sufficiently raised since the a-Si film 413 has a large absorption coefficient in a range of ultraviolet rays, whereas the region of the gaps 411, from which a-Si is removed, is maintained at a low temperature because the laser light is not absorbed in the region of the gaps 411. As a result, in the process of cooling, the temperature in the vicinity of the gaps 411 (and the peripheral region of the a-Si film 413) first reaches the crystallization-starting temperature, and crystal nuclei are initially formed in this region. Thereafter, the crystal growth continues to take place from this crystal nucleus. As has been mentioned above, the orientation of crystal growth is restricted by the gaps 411 each provided in parallel, and thereby is guided in a direction parallel to the direction linking the source region 403b and the drain region 403c. Hence, the resulting p-Si film has a small density of grain boundaries in the direction parallel to the direction linking the source region 403b and the drain region 403c.

Regarding the conditions of the irradiation of the energy beam, for example, in the case of an excimer laser of XeCl (wavelength: 308 nm) and the like, a laser light pulse of 50 ns in which a cross-sectional shape of the beam is a rectangle having each line segment of several millimeters, is used. The energy density (irradiating energy per unit area: $mJ/cm^2$) may be selected appropriately so that the a-Si film 413 can be heated to a temperature suitable for the crystallization.

For the excimer laser, other excimer lasers of such as ArF, KrF, XeF and the like may be used other than XeCl as above. An interval between the plurality of gaps 411 may be appropriately selected depending upon a thickness of the a-Si film, conditions of the laser irradiation, and a desired charge carrier mobility. In this example, the interval is set at approximately 2 μm. A width of the gaps 411 may also be appropriately selected depending upon a thickness of the a-Si film, a type and intensity of the energy beam to be irradiated, and the like. In Example 3-1, the width is made to be approximately 1 μm.

After the crystallization of the a-Si film as described above, the first insulating film 404 is formed on the p-Si film 403 as shown in FIG. 22(c) by an atmospheric pressure CVD method, so as to have a thickness of 1000 Å. Then, by forming an Al film on the first insulating film 404 so as to have a thickness of 2000 Å with the use of sputtering, and then carrying out a wet etching for approximately 1 minute with the use of an Al etchant liquid, the gate electrode 405 and a predetermined wiring pattern are formed.

Subsequently, as shown in FIG. 22(d), using the gate electrode 405 as a mask, impurity ions serving as donors or acceptors, such as, specifically, phosphorus ions and boron ions, are implanted in the p-Si film 403 by an ion implantation method or a non-mass separation ion doping method. The channel region 403a, the source region 403b, and the drain region 403c are thus formed in the p-Si film 403.

Then, as shown in FIG. 22(e), the second insulating film 406, composed of, for example, $SiO_2$, is formed on the gate electrode 405 by an atmospheric pressure CVD method, so as to have a thickness of 5000 Å. Thereafter, the contact holes 408 are formed in the first insulating film 404 and the second insulating film 406 so as to reach the source region 403b or the drain region 403c in the p-Si film 403. Following this, an Al film is formed by sputtering to have a thickness of 3000 Å, and a predetermined pattern is formed by dry etching using a BC13/C12 type gas. The source electrode 407s and the drain electrode 407d, and the wiring pattern of these are thereby formed.

According to Example 3-1 as described thus far, it is made possible to form large crystal grains longitudinally extending in the direction linking the source region 403b and the drain region 403c, and as a result, a staggered type TFT having an excellent field effect mobility is achieved. In addition, the present example does not employ costly materials for the insulating substrate 401 and the p-Si film 403 and thus can provide TFTs having an excellent field effect mobility at low cost.

EXAMPLE 3-2

Example 3-2 in accordance with the present invention is detailed with reference to FIGS. 23 to 25. Of the components of a thin film transistor in accordance with Example 3-2, the components having like functions corresponding to Example 3-1 are represented by like reference numbers and characters, and such components will not be further elaborated upon here.

FIGS. 23(a) and 23(b) show schematic views of an inverted staggered type TFT 420 in accordance with Example 3-2, wherein FIG. 23(a) shows a plan view of the TFT 420, FIG. 23(*b*) shows a cross sectional view taken along the line A-A' in FIG. 23(*a*). FIG. 24 shows a cross sectional view taken along the line B-B' in FIG. 23(*a*). As shown in FIGS. 23(*a*) and 23(*b*), the TFT 420 is provided with, on an insulating substrate 401, an undercoat layer 402, a p-Si film 403, a first insulating film 404, and three electrodes, namely, a gate electrode 405, a source electrode 407*s* and a drain electrode 407*d*.

The gate electrode 405 is formed on the undercoat layer 402 formed over the insulating substrate 401. The first insulating film 404 is formed over the undercoat layer 402 and the gate electrode 405. Further, the p-Si film 403 is formed over the first insulating film 404.

Figure 24:
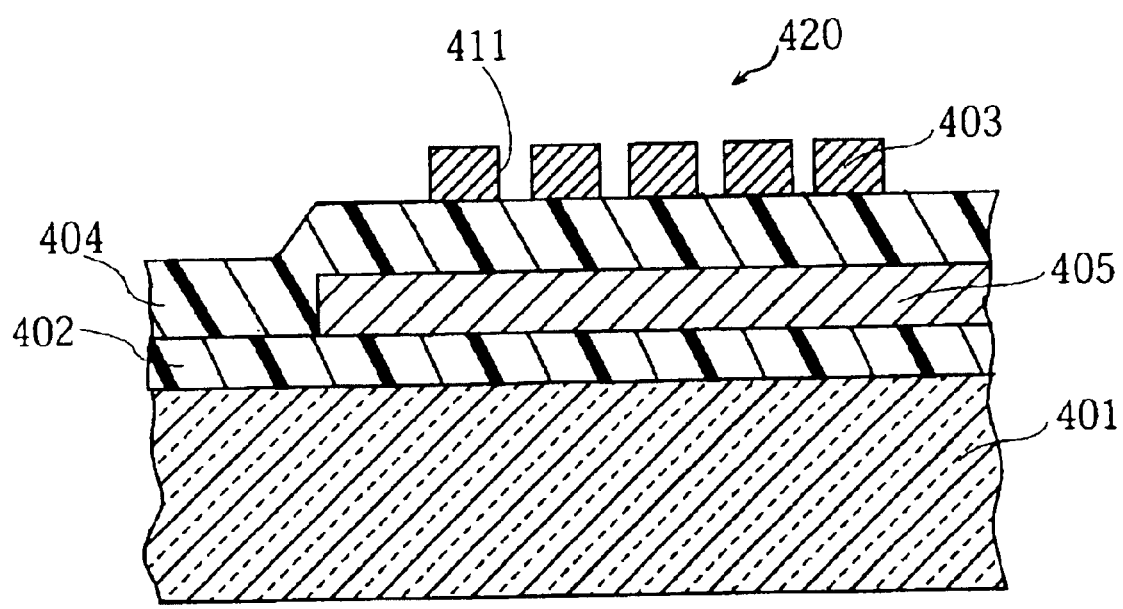
FIG. 24 is a cross sectional view taken along the line D-D' in FIG. 23(a).

In a channel region 403*a* in the p-Si film 403, a plurality of groove-like gaps 411 are formed in a direction from a source region 403*b* towards a drain region 403*c* as in the foregoing Example 3-1 (see FIG. 23(*a*) and FIG. 24). The source electrode 407*s* and the drain electrode 407*d* are formed so as to be in contact with the source region 403*b* and the drain region 403*c* in the p-Si film 403 respectively. It is noted that in a region not the cross sectional surfaces shown in the figures, the gate electrode 405, the source electrode 407*s* and the drain electrode 407*d* are patterned into a predetermined shape to form a wiring pattern.

Now, a method of producing the TFT 420 in accordance with the present example is detailed with reference to FIGS. 25(*a*) to 25(*e*). FIGS. 25(*a*) to 25(*e*) show schematic cross sectional views illustrating production steps of the TFT 420. First, in a manner analogous to that in the foregoing Example 3-1, the undercoat layer 402 is formed on the insulating substrate 401. Subsequently, on the undercoat layer 402, the gate electrode 405 and the wiring pattern are formed by performing a patterning into predetermined shapes (see FIG. 25(*a*)).

Next, as shown in FIG. 25(*b*), the first insulating film 404 is formed over the gate electrode 405 and the undercoat layer 402. Further, in a manner analogous to that in Example 3-1, an Si layer is formed on the first insulating film 404 by for example a plasma CVD method. After a photoresist is selectively formed on the Si layer in a predetermined shape, an exposure is implemented using the photoresist as a mask, and thereafter a patterning is performed by etching to obtain a predetermined shape. Thereafter, the photoresist is removed. Thus, the a-Si film 413 having a plurality of gaps 411 for controlling an orientation of crystal growth is formed Then, as shown in FIG. 25(*c*), an excimer laser is applied to the entire surface of the a-Si film 413 to crystallize the a-Si film 413, and thus the p-Si film 403 is formed.

Since the gaps 411 for controlling are provided in the channel region 403*a* in the p-Si film 403, the formed crystal grains have a long and narrow shape extending towards the source region 403*b* or the drain region 403*c*. As a consequence, grain boundaries along the direction of the straight line linking the source region 403*b* and the drain region 403*c* are practically reduced, and therefore the field effect mobility is improved.

Then, as shown in FIG. 25(*d*), a resist is applied onto the p-Si film 403, and patterned into a predetermined shape by an exposure and development to form a resist mask 414 as an ion blocking film. The resist mask 414 is not particularly limited insofar as the material can block impurity ions, and various known materials may be employed. Specifically, for example, a positive resist such as OFPR-5000 (trademark, manufactured by Tokyo Ohka Kogyo Co., Ltd.) may be employed. In addition, the resist mask 414 is not limited to materials having photosensitivity such as the resist, but may be made of such materials that patterning by photolithography is possible.

Using the resist mask 414 as a mask, impurity ions of such as phosphorus ions and boron ions are implanted into the p-Si film 403 by using, for example, an ion doping method. Thereby, the channel region 403*a* is formed on the p-Si film 403 and the source region 403*b*, and the drain region 403*c* are formed on the respective sides of the channel region 403*a*. Thereafter, the resist mask 414 is removed, and further, as shown in FIG. 25(*e*), the source electrode 407*s* and the drain electrode 407*d* are selectively formed. Thus, an inverted staggered type TFT 420 in accordance with Example 3-2 is produced.

The inverted staggered type TFT thus produced also achieves the advantageous effects as obtained in the foregoing Example 3-1, such as an improvement in the field effect mobility and so forth.

EXAMPLE 3-3

Figure 26:
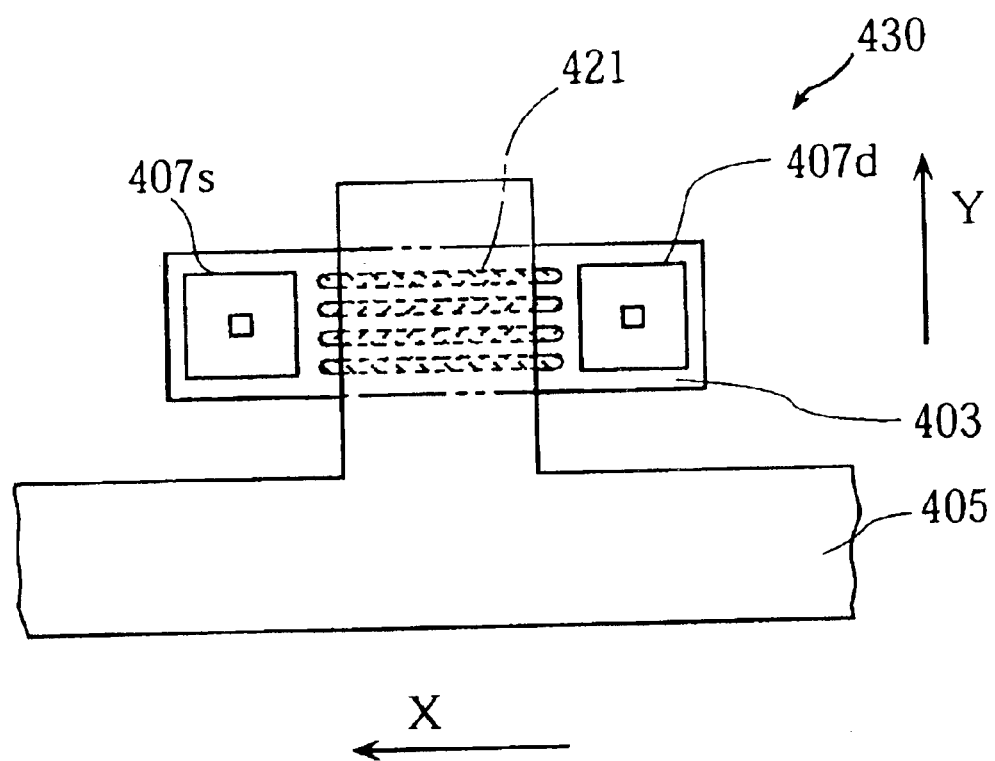
FIG. 26 is a plan view showing a construction of a TFT of Example 3-3.

Example 3-3 is characterized in that an early-crystallization region in which crystallization starts at a higher temperature than in other regions is provided, in place of the gaps for controlling an orientation of crystal growth employed in the foregoing Examples 3-1 and 3-2. Referring now to FIG. 26, a crystalline thin film semiconductor transistor in accordance with Example 3-3 is detailed below. Since the present example is identical to the foregoing Example 3-1 except that the early-crystallization region is provided in place of the gaps for controlling an orientation of crystal growth, no further elaboration except the details regarding the early-crystallization region will be given here. The components having like functions corresponding to Examples 3-1 and 3-2 are designated by like reference numerals and characters.

As shown in FIG. 26, belt-like shaped early-crystallization regions 421 are formed in the channel region of the p-Si 403 so as to extend from the source region towards the drain region. In the early-crystallization regions 421, impurity ions other than phosphorus ions, boron ions, or the like, are implanted. A TFT 430 having such a configuration is produced in the following manner.

First, in a manner analogous to that in the foregoing Example 3-1, the undercoat layer 402 is deposited on the insulating substrate 401 by using an atmospheric pressure CVD method. Thereafter, an Si layer is formed on the undercoat layer 402 by using, for example, a plasma CVD method, and on the Si layer, a photoresist is selectively formed in a predetermined shape. After the photoresist is exposed using the photoresist as a mask, and then patterned into a predetermined shape by etching, and thus an a-Si film 413 is formed.

Subsequently, in the channel region 403*a* in the a-Si film 413, impurity ions capable of raising the crystallization-starting temperature, but not phosphorus ions or boron ions, are implanted in belt-like regions extending from the source region 403*b* towards the drain region 403*c* to form early-crystallization regions 421. Then, an excimer laser beam as an energy beam is applied to the entire surface of the a-Si film 413 in which the early crystallization regions 421 are already formed for approximately 50 ns, and thereafter the a-Si film 413 was cooled for the crystallization of the a-Si film 413.

When the energy beam is applied to the entire surface of the a-Si film 413, the temperature of the surface of the a-Si film increases, and then the temperature gradually decreases by heat dissipation. In the process of the temperature decrease, crystal nuclei are first formed in the early-crystallization region 421 earlier than in other regions. The reason is that by implanting impurity ions therein, the early-crystallization region 421 is formed so that crystallization takes place at a higher temperature than in the other regions.

Thereafter, crystal growth takes place from the crystal nuclei formed in the early-crystallization region 421. Thereby, a poly-Si film in which large crystal grains are collectively grown can be formed.

It is noted that the fabrication steps after the crystallization are the same as those in the foregoing Example 3-1.

The technique for implanting the impurity ions capable of raising the temperature of starting the crystallization are not particularly limited, and various known techniques may be employed. In addition, although the present example shows an example of a staggered type thin film transistor, the same advantageous effects can be obtained also in inverted staggered type transistors. The early-crystallization region is not limited to the one as described above in which impurity ions are implanted, but may be formed by such a manner that a crystallized region (pre-crystal) is partially formed in advance and the differences of the melting points corresponding to the degrees of crystallinity (crystallization temperatures) are utilized. In addition, in order to form such pre-crystals in a very small size, for example, the irradiation of interference patterns of coherent lights may be employed.

Supplementary Remarks for Example 3-1 to 3-3

Figure 27:
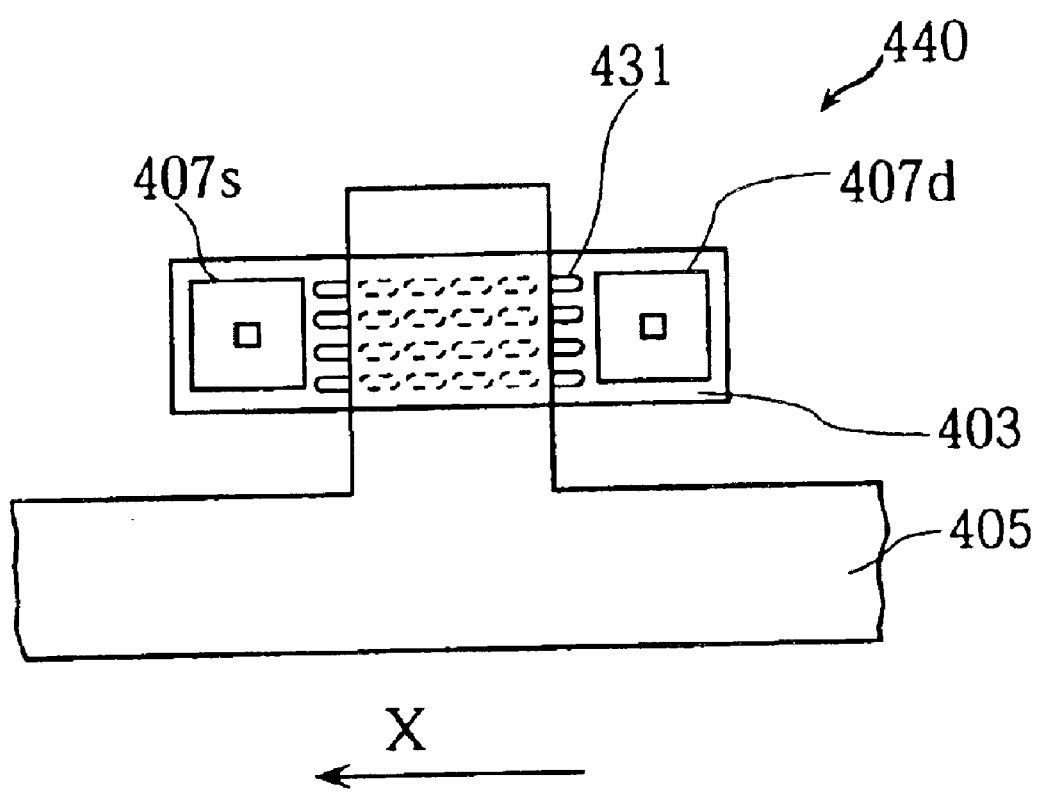
FIG. 27 is a plan view showing a construction of a TFT of a variation in accordance with Examples 3-1 to 3-3.

The foregoing Examples 3-1 and 3-2 employ a plurality of groove-like gaps 411 for controlling an orientation of crystal growth longitudinally extending in a direction linking the source region and the drain region are provided in the a-Si film 413. However, the present invention is not limited thereto. For example, a plurality of gaps 431 for controlling an orientation of crystal growth may be discontinuously provided in the direction linking the source region and the drain region as shown in FIG. 27. In such a configuration, by appropriately adjusting the intervals of the gaps 431 in the direction linking the source region and the drain region as well as the intervals of the adjacent gaps 431 in a direction perpendicular to the above-described direction, it is made possible to control the size of the crystal grains in the foregoing direction.

Figure 28:
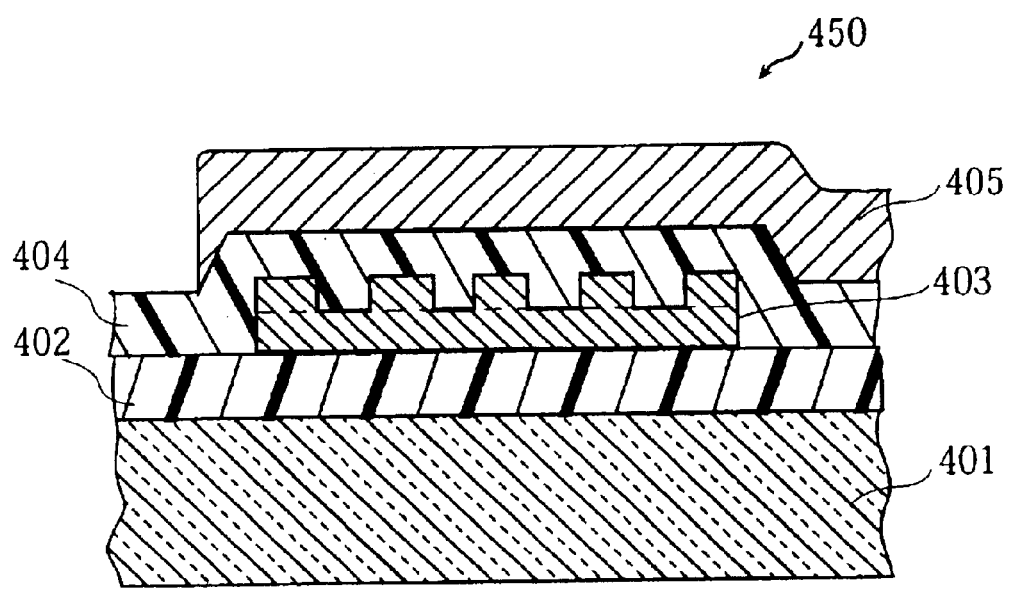
FIG. 28 is a cross sectional view showing a construction of a TFT of another variation in accordance with Examples 3-1 to 3-3.

Further, in the present invention, it is possible to provide a plurality of gaps having a depth such that the gaps do not pierce through the a-Si film as shown in FIG. 28. In addition, such gaps may be formed in discontinuous island-like shapes.

When such gaps not piercing through the a-Si film are provided, the protruding portions that form the gaps may be removed by etching or the like after the step of forming the p-Si film, so as to planarize the surface of the p-Si film.

In addition, for example, a member having a specific heat different from that of the main portion may be provided over the channel region of the a-Si film 413, and the member may have, for example, a rod-like shape. Further, a plurality of regions having different specific heats from each other may be provided for controlling an orientation of crystal growth. For example, if a member having a larger specific heat than that of the a-Si film is placed thereon and an energy beam is applied for a short time, the temperature increase in the portion of the a-Si film in contact with the member is small, and therefore crystal nuclei start to form earlier in the region than in other regions. On the other hand, for example, if a plurality of members having a smaller specific heat than that of the a-Si film are placed over the a-Si film in the direction linking the source region and the drain region and an energy beam is applied for a short time, the relative temperature in the intermediary portions of the plurality of members becomes low, and thereby crystal nuclei first start to form in the intermediary portions, which serves to prevent the disorderly formation of crystal nuclei.

In the present example, although Si or a compound of Si and Ge is given as an example of the material for the p-Si film 403, other materials may be employed. For example, other combinations of group IV elements such as SiC, combinations of a group III element and a group V element such as GaAs, combinations of a group II element and a group VI element such as CdSe are also possible.

In addition, in the foregoing examples of the present invention, it is shown that Al is employed as the material for the gate electrode 405, the source electrode 407s, and the drain electrode 407d. However, other materials such as chromium (Cr), molybdenum (Mo), tantalum (Ta), titanium (Ti), and mixtures thereof may also be employed.

Further, the examples of the present invention employ an excimer layer as the energy beam for crystallizing the a-Si film 413, but other energy beams such as a laser light including Ar laser and YAG laser, ion beams, electron beams, and the like may be employed. By employing such energy beams as well, a high-density energy can be readily applied to targeted spots within a short time and therefore the crystallization can be performed in a state where the substrate temperature is maintained at a relatively low temperature.

EXAMPLE 4-1

Example 4-1 employs a light beam having a distribution pattern such that a light energy intensity within a beam width (a light energy per unit area, hereinafter simply referred to as a light intensity) monotonously increases one side to the other or monotonously decreases from one side to the other, in order to perform crystallization.

Figure 29:
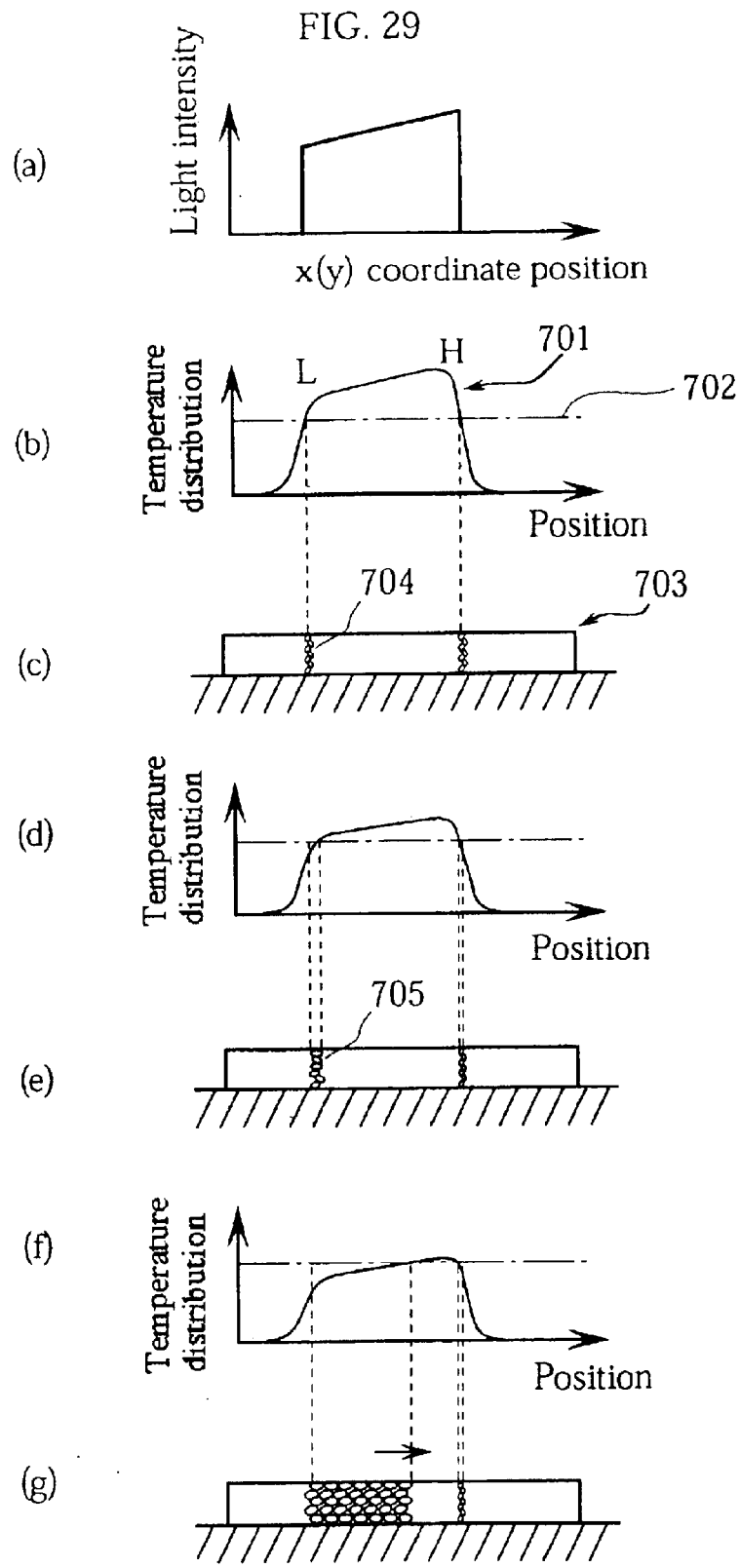
FIGS. 29(a) to 29(g) illustrate progress of crystallization in the case of employing a light beam having a light intensity gradient.

A typical distribution pattern such that a light intensity monotonously increases one side to the other or monotonously decreases from one side to the other is represented by the pattern having a linear light intensity gradient as shown in FIG. 29(a), but the distribution pattern may be such that the light intensity increases or decreases in a constant direction in an exponential function-like manner.

Examples of the light sources for the above-described light beam (not yet shaped) include various lasers such as a He—Ne laser, an argon laser, a carbon dioxide gas laser, a ruby laser, and an excimer laser. The use of an excimer laser is preferred because a high output can be produced and the beam is absorbed well by silicon. Now, a laser annealing method utilizing the excimer laser according to the present invention is described below.

Figure 31:
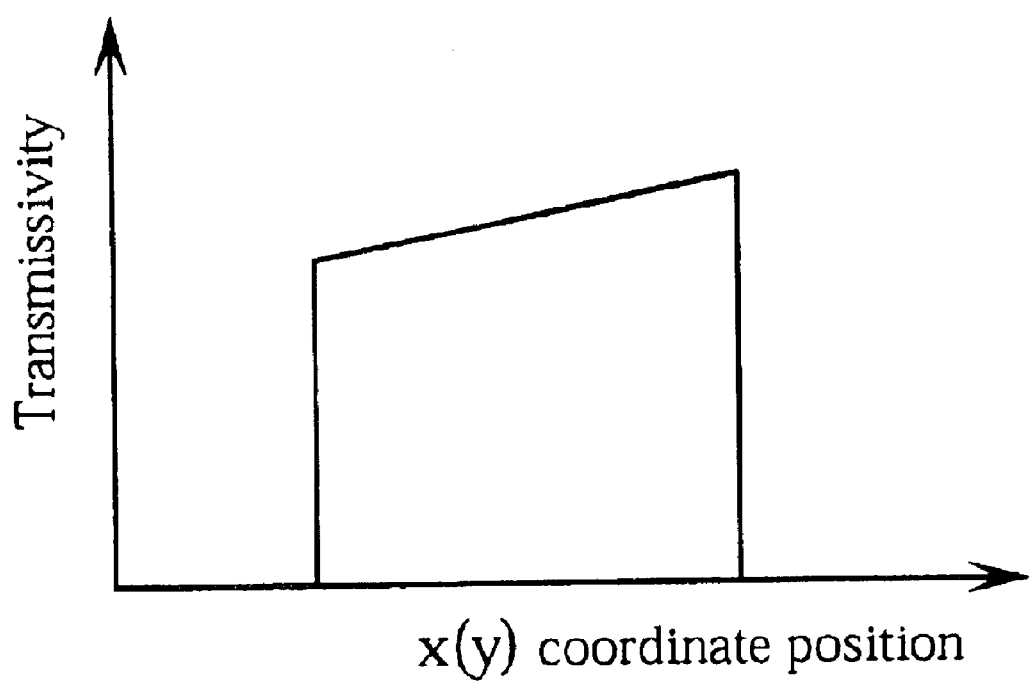
FIG. 31 illustrates a light transmission characteristic of a filter for producing a light beam having a light intensity gradient.
Figure 42:
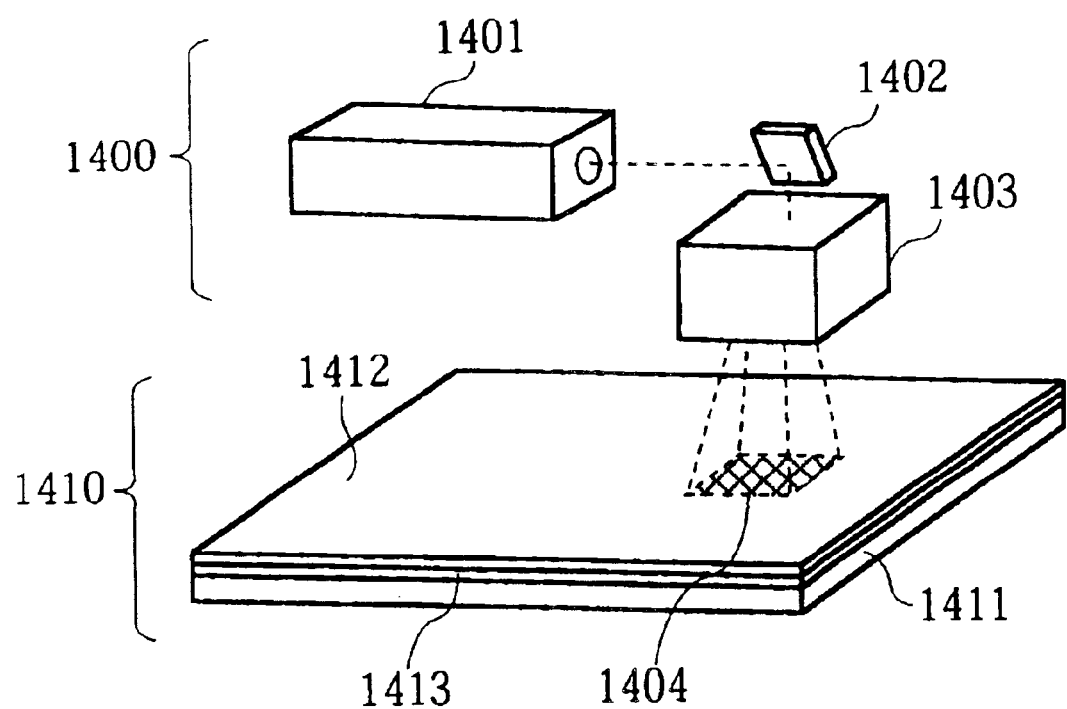
FIG. 42 is a schematic view showing a state in which a crystallization step is being performed with the use of an excimer laser.

FIG. 42 shows a schematic view illustrating the crystallization procedure using the laser annealing method. In FIG. 42, the reference numeral 1400 designates a light beam-applying unit, and the numeral 1410 designates an object to be irradiated with the light beam. The numeral 1401 designates a laser light generator employing a XeCl excimer laser, for example, and the numeral 1402 a mirror, and the numeral 1403 a beam homogenizer. The light beam-applying unit 1400 has such a construction that a light beam generated by the laser beam generator 1401 is guided via the mirror 1402 to the beam homogenizer 1403 in which the light beam is shaped into a predetermined light intensity pattern, and then outputted. The beam homogenizer 1403 has an optical system for shaping light beam, and in the present example, a transmission filter (not shown) having a light transmissivity gradient as shown in FIG. 31 is provided on the most downstream in the light path. Thus, the light beam generated in the laser beam generator 1401 transmits through the transmission filter, whereby the light beam is shaped into a light beam having a pattern as shown in FIG. 29(a).

The above-described light beam-applying unit 1400 is capable of outputting a light beam having an average energy density (irradiation energy per unit area) of 300 mJ/cm$^2$, an energy density in a low energy density region L being 250 mJ/cm$^2$, an energy density in a high energy density region H being 350 mJ/cm$^2$, and a cross-sectional beam shape being 7 mm×7 mm. This light beam is applied to a surface to be crystallized, such as a surface of an amorphous silicon thin film, so as to crystallize the object to be crystallized.

More specific explanation for the process of the crystallization will follow. First, as shown in the object 1410 to be irradiated in FIG. 42, a non-single crystalline silicon film 1412 having a film thickness of 85 nm is deposited on the glass substrate 1411 by using, for example, a reduced pressure CVD method. Specifically, the non-single crystalline silicon film 1412 is formed by using monosilane gas (SiH$_4$) or disilane gas (Si$_2$H$_6$), setting the pressure at several torr, and heating the glass substrate 1411 at 350–530° C.

In the above-described process, an undercoat layer 1413 composed of, for example, SiO$_2$ may be formed on the glass substrate 1411, and a non-single crystalline silicon film 1412 may be deposited over the formed undercoat layer 1413. The method for depositing the non-single crystalline silicon film 1412 is not limited to the reduced pressure CVD method, but for example, a plasma CVD) method may be used. The film thickness of the non-single crystalline silicon film 1412 is not limited to 85 nm but may be appropriately determined.

In the non-single crystalline silicon film 1412 thus formed, a specific region 1404 is irradiated and fused with 10 shots of, for example, the shaped excimer laser beam emitted from the light beam-applying unit light 1400, and then allowed to dissipate heat to crystallize. In the present example, the irradiation with the light beam was carried out in the following manner (see FIG. 43): when the light beam was irradiated, the object 1410 to be irradiated was placed in a sealed container having a window made of quartz and the sealed container was evacuated (about 10$^{-6}$ torr), and the light beam was applied through the window to the specific region 1404 at room temperature (about 23° C.). Note that the sealed container is not shown in FIG. 42.

The above-described conditions are exemplary and not restrictive except that the light beam to be employed has a distribution pattern such that the light intensity within the beam width monotonously increases from one side to the other or monotonously decreases from one side the other. For example, the light energy density may be other than described above, inasmuch as the light beam has the light intensity and light intensity gradient sufficient to crystallize the non-single crystalline silicon film 1412.

In addition, the degree of the light intensity gradient is not particularly restrictive but may be selected in consideration of the quality, thickness and other properties of the non-single crystalline thin film so that the crystallization may be appropriately guided or controlled. Further, the beam width of the light beam to be applied and the number of irradiations (the number of shots) are not limited to the above-described conditions. For example, only one shot of a laser beam having a higher intensity may be applied.

In addition, the cross sectional shape of the light beam is not particularly limited either, but may be, for example, a triangular shape or a circular shape.

Referring now to FIGS. 29(a) to (g), the growth behavior of crystal in the case of employing a light beam having a light intensity gradient is described below.

When a light beam having a light intensity pattern as shown in FIG. 29(a) is applied to the non-single crystalline silicon thin film, the temperature on the irradiated surface shows a pattern such that the temperature gradient slopes upwards in the central region and abruptly changes in the peripheral regions, as indicated by the numeral 701 (temperature distribution curve) in FIG. 29(b). The abrupt temperature gradients are formed in the peripheral regions because the heat dissipated towards the outer periphery is large. Thereafter, when the light irradiation is stopped, the temperature of the region in the vicinity of the crossing of the temperature distribution curve 701 and the crystallization temperature line 702 (in the vicinity of the boundaries) first decreases below the melting point. Thereby, microcrystals 704 are formed in the vicinity of the region (the numeral 703 designates a cross sectional surface of the thin film).

Then, utilizing the crystals 704 as nuclei, crystal growth proceeds in the rightward direction in the drawing where the temperature is still above the crystallization temperature. Unlike the case of the foregoing FIGS. 7(a) to 7(g), in this case of FIG. 29(b), a temperature gradient is formed in the central region, and therefore, heat flows from the high temperature region (side H) into the low temperature region (side L), which heat serves to alleviate an abrupt temperature drop and to guide the crystal growth towards the high temperature region (the right side in the drawing). Accordingly, the formation and growth of crystal nuclei proceed smoothly, and as a result, uniformity in crystal grain sizes and crystallinity is increased, and crystal grains longitudinally extending from the L side towards the H side (in the orientation of crystal growth) are formed. In brief, when a light beam having a light intensity gradient is employed, it is made possible to produce a crystalline thin film having a high mobility in the orientation of crystal growth.

Figure 30:
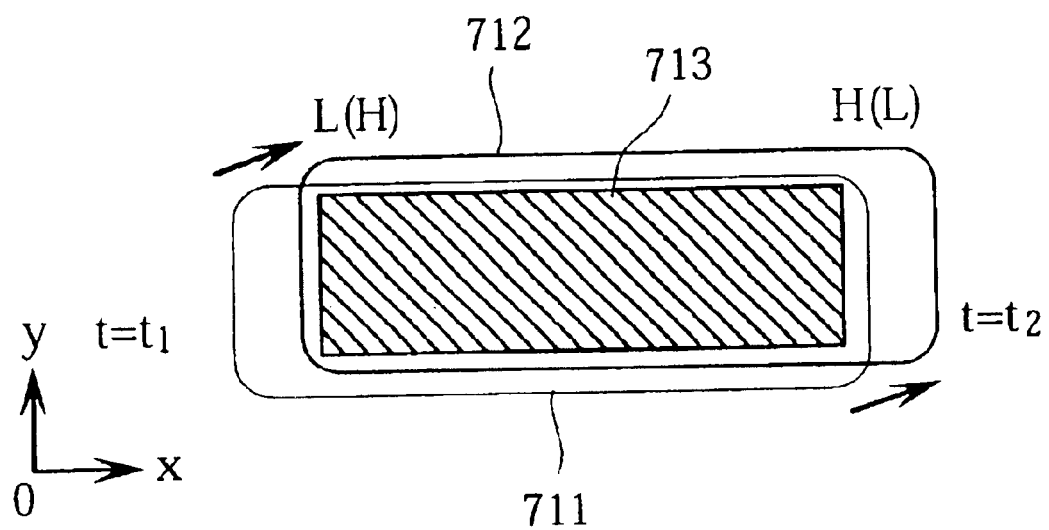
FIG. 30 is a schematic view illustrating a state of moving and applying a light beam having a light intensity gradient.

It is to be noted that when applying the light beam, the light applying unit and the substrate may be in a fixed state (stationary state), or either the light applying unit and the substrate may be moved or reciprocated. In the case of the light applying unit and the substrate being moved or reciprocated, it is preferable that the movement be made in the direction of the light intensity gradient (in the direction of from L to H or from H to L) as shown in FIG. 30. When moved or reciprocated in this direction, it is possible to finely control the orientation of crystal growth and increase the uniformity of the size of crystal grains and crystallinity. Furthermore, if the speed of moving is adjusted according to the degree of the light intensity gradient and the light irradiation intensity, the orientation of crystal growth can be further finely controlled.

It is noted that the arrows in FIG. 30 indicate the directions of the movement, the numerals 711 and 712 respectively indicate the regions to be irradiated before and after the movement, and the numeral 713 designates the repeatedly irradiated region (shaded area).

FIG. 30 illustrates an example in which the light beam is moved, but the substrate may be moved instead of the light beam. In addition, in the case where a plurality of shots of light beam are applied, the irradiation may be performed with the irradiation position being shifting or staggering by several percent to several tens percent of the irradiation area.

The poly-Si thin film produced in the manner described above is generally used for producing a TFT, with the central region being used as a channel region, and a source region and a drain region formed by implanting impurity ions such as phosphorus ions and boron ions into both side regions of the channel region. It is to be noted that the light beam having the energy intensity pattern (FIG. 29(a)) described in the present example is effective in the crystallization of a relatively narrow region where a peripheral circuit for AM-LCD (active matrix liquid crystal display) and the like is to be formed.

EXAMPLE 4-2

Example 4-2 (as well as Example 4-3 to be described later) is effective in the crystallization of a relatively wide area.

Figure 32:
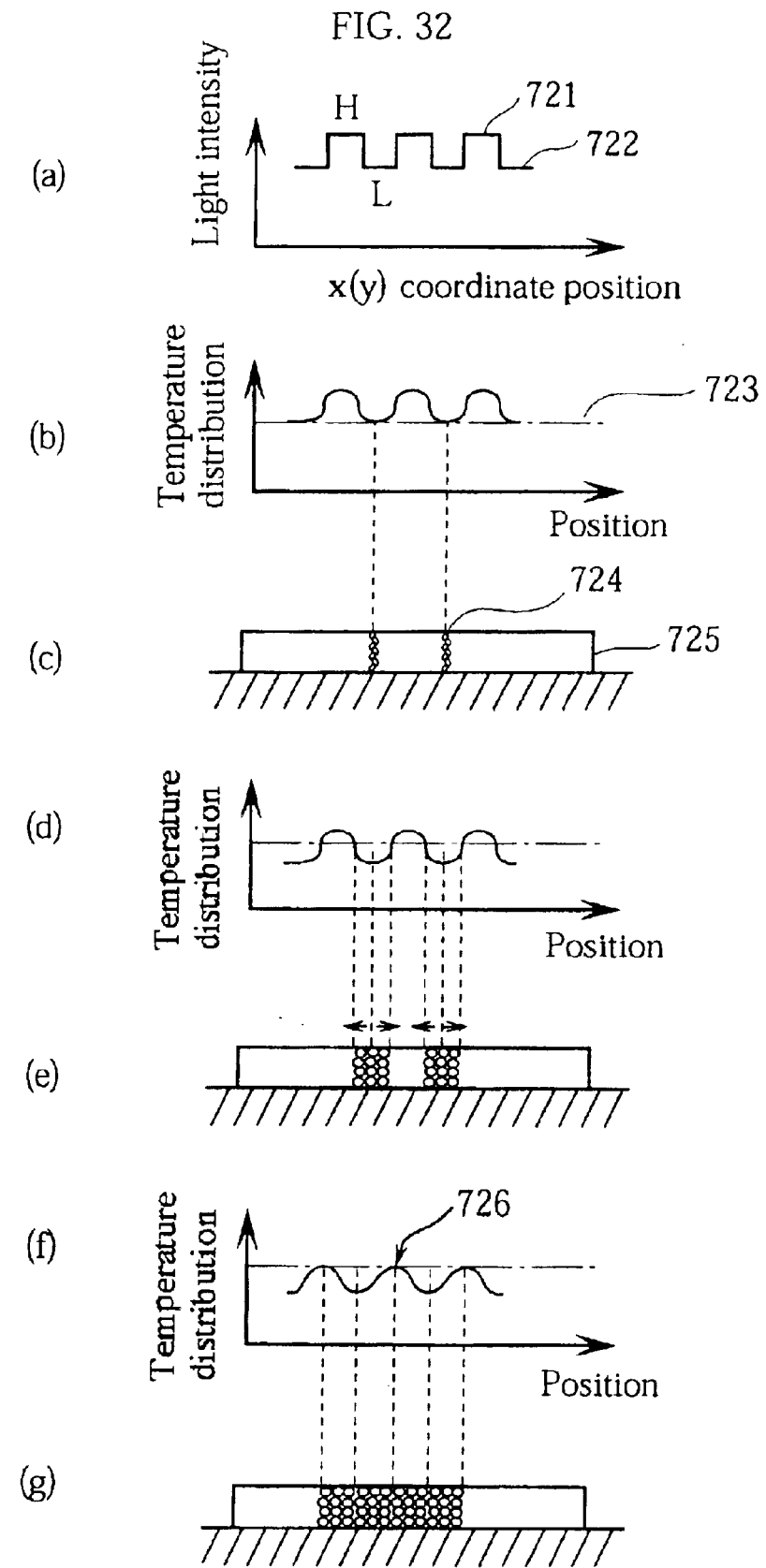
FIGS. 32(a) to 32(g) illustrate progress of crystallization in the case of employing a light beam in which a region having a relatively strong light intensity and a region having a relatively weak light intensity are alternatively arrayed with respect to a plane.

A light intensity distribution pattern of a light beam employed in this example is shown in FIG. 32(a). As shown in FIG. 32(a), the light beam according to Example 4-2 has a pattern such that a region H 721 having a high light intensity and a region L 722 having a low light intensity are alternately disposed on a plane. The ratio of the light intensities of the region H and the region L is not particularly limited, but may be appropriately determined. Generally, the total amount of the light energy is determined so that the entire surface to be irradiated (both regions L and H) is fused within a prescribed number of shots of the irradiation. In the present example, the light intensity for the region H was 300 $mJ/cm^2$, the light intensity for the region L was 200 $mJ/cm^2$ and the thickness of the amorphous silicon thin film was 50 nm. Other conditions were the same as in the foregoing Example 4-1.

With reference to FIGS. 32(a) to 32(g), the crystallization behavior in the present example is detailed below. First, when a light beam having a light distribution characteristic shown in FIG. 32(a) is applied, the temperature on the surface of the thin film shows a distribution pattern as shown in FIG. 32(b). In the process during which the temperature of the irradiated surface decreases after the light irradiation is completed, crystal nuclei 724 are formed in the position corresponding to the region L 722 at the time when the temperature of the region L 722 approaches to the crystallization temperature line 723, as shown in FIG. 32(c) (the numeral 725 shows a cross sectional surface of the thin film). As the temperature further decreases (FIG. 32(d)), the crystal growth is guided towards the high temperature regions H by the heat conducted from the high temperature regions H to the low temperature regions L, and simultaneously, additional crystal nuclei are formed and grown in the same manner (FIG. 32(e)).

Such formation and growth of crystals continue until the temperature of the high temperature region H decreases below the melting point (FIGS. 32(f) and 32(g)), and in the present example, the orientation of crystal growth is guided in a direction from L towards H. Therefore, crystal grains grow from each low temperature region L between the high temperature regions H, and as a result, the crystal grains collide with each other in the vicinity of the central region 726 in each high temperature region H (FIG. 32(g)). Thereby, a grain boundary is formed in the vicinity of the central region in each high temperature region H, and consequently the further crystal growth is guided in a direction parallel to the direction from L towards H. Accordingly, crystals are somewhat grown in the direction perpendicular to the direction from L towards H, and as a result, crystal grains longitudinally extending in the direction perpendicular to the direction from L towards H are formed.

Thus, according to the present example, it is made possible by the above-described mechanism to smoothly perform crystallization of a relatively wide region to be irradiated, for example, of a several centimeter square region. Further, as has already been explained, when the light irradiation is performed by setting the light beam so that the direction from L towards H results in a direction perpendicular to the direction of the movement of carriers (a source-drain direction), carriers can move without crossing grain boundaries, hence achieving high speed TFTs.

Figure 33:
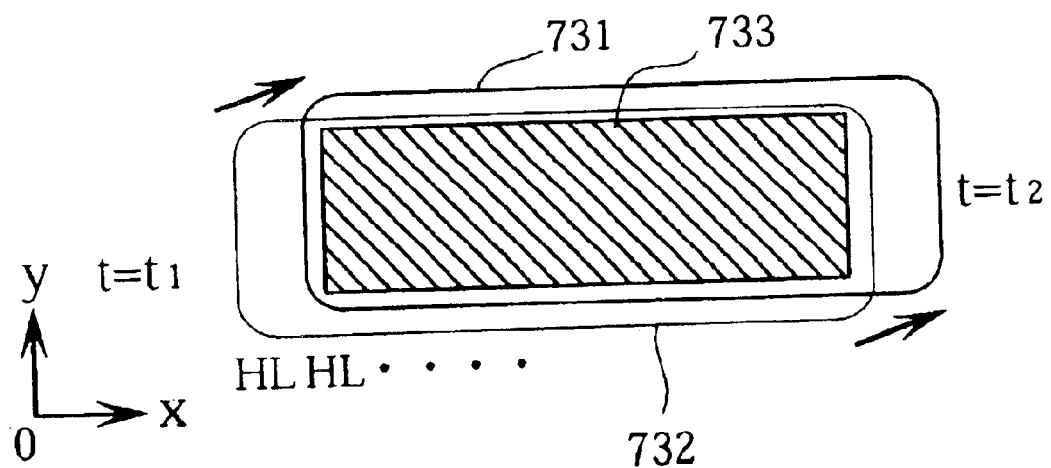
FIG. 33 is a schematic view illustrating a state of moving and applying a light beam having a distribution pattern shown in FIG. 32(a).

In the present example as well as in the foregoing Example 4-1, the light irradiation may be performed by moving (or reciprocating) either the light beam or the substrate within the irradiation time (from t=t1 to t=t2) as shown in FIG. 33. Thereby, the uniformity of crystallinity can be further increased. It is noted that in FIG. 33, the numerals 731 and 732 respectively designate the positions of the regions to be irradiated before and after the movement, the numeral 733 (shaded part) designates the repeatedly irradiated region, and the arrows indicate the directions of the movement. The movement is, of course, not limited to such a movement.

Figure 34:
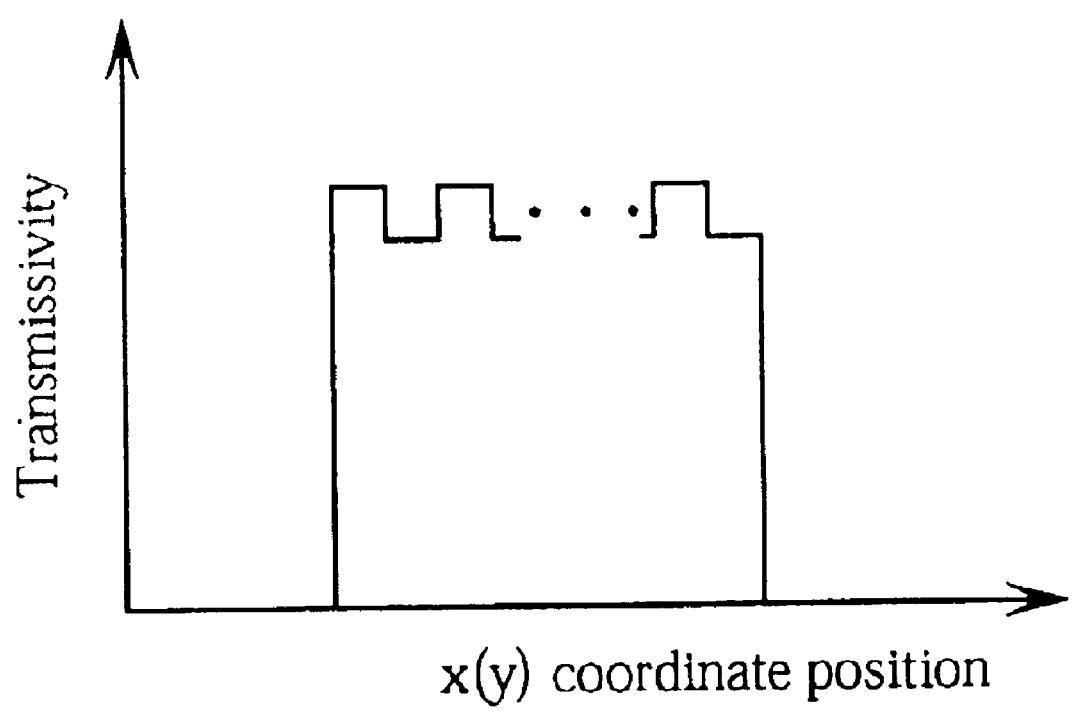
FIG. 34 shows a light transmission characteristic of a filter for producing the light beam as shown in FIGS. 32(a) to 32(g).

It is also noted that such a light beam as shown in FIG. 32(a) in which a portion having a strong light intensity H and a portion having a weak intensity L are arranged in a fringe pattern can be readily realized by known techniques without requiring a special technique, and no restriction is placed on means for realizing such a light beam. One of the example of realizing such a light beam is as follows: pieces of filters that absorb the light to be applied to a certain degree are arranged at specific intervals so as to form a comb-like shaped transmission filter having a transmission distribution as shown in FIG. 34, and the filter is placed in a light path of the light beam-applying unit (for example, in the beam homogenizer). Another example is a means such that a filter composed of metallic fibers being arranged in parallel to each other in a longitudinal or latitudinal direction is disposed in the light path. Further another example is a means in which diffraction interference is caused by providing slits in the light path to produce a stripe-like shaped light intensity pattern.

EXAMPLE 4-3

Example 4-3 pertains to a method of imparting non-uniformity to the light intensity distribution by utilizing light interference. This method, as well as Example 4-2, can control the light intensity distribution pattern relatively at will and therefore is suitable for crystallization of a relatively wide area.

Figure 35:
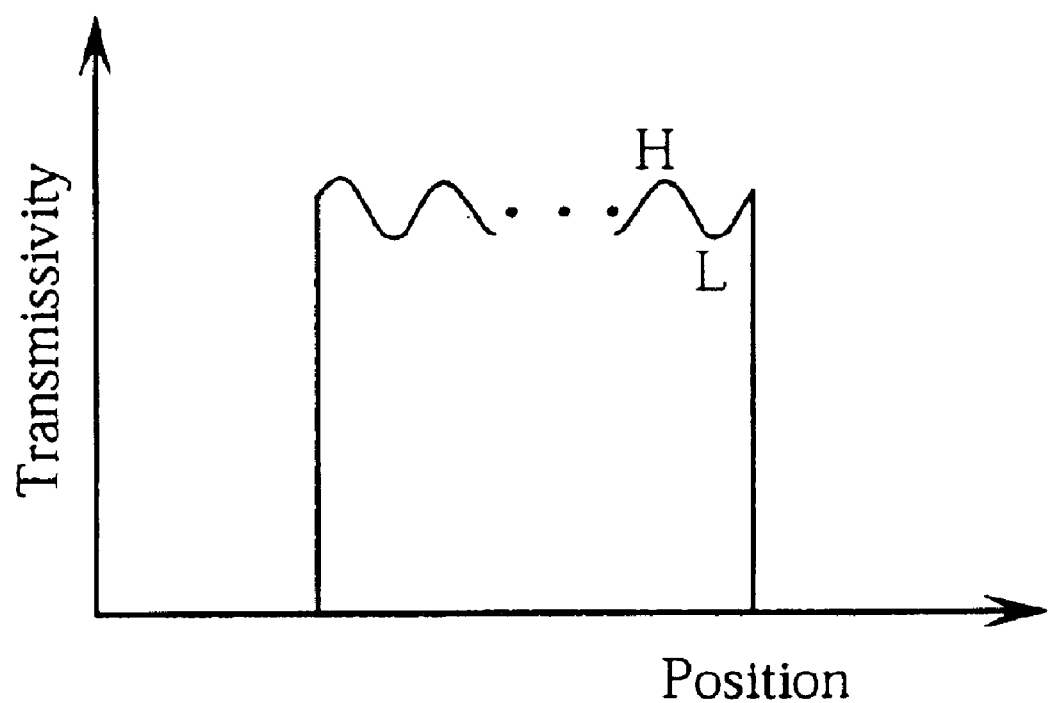
FIG. 35 shows a distribution pattern of light intensity of another example of the light beam in which a region having a relatively strong light intensity and a region having a relatively weak light intensity are alternatively arrayed with respect to a plane.
Figure 36:
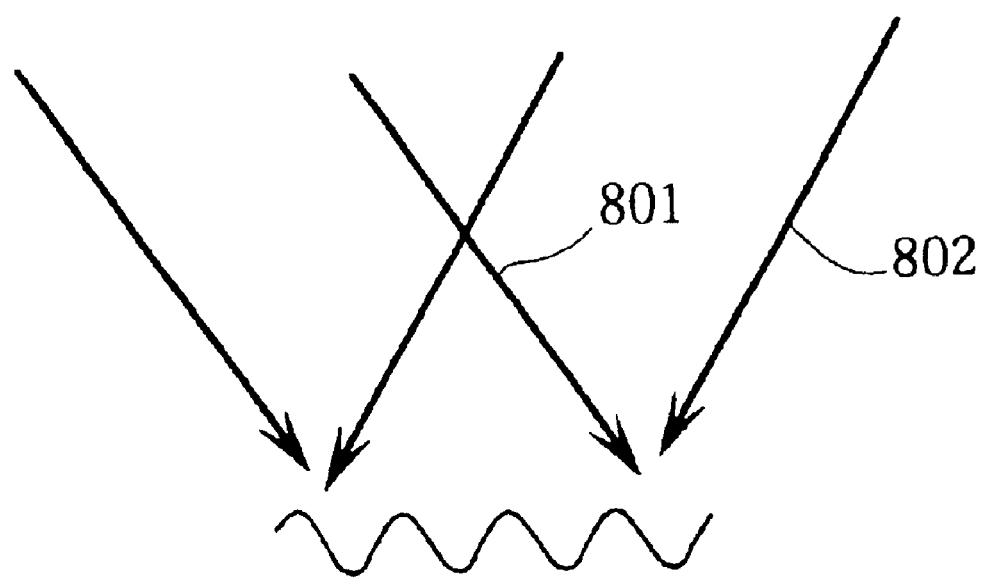
FIG. 36 is a schematic view illustrating the principle of producing the distribution pattern of light intensity shown in FIG. 35 by light interference.

A light intensity distribution pattern of a light beam employed in this example is shown in FIG. 35. Such a light intensity distribution pattern can be readily formed by a means in which light interference is caused by simultaneously applying two coherent light beams 801 and 802 as shown in FIG. 36. Specifically, for example, a laser beam produced from a light ray is divided into two light paths by a semitransparent mirror, and a relative angle is formed by the light paths with the use of a reflector, in order to cause interference.

In this connection, when two coherent lights are made to interfere with each other, parts having a high light intensity (bright line parts H) and parts having a low light intensity (dark line parts L) are formed. The cycle of the interference pattern can be freely changed by adjusting the angle formed at the crossing of the two light beams, and the degree of modulation (that has an influence on the ratio of the light energy intensity of the bright line part to that of the dark line part) can be changed easily by varying the energy intensities of the two light beams. Therefore, the interval and the intensity ratio of the bright line parts H and the dark line parts L can be set relatively freely. Thus, the interval and intensity ratio are suitably set in consideration of the thickness and the like of the non-crystalline thin film, whose surface is to be irradiated.

With reference to FIGS. 37(a) to 37(g), the crystal growth behavior in the case of employing the light beam having such an interference pattern is now detailed below. It is noted that the conditions of the operation in the present example are the same as those in Example 4-1.

Figure 37:
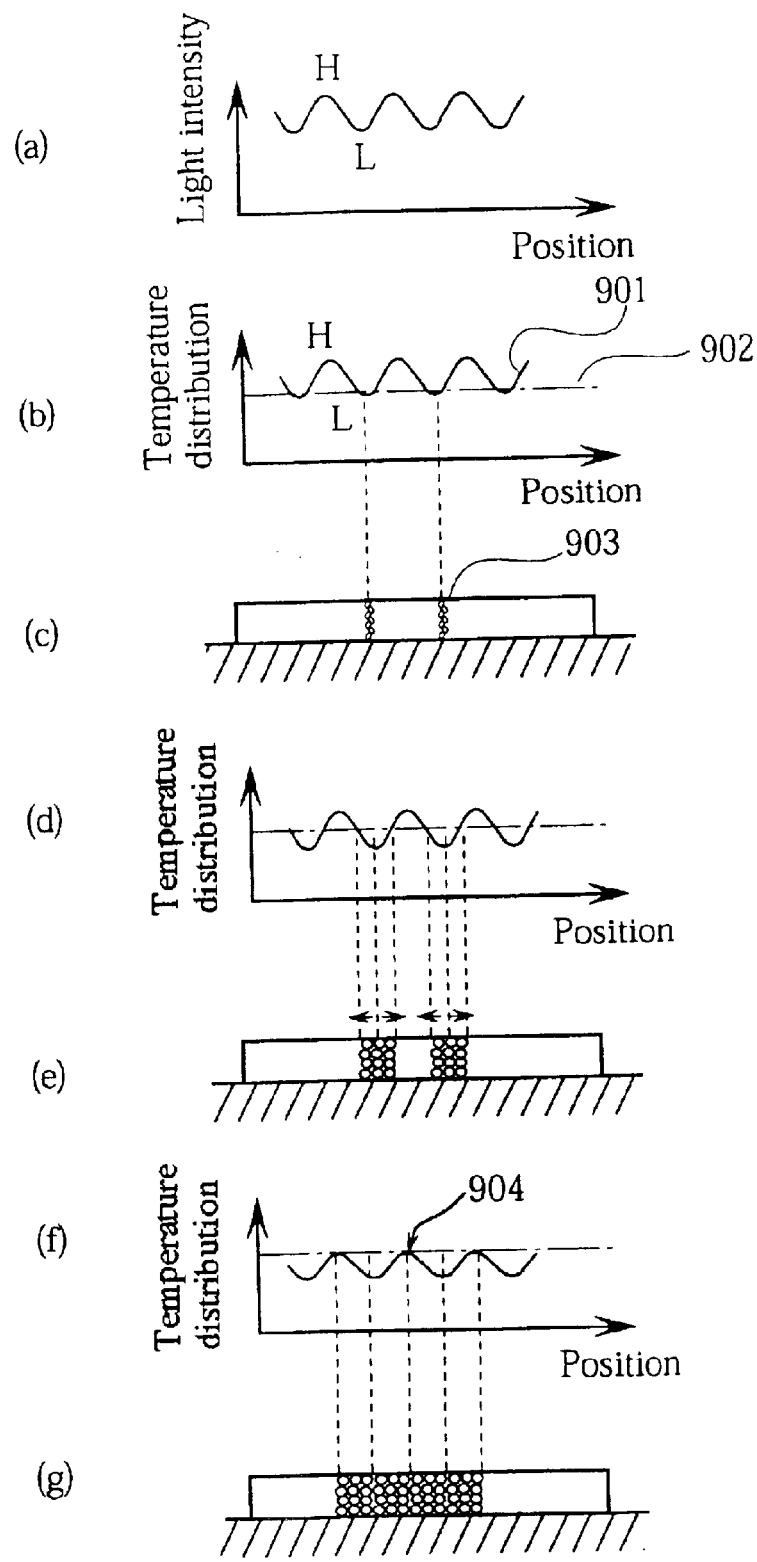
FIGS. 37(a) to 37(g) illustrate progress of crystallization in the case of employing the light beam of FIG. 35.

When the light beam characterized by FIG. 37(a) is applied to the non-single crystal silicon thin film, a temperature distribution pattern (curve 901) in which the temperature is high in the bright line part H and low in the dark line part L is formed on the thin film (FIG. 37(b)). In the process during which the temperature decreases after the light irradiation is completed, crystal nuclei 903 are formed in the regions where the curve 901 first crosses the crystallization temperature line 902 (where the temperature is the lowest in the low temperature region L). As the temperature further decreases (FIG. 37(d)), the crystal growth is guided in a direction from L towards H by the heat conducted from the high temperature region H to the low temperature region L, and simultaneously, additional crystal nuclei are formed grown in the same manner (FIG. 37(e)). The formation and growth of crystals continue until the temperature in the high temperature region H, which corresponds to the bright line part H, decreases below the melting point (FIGS. 37(f) and (g)).

Thus, according to Example 4-3, it is made possible by the above-described mechanism to produce a crystalline semiconductor thin film having a uniform crystallinity and high field effect mobility in a relatively wide area. Furthermore, in the present example as well as in the foregoing Example 4-2, a grain boundary (the line at which crystal grains collide with each other) is formed in the central region of the high temperature region, and therefore, as described in the foregoing Example 4-2, a high field effect mobility can be obtained by employing as the direction of carrier movement a direction perpendicular to the direction of the array of H→L→H→L.

EXAMPLE 4-4

Example 4-4 is basically similar to the foregoing Example 4-3 In the present example, however, the cycle of interference pattern and the degree of modulation are dynamically adjusted so that the bright line parts H and the dark line parts L change in a wave-motion-like manner. Now the detail of Example 4-4 is given below.

Figure 38:
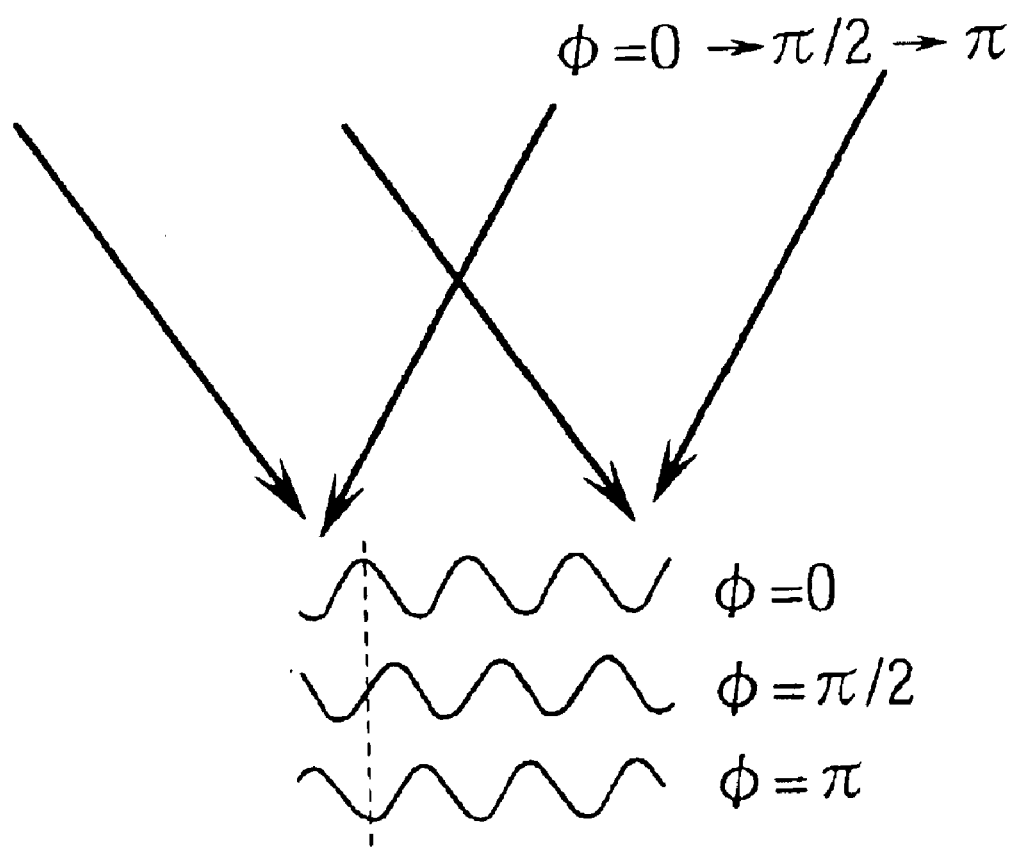
FIG. 38 is a schematic view illustrating a method of producing a light beam by a dynamic interference pattern in which bright-line parts and dark-line parts propagate.

As shown in FIG. 38, at least one of the two coherent light beams is subjected to a dynamic phase modulation to form a light beam in which the positions of the bright line parts and the dark line parts in the interference pattern change in a wave-motion-like manner. The phase modulation is performed so that, for example, the phase of one of the light beams is sequentially changed to be 0, π/2, π . . . relative to the other light beam. This chronologically shifts the positions of the bright line part and the dark line part in the interference pattern, and thus forms a light beam in which a striped pattern of the bright line parts and the dark line parts changes in a wave-motion-like manner (FIG. 38).

Examples of the means for the phase modulation include a method such that, by using a mirror, the light path length of one of the two light beams is dynamically changed to cause the phase modulation, and a method such that the reflectivity of a transparent material disposed in the light path is dynamically changed. Such optical systems are incorporated in the foregoing beam homogenizer (the reference numeral 1403 in FIG. 42), for example.

The present example is very effective in guiding the crystal growth in a specific direction since the temperature distribution pattern on the surface of the thin film to be irradiated becomes such that the high temperature region H and the low temperature region L replace each other in a wave-motion-like manner. Moreover, the method has an additional advantageous effect that impurities are expelled from the effective region, and thereby can increase the purity of the thin film, achieving a high quality crystalline thin film. Such an effect of expelling impurities from the effective area is based on the following principle. The thin film component and the impurities have different physical properties such as melting points and specific gravities, and the wave-motion-like temperature variation causes a difference in proceeding velocity between the two. Therefore, by repeating the irradiation a number of times, the impurities present in very small amounts are separated from the thin film component.

It is noted here that the cycle of the interference pattern and the degree of modulation may be adjusted during one shot of the irradiation or each time of a number of shots of the irradiation. In addition, the degree of modulation may be controlled depending upon each of the stages in the crystal growth. By employing these, the crystal growth can be more suitably guided.

In both of Example 4-3 and 4-4, the irradiation may be performed while either the laser light or the substrate is being moved (or reciprocated) to more appropriately control the crystal growth, as in the foregoing Example 4-1 or 4-2. When the movement is directed in a the direction parallel to the direction of the fringe pattern made of the bright line parts H and the dark line parts L, the effect of expelling impurities can be obtained by the foregoing Example 4-3 as well.

Figure 39:
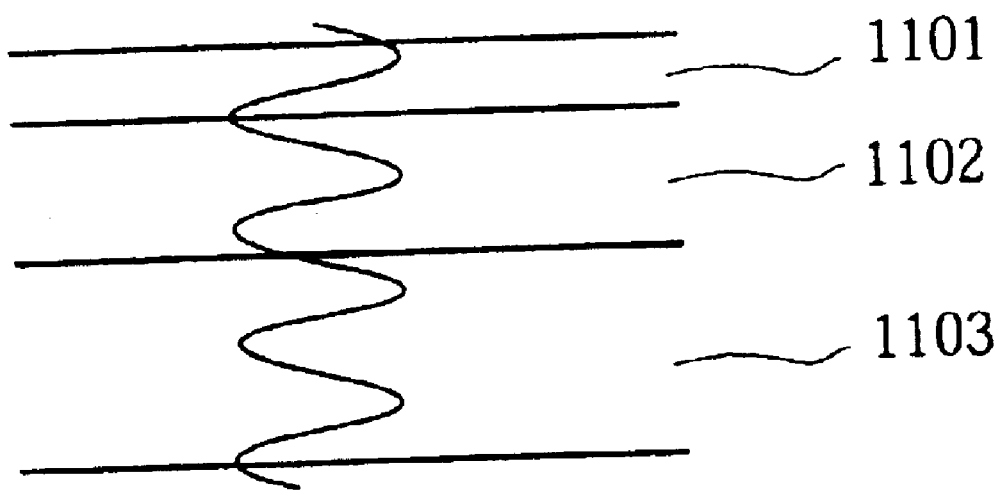
FIG. 39 is a schematic view showing a state of a light interference pattern formed in a thickness direction of the thin film.

In the above-described example, the temperature distribution is made in the surface direction of the irradiated region, but it is also possible to form the light intensity distribution in the thickness direction of the thin film to be irradiated, as shown in FIG. 39. FIG. 39 schematically shows an object to be irradiated being irradiated with a light beam, the object in which a thin film of an amorphous silicon layer 1101, an undercoat layer 1102 ($SiO_2$), and a glass substrate 1103 are layered in order of the direction of the irradiation (from above in the drawing). When a light beam having a light intensity distribution along the vertical direction (thickness direction) enters the object to be irradiated, a temperature distribution corresponding to the waveform is formed in the thickness direction. However, silicon thin films used for TFTs generally have a thickness as small as several tens of nanometers, which is smaller than the periodic cycle of the interference pattern, and therefore, it is difficult to form a periodic temperature distribution in the thickness direction.

Yet, the upper surface of the thin film 1101 is cooled by heat radiation to the surrounding environment, and the lower surface (the substrate side) is also cooled by heat conduction to the undercoat layer 1102 and the glass substrate 1103. This indicates that a temperature distribution is also present in the thickness direction, and it is possible to enhance this temperature distribution. In order to enhance the temperature distribution in the thickness direction, the above-described interference pattern can be utilized. Specifically, for example, the interference can be caused by a reflector provided on the lower surface of the glass substrate 1103. Or alternatively, the reflectivity difference between the thin film 1101 and the undercoat layer 1102 or between the thin film 1101 and the glass substrate 1103 is increased to cause the interference between the light incoming from the direction of the thin film and the light reflected at the interface of each layer. In addition, by adjusting the periodic cycle of the interference pattern, the temperature distribution can be formed in the thickness direction, and thereby the crystal growth in the thickness direction can be controlled.

In the case of controlling the temperature distribution in the thickness direction, it is desirable to specifically determine suitable conditions for each case taking into consideration the thickness of the non-single crystalline thin film and the thermal conductivities of the undercoat layer and the substrate. As another variation, it is possible that a light emitted from a single light source is divided into two lights, and one is applied from the direction of the surface thin film (from above) whilst the other is applied from the direction of the substrate (from below), whereby the interference is caused inside the thin film. Note that in this case, the substrate and the undercoat layer must be composed of a material capable of transmitting the light beam.

EXAMPLE 4-5

The present example is characterized in that, by suitably setting the pressure of the ambient gas in the process of crystallization, a temperature gradient is formed on a surface to be crystallized. In the preceding Examples 4-1 to 4-4, by contrast, the light intensity pattern of the light beam is adjusted or controlled, and thereby crystallinity and uniformity of crystals are improved. Accordingly, the approach of the present example is completely different from those in the Examples 4-1 to 4-4. The present example will now be detailed below.

Figure 40:
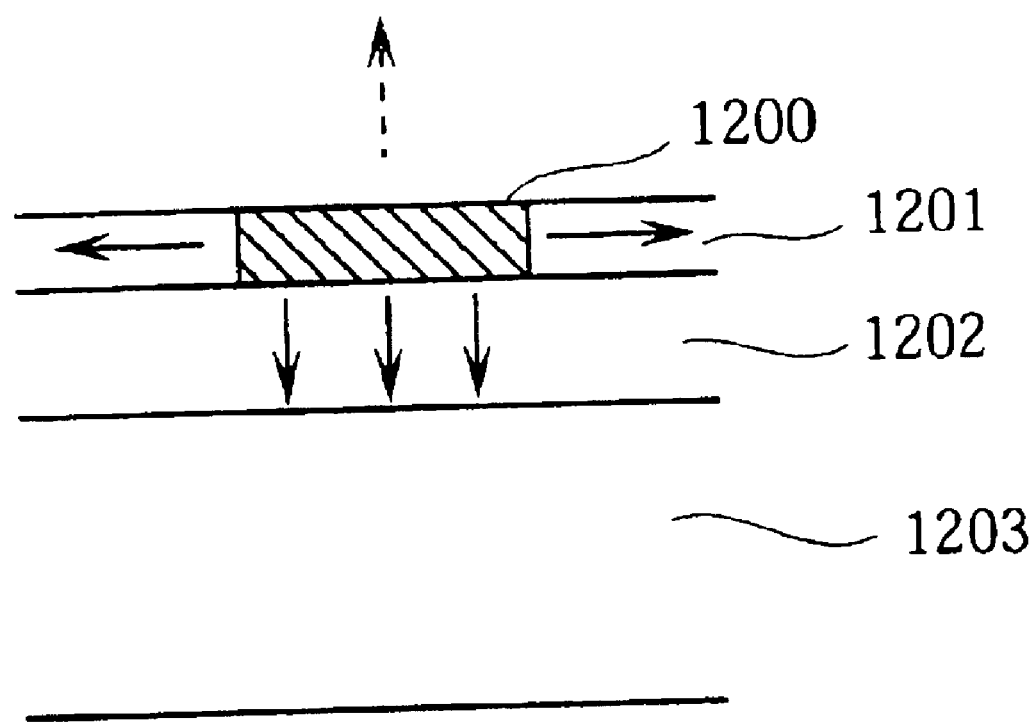
FIG. 40 is a schematic view showing a state of heat flowing outwardly from the thin film heated by light irradiation.

FIG. 40 shows a cross sectional view of the object to be irradiated (layered material) as shown in FIG. 39. In FIG. 40, the reference numeral 1200 designates the surface to be irradiated with the light beam, the numeral 1201 a thin film, the numeral 1202 an undercoat layer, and the numeral 1203 a substrate. The arrows indicate the directions of heat conduction (directions of heat radiation). As shown in FIG. 40, although part of the heat diffuses in the ambient atmosphere (in the upward direction) and in the outward directions from the irradiated region in the thin film (in the rightward and leftward directions in the figure), most of the heat is conducted towards the substrate (in the downward direction), where the contact area is large and the thermal conductivity is high. In this connection, prior art laser annealing methods are performed in highly evacuated atmosphere, and employs a light beam having a uniform distribution of light intensity. Therefore, as described in the foregoing Example 4-1, a temperature gradient is difficult to be formed in the central region of the irradiated surface, and hence crystal nuclei are difficult to be formed at the early stage of cooling. In addition, a large number of crystal nuclei start to be formed simultaneously at a certain stage of the process of cooling, which is undesirable.

Unlike such prior art methods, the present example is characterized in the ambient atmosphere is not evacuated to a high degree, and that by utilizing motion of the molecules of the gas constituting the ambient atmosphere, a region not uniform in temperature is produced in the surface irradiated with a light.

First, the principle of this Example 4-5 will be discussed. The time of one shot (one pulse) of such a pulsed light as an excimer laser is generally as short as 20 to 50 nanoseconds. Therefore, it is necessary that within such a short irradiation time, silicon or the like be heated above the melting point, and this requires that silicon or the like should generally be an extremely thin film with a thickness as thin as several tens of nanometers. Such extremely thin films tend to be greatly influenced by the ambient gas molecules in the process of cooling.

The gas molecules present in the thin film and the gas molecules constituting the ambient atmosphere are performing such a motion that the molecules collide with and depart from the surface of the thin film with a certain probability. The level of the thermal energy of the gas molecules is lower than that of the irradiated and heated thin film, and therefore when the molecules collide with and depart from the surface of the thin film, they take away the heat of the thin film.

From such an effect of the gas molecules, it is considered that a perturbation-like temperature distribution must be formed on the thin film. If, therefore, the pressure of the ambient atmosphere and the type of gas molecules constituting the ambient atmosphere are selected appropriately, a region not uniform in temperature (a low temperature region) can be formed in the irradiated region, even in the case where the region is irradiated with a light beam having a uniform light intensity distribution. It is considered that if such a region can be formed, the formation of crystal nuclei and smooth crystal growth can be realized. On the basis of this consideration, the following experiments were performed.

It is to be noted that in this connection, the crystal nuclei in the process of crystallization play a role analogous to that by water vapor nuclei when moisture in the atmosphere forms dropwise condensation.

EXPERIMENT 1

Preparation

Figure 43:
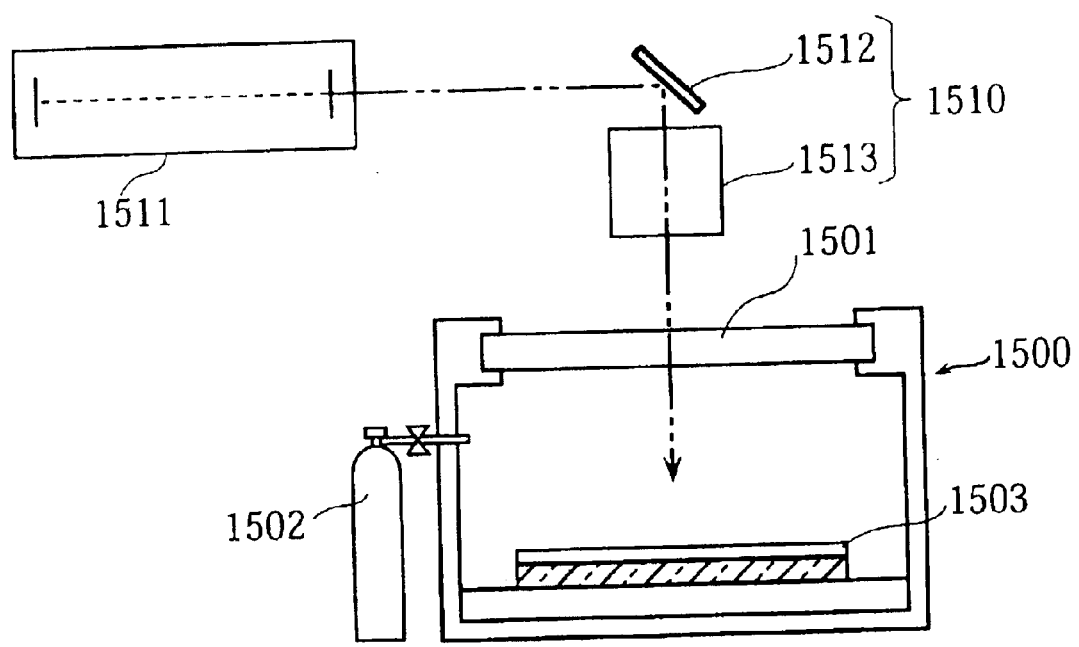
FIG. 43 illustrates an apparatus for the experiment for studying the relationships between ambient pressures and degrees of crystallinity in laser annealing.

First, an $SiO_2$ layer (undercoat layer) having a thickness of 200 nm was formed on a substrate (thickness being 1.1 mm) of Corning #7059 glass. Then, an amorphous silicon thin layer having a thickness of 50 nm was formed over the undercoat layer. Thus an object to be irradiated was prepared. The object to be irradiated provided with the amorphous silicon thin layer 1503 was then placed in a sealed container 1500 having a window 1501 made of quartz glass, as shown in FIG. 43. The air in the sealed container 1500 was evacuated and then hydrogen gas was introduced from a hydrogen gas cylinder 1502 to bring the pressure of hydrogen gas in the sealed container up to predetermined levels. Then, an excimer laser generated by a laser irradiation unit 1510 was applied to the amorphous silicon layer 1503 of the object to be irradiated through the window 1501. Thereafter, the object was cooled for crystallization.

The following pressures were employed as the predetermined pressure (ambient pressure) of the hydrogen gas: $5 \times 10^{-6}$ torr, $1 \times 10^{-5}$ torr, $1 \times 10^{-2}$ torr, $1 \times 10^{-1}$ torr, 1 torr, and 10 torr. The conditions of the laser irradiation were as follows: the employed light beam was a conventional light beam having a uniform light intensity distribution, 1 pulse (1 shot) of the light beam was 30 n.sec., the beam width was 7 mm×7 mm, and the light intensity was 350 $mJ/cm^2$. This light beam was applied 100 pulses. Then, the object to be irradiated was allowed to cool in the environment at room temperature to polycrystallize the amorphous silicon layer 1503.

It is noted that in FIG. 43, the numeral 1511 designates an excimer laser generator, the numeral 1512 a mirror and the numeral 1513 a beam homogenizer.

Relationship between Ambient Pressure and Crystallinity

Six samples of the crystalline silicon thin film (poly-Si) prepared under the above-described conditions were evaluated by visual observation using an oblique ray. In addition, the Raman intensity was measured by micro-Raman spectroscopy, and crystallinities of those six samples were evaluated assuming the Raman intensity in the case of a hydrogen gas pressure being $5 \times 10^{-6}$ torr as 1. The results are shown in Table 1 below.

TABLE 1

| Ambient pressure* | $10^{-6}$ | $10^{-5}$ | $10^{-2}$ | $10^{-1}$ | 1 | 10 |
|---|---|---|---|---|---|---|
| Visual observation result | Slight scattering Bluish | Noticeable scattering Greenish | Very strong scattering Pure white | Considerable scattering Whitish | Considerable scattering Whitish | Considerable scattering Whitish |
| Raman intensity (relative value) | 1 | 4 | 7 | 6 | 6 | 6 |

*torr

As shown in Table 1, visual observation confirmed that the state of the silicon thin film after the laser annealing changes corresponding to the ambient pressure in manufacturing. Specifically, when the hydrogen gas pressure (ambient pressure) was in the order of $10^{-6}$ torr, a slight bluish scattered light was observed, whereas when the pressure was increased to the order of $10^{-5}$ torr, the scattered light was shifted towards the green side and the entire region was rendered brighter. When the hydrogen gas pressure was further increased to the order of $10^{-1}$, the scattering became strong, with a whitish opaque state, and almost the same state was observed up to the order to about 10 torr.

In the evaluation of crystallinity by micro-Raman spectroscopy, the 115 sample crystallized under a hydrogen gas pressure of $1 \times 10^{-5}$ torr exhibited four times as high the Raman intensity as that of the sample prepared under a pressure of $5 \times 10^{-6}$ torr. The samples crystallized under a pressure of $1 \times 10^{-5}$ torr to 10 torr exhibited 6 to 7 times as high. These results confirm the following.

Conventionally, it has been a usual practice that the light irradiation is performed with the ambient pressure reduced as low as possible (to a highly evacuated state), except for special cases such as where the molecules in the ambient atmosphere are to be reacted with the thin film. However, as evident from Table 1, a high degree of crystallinity cannot be obtained under such a highly evacuated state. By contrast, the crystallinity improves as the hydrogen gas pressure increases. The results of the experiment show that for crystallization by a laser annealing treatment, it is desirable that the ambient atmosphere pressure be higher than a certain value, preferably $1 \times 10^{-2}$ torr or higher.

It is considered that the reason why a high degree of crystallinity can not be obtained under a highly evacuated state is that a perturbation-like unevenness in temperature cannot be formed by the motion of the gas molecules. By contrast, it is considered that the improvement of crystallinity in the case where the pressure of hydrogen gas exists is because when the hydrogen molecules collide with and depart form the surface of the thin film, the molecules remove the heat from the thin film, forming a local and perturbation-like unevenness in temperature. In short, the results shown in Table 1 prove the above discussion.

EXPERIMENT 2

Samples of crystalline silicon thin film (poly-Si) were prepared in the same manner as in Experiment 1 except that hydrogen gas pressures employed as ambient atmosphere pressures were $5 \times 10^{-6}$ torr and 1 torr, and that the light beam was applied 1, 10, 100, and 500 times under the respective hydrogen gas pressures. Then, in the same manner as described in Experiment 2, the Raman intensities were measured, and the effects of hydrogen gas pressures were evaluated on the basis of the relationship between the number of irradiations and the crystallinity. The results are shown in FIG. 41.

Figure 41:
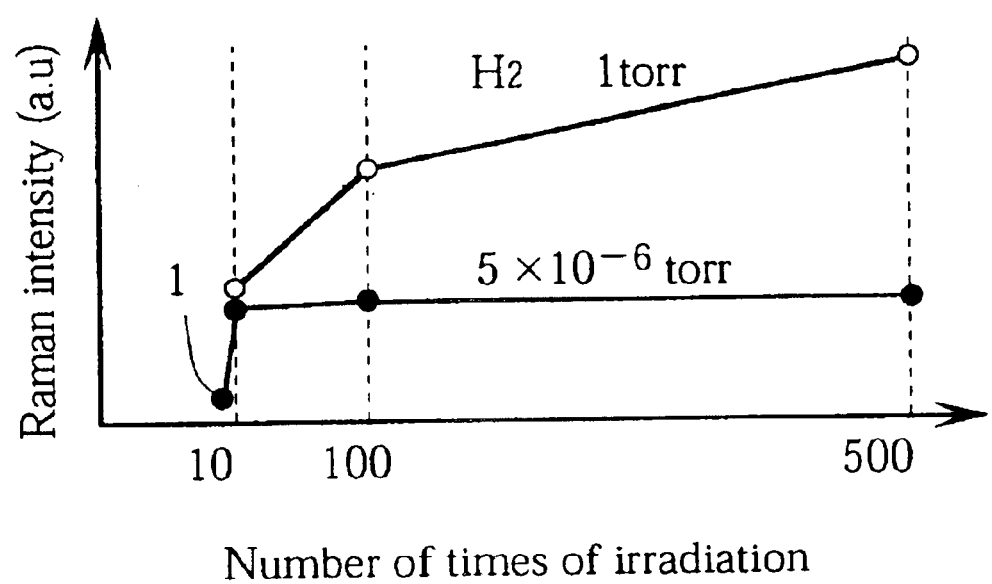
FIG. 41 illustrates relationships between ambient pressures in light irradiation and numbers of irradiation and degrees of crystallinity (Raman intensity).

As apparent from FIG. 41, it was found that in the case of a hydrogen gas pressure of 1 torr, the Raman intensity increased and the crystallinity improved as the number of irradiations increased. By contrast, in the case of a hydrogen gas pressure of $5 \times 10^{-6}$ torr, the Raman intensity did not increase and the crystallinity did not improve even when the number of time of irradiation increased over 10.

The results indicate that the ambient atmosphere should not be highly evacuated also in a method in which the light beam is applied a multiplicity of times to cause crystallization. It was also confirmed by the results that, by at least setting the hydrogen gas pressure to be 1 torr, the crystallinity can be improved as the number of times of irradiation is increased.

While the test results under the condition of the pressure exceeding 10 torr are not shown in the foregoing Experiment 1, it is considered that a high-quality crystal thin film can be formed also under the condition of the pressure exceeding 10 torr. The reason is as follows. It is considered that as the hydrogen gas pressure increases, the number of hydrogen molecules colliding with and departing from the surface of the thin film increases, which degrades the effect of causing a non-uniformity in temperature distribution. Nevertheless, another effect is obtained, such as in the following. When the thin film is heated to a temperature over the melting point by irradiation, the vapor pressure inside the thin film increases, and the increased vapor pressure causes such disadvantages that crystal growth is hindered and substances constituting the thin film are dispersed. However, if the ambient pressure is high, the high ambient pressure suppresses the dispersion of the substances constituting the thin film, and as a result, the crystal growth can proceed smoothly.

It is noted here that although hydrogen gas ($H_2$), which has a high specific heat and is effective in cooling heat, was employed as a gas constituting the ambient atmosphere in Experiments 1 and 2, but the gas constituting the ambient atmosphere is not limited to hydrogen gas. Examples of the gas include such inert gases as $N_2$, He, and Ar, and a mixed gas in which the molecules of two or more of these gases are mixed. However, molecules of different types of gases have different effects (including adverse effects) on the specific heat and the thin film substances, and therefore, it is preferable to set a suitable gas pressure according to the types of gas molecules.

It is also noted that while the excimer laser is used as a light beam in the above examples, the light beam usable in the present invention is not limited to the excimer laser. Other suitable examples include not only continuous-wave lasers such as a He—Ne laser and an argon laser but also a light of an ultraviolet lamp.

It is also to be noted that the present invention is particularly effective as a method of polycrystallization, but needless to say, is also applicable to a method of crystallization of single crystals.

Further, while the present invention has been described with particular emphasis on the process of forming crystalline semiconductor thin film, it is to be understood that the present invention is widely applicable to modification of substances using light energy, such as melt molding and heat annealing of alloys.

EXAMPLE 5-1

Example 5-1 of the present invention will be detailed with reference to FIGS. 44(a), 44(b), and FIG. 45.

Figure 44:
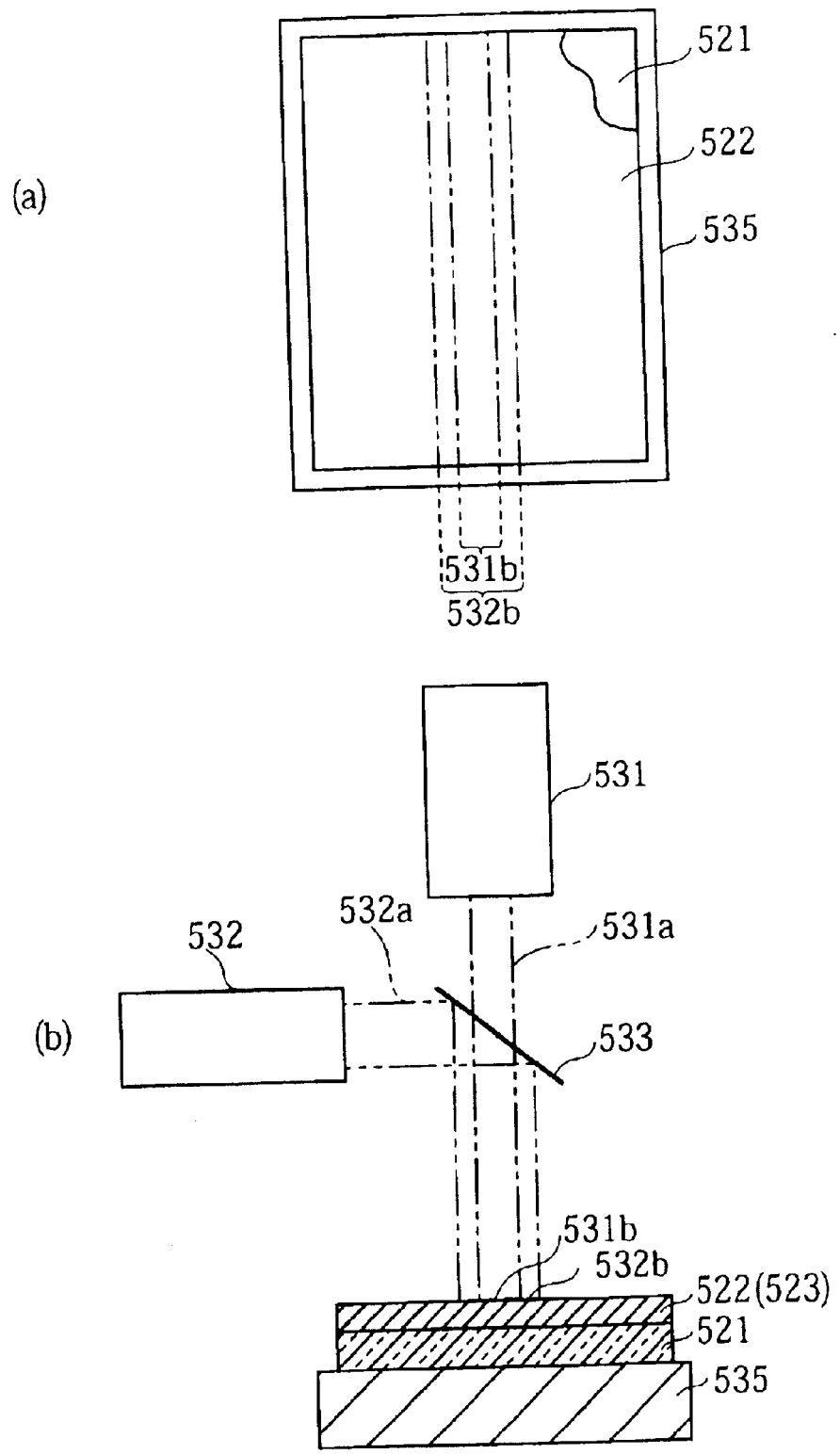
FIGS. 44(a) and 44(b) are schematic views illustrating a method of producing a polysilicon thin film of Example 5-1.
Figure 45:
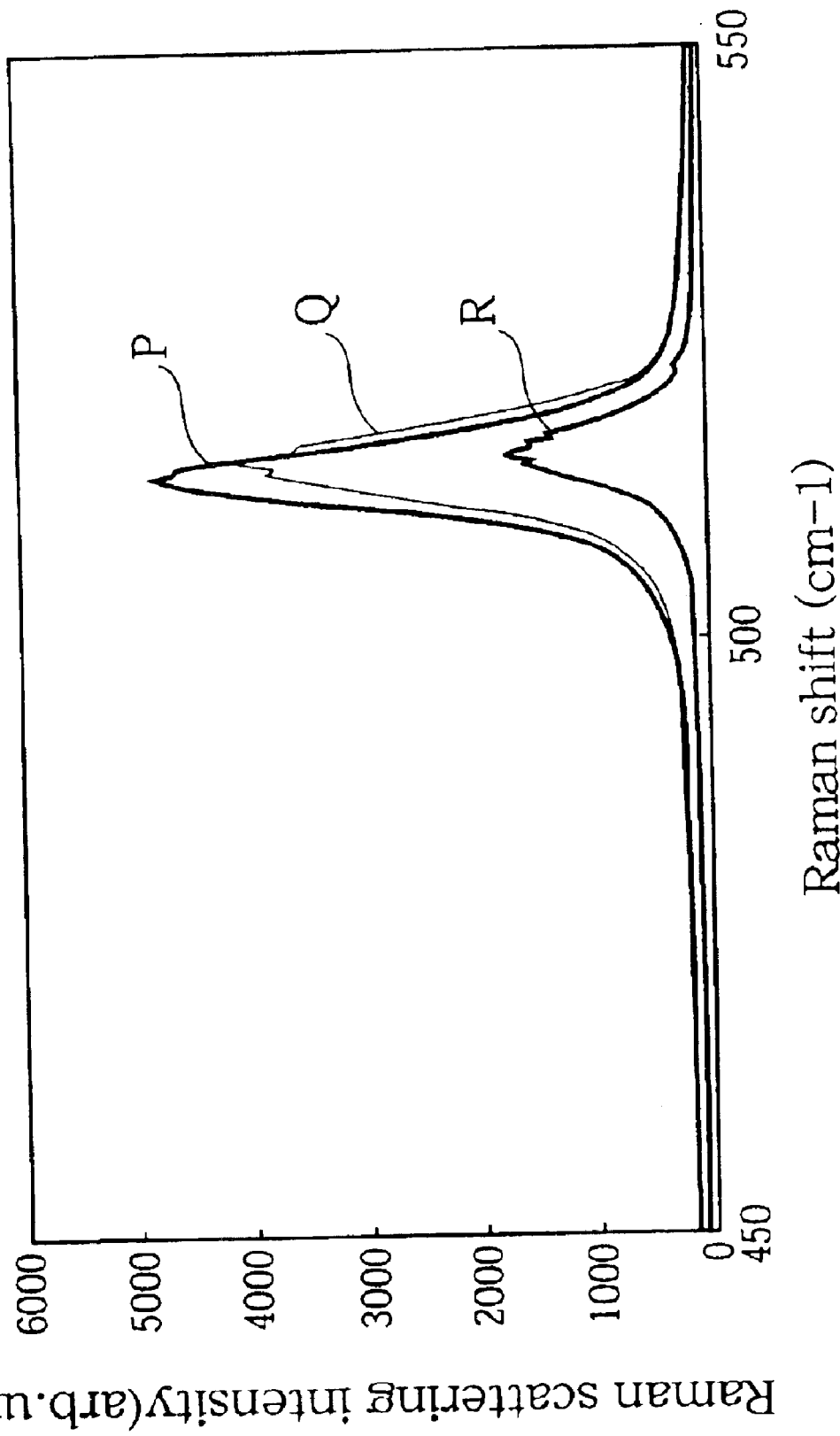
FIG. 45 is a graph showing the result of measuring Raman scattering in the polysilicon thin films of Examples 5-1 and 5-2.

First, as shown in FIGS. 44(a) and 44(b), an amorphous silicon thin film 522 as a precursor semiconductor thin film is formed on a glass substrate 521 by a plasma CVD method. The thickness of the amorphous silicon thin film 522 is not particularly restricted, and is generally varied depending on the application. For example, the thin films for use in TFTs are formed to have a thickness of about 300 to 1000 Å, whereas the thin films for photosensors or photovoltaic devices such as solar cells are to have a thickness of about 1 µm or greater.

Second, the glass substrate 521 having the amorphous silicon thin film 522 formed thereon is placed on a substrate stage 535, and the amorphous silicon thin film 522 is irradiated for 5 seconds in a stationary state with a first energy beam for crystallization, a laser beam 531a of an XeCl excimer laser 531, and a second energy beam for preheating, a laser beam 532a of an Ar laser 532.

More particularly, the XeCl excimer laser 531 has an oscillation frequency of 50 Hz, a wavelength of 308 nm, and an irradiation energy of 300 mJ/cm$^2$. The Ar laser 532 is a continuous wave laser having a wavelength of 488 nm and an output power of 20 W/cm$^2$. The laser beam 531a transmits through a semitransparent mirror 533, whereas the laser beam 532a is reflected by the semitransparent mirror 533. In the amorphous silicon thin film 522, the regions 531b, 532b to be irradiated respectively with the laser beams 531a, 532a have a belt-like shape, and the laser beam 532a is applied to the region 532b, which is wider than and includes the region 531b to be irradiated with the laser beam 531a.

As described above, it is preferable that the laser beams 531a, 532a be applied perpendicular to the amorphous silicon thin film 522, such as by using the semitransparent mirror 533, from such a viewpoint that the non-uniformities in crystal grain sizes and field effect mobilities are easily reduced. However, the laser beams are not necessarily applied at exactly right angles, but may be applied substantially perpendicular to the amorphous silicon thin film 522, such as by slightly staggering two mirrors. In addition, as an alternative to the XeCl excimer laser 531, various other lasers having a wavelength of 400 nm or less, such as an ArF, KrF, or XeF excimer laser may be employed, and as an alternative to the Ar laser 532, various other lasers having a wavelength of 450–550 nm may be employed.

Figure 1:
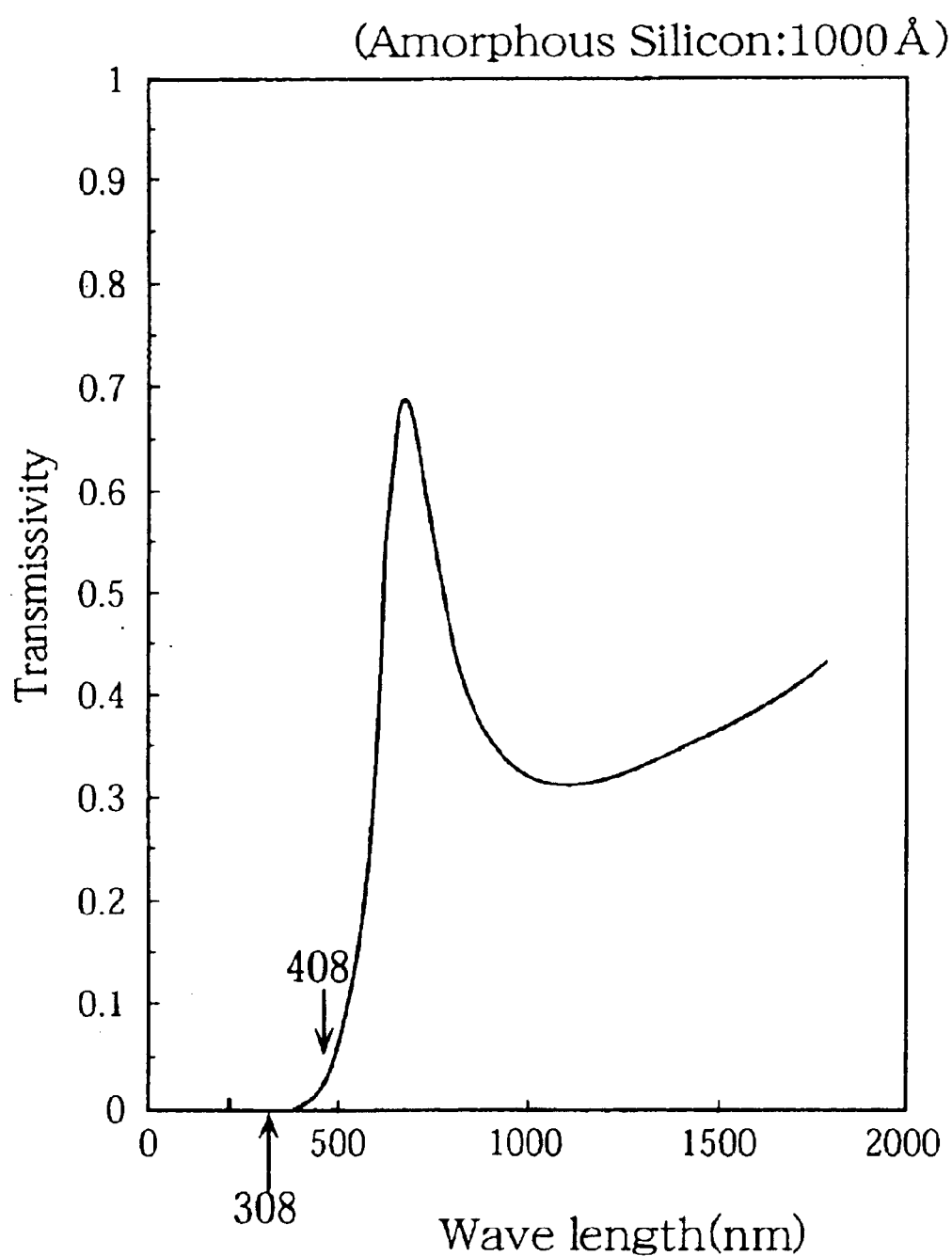
FIG. 1 is a graph showing a transmissivity characteristic of an amorphous silicon thin film.
Figure 3:
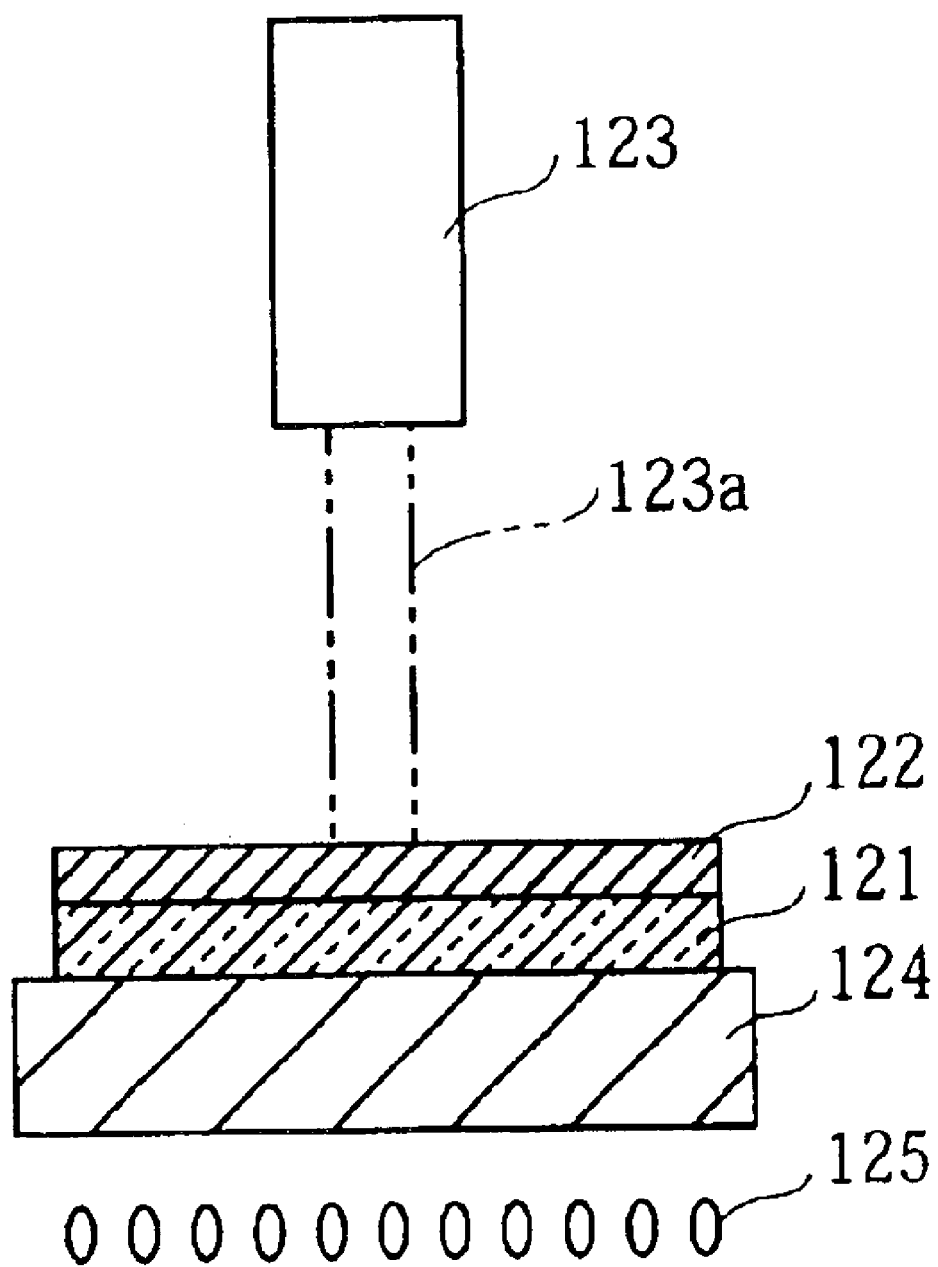
FIG. 3 illustrates a prior art method of producing a polysilicon thin film.
Figure 4:
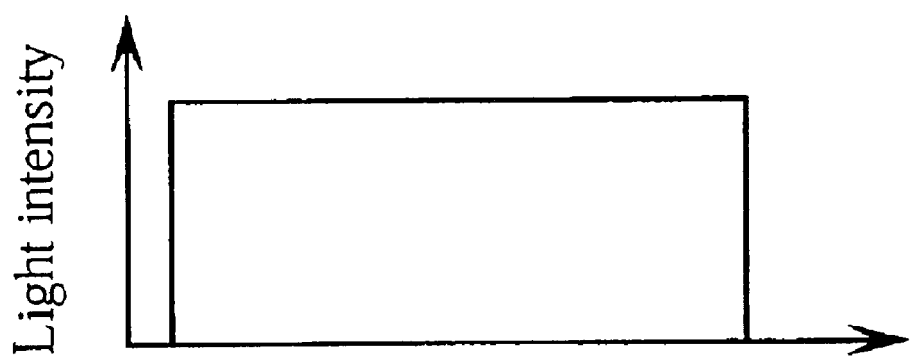
FIG. 4 illustrates a pattern of an intensity of a light beam having a flat light intensity distribution according to a prior art technique.
Figure 5:
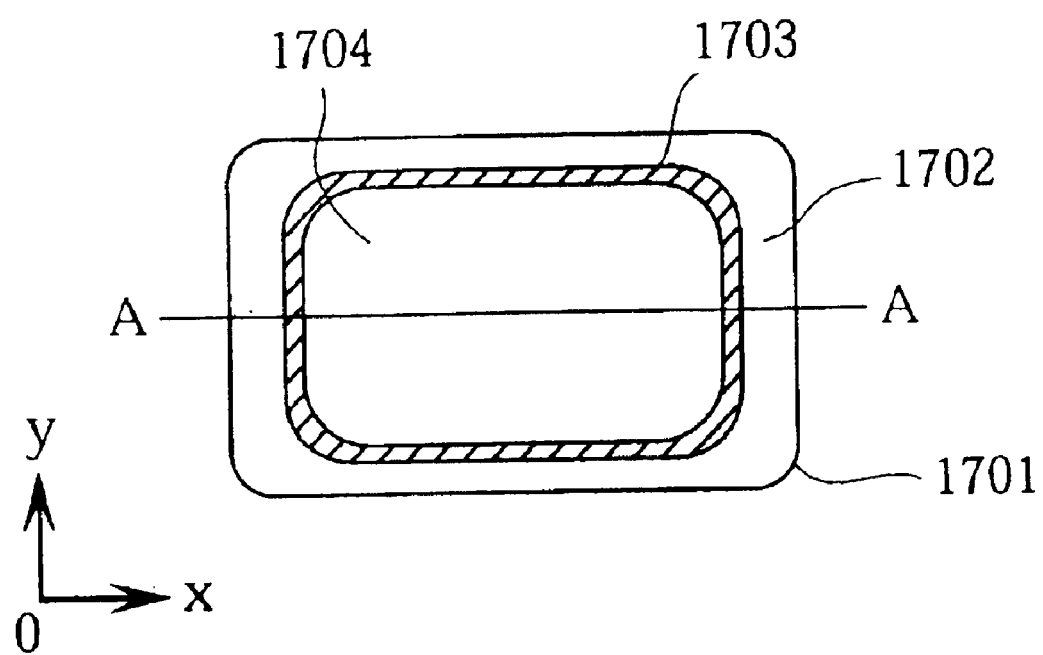
FIG. 5 is a schematic view illustrating non-uniformity of a degree of crystallinity in a crystallized region in a prior art technique.
Figure 6:
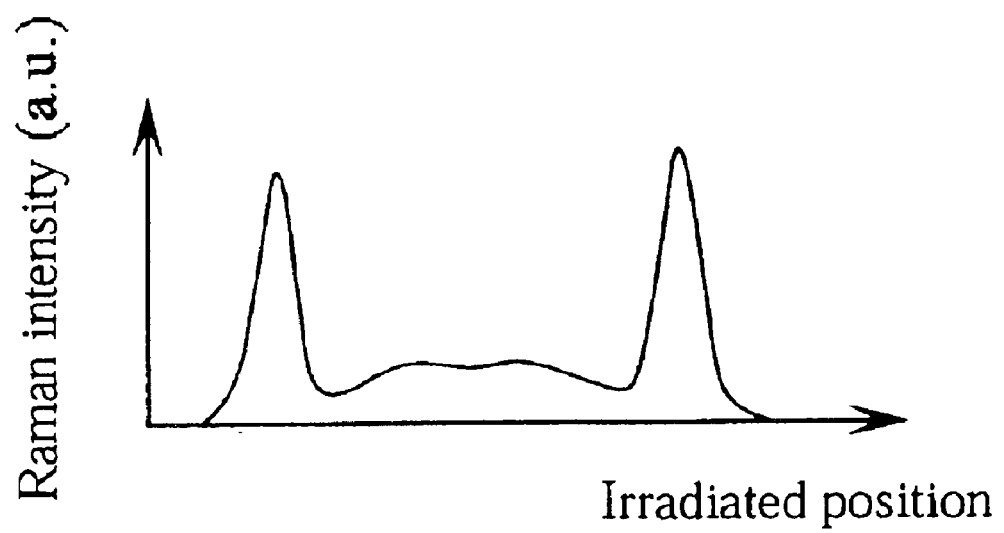
FIG. 6 is a graph of a Raman intensity curve in the line A—A in FIG. 5.
Figure 7:
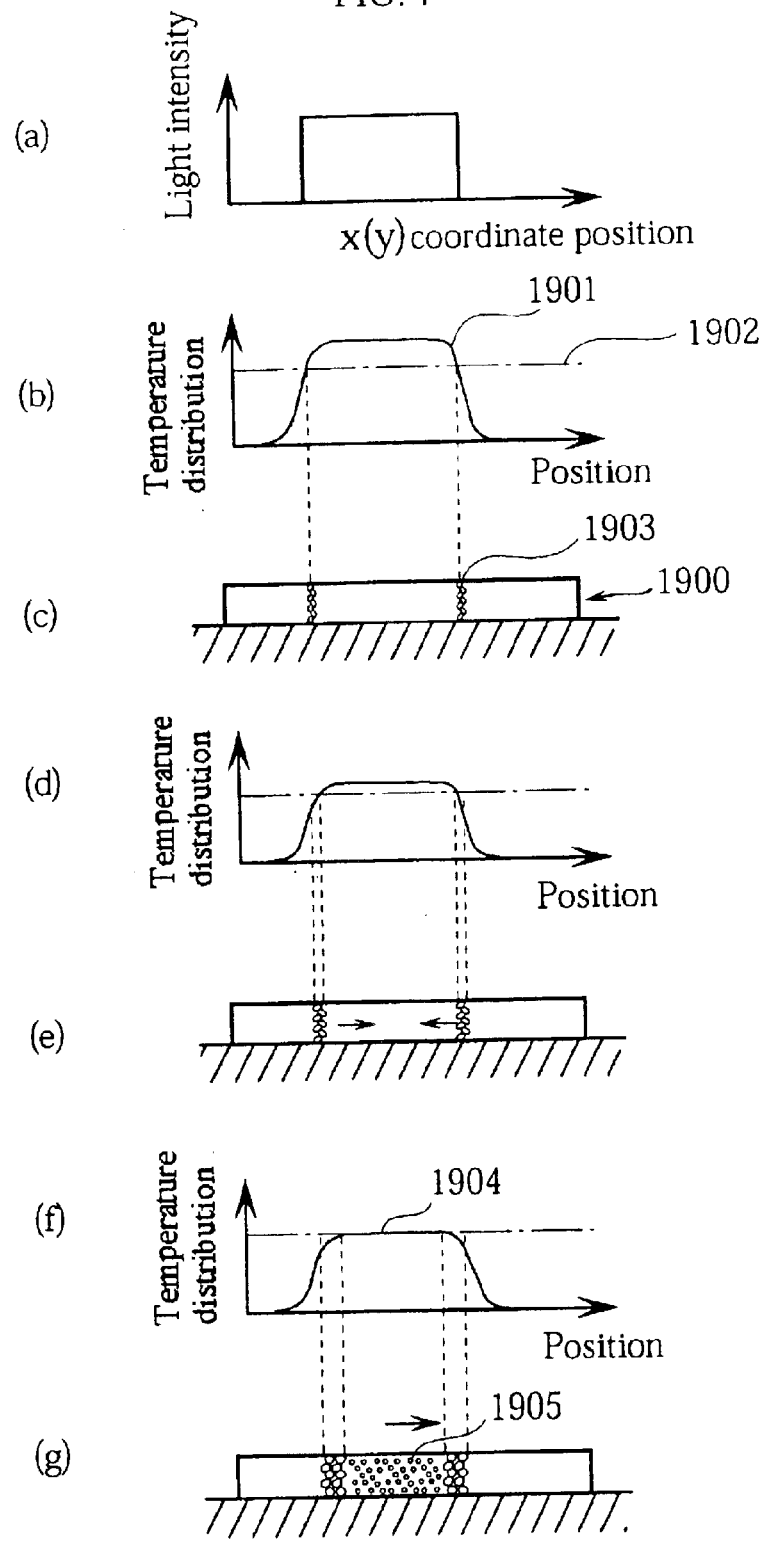
FIGS. 7(a) to 7(g) illustrate progress of crystallization in the case of employing a light beam having a flat light intensity distribution.
Figure 8:
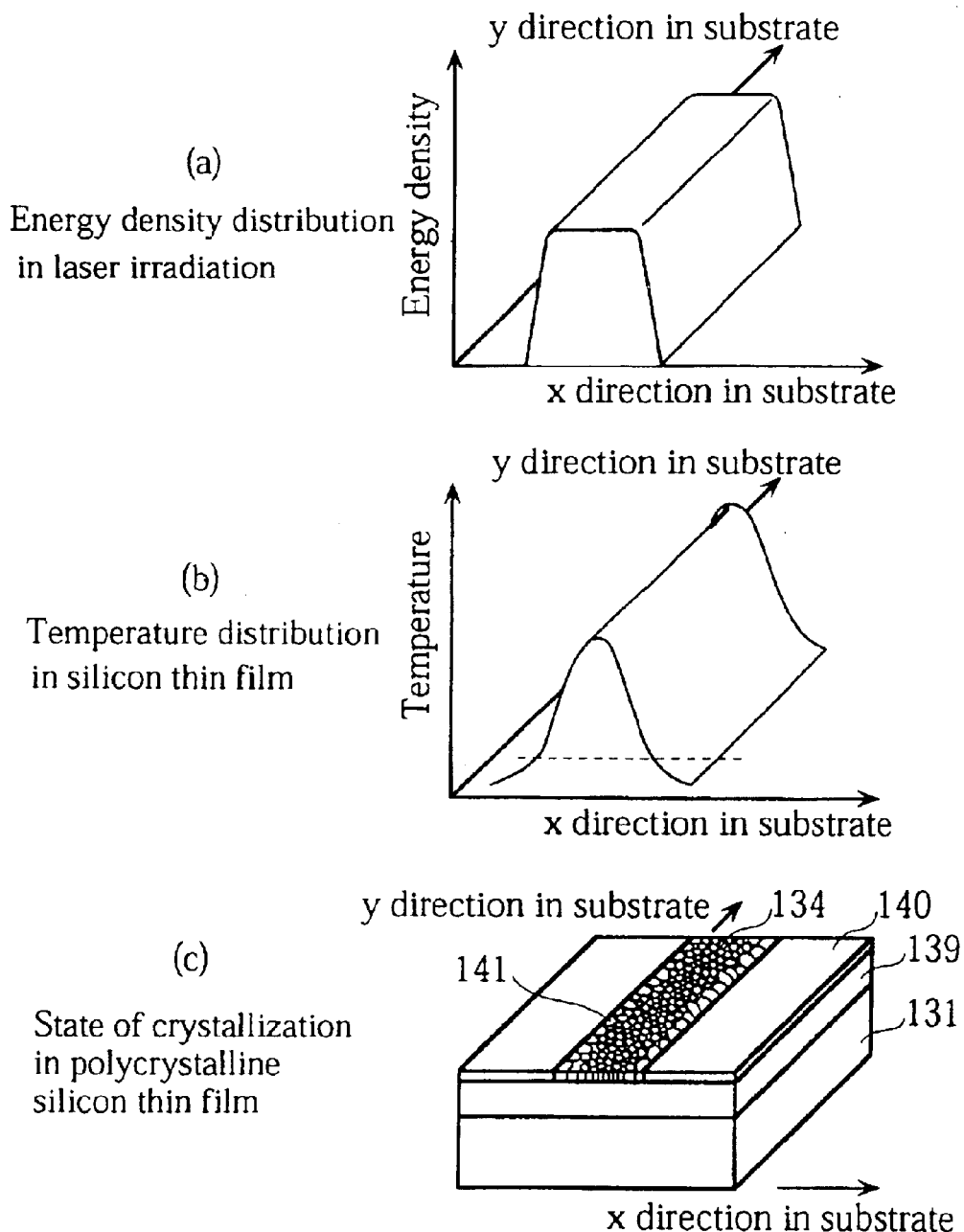
FIGS. 8(a) to 8(c) illustrate the principle of polycrystallization by laser light irradiation in accordance with a prior art method.

The amorphous silicon thin film 522 has, in the case of the film thickness being 1000 Å for example, a transmissivity characteristic as shown in FIG. 1. Specifically, the absorption coefficient for a light having a wavelength of about 500 nm is about $10^5$ cm$^{-1}$, which is about the reciprocal number of the film thickness, and the absorption coefficient for a light having a wavelength of less than 400 nm is $10^6$ cm$^{-6}$, which indicates that little of the light transmits through the film. Accordingly, on one hand, most of the laser beam 531a of the XeCl excimer laser 531, which has a wavelength of 308 nm, is absorbed near the surface of the amorphous silicon thin film 522, and by the resulting temperature increase and the conduction of the heat, mainly the amorphous silicon thin film 522 is heated to about 1200° C. On the other hand, the laser beam 532a of the Ar laser 532 having a wavelength of 488 nm is absorbed in almost the entire region throughout the thickness direction of the amorphous silicon thin film 522, and by the conducted heat, the glass substrate 521 is heated to about 400° C. Thereby, after being irradiated with the laser beams 531a and 532a, the amorphous silicon thin film 522 is annealed and crystal growth is promoted. Thus, a polysilicon thin film 523 having large crystal grains is formed.

The polysilicon thin film 523 thus formed and a prior art polysilicon thin film crystallized by using the XeCl excimer laser 531 alone were subjected to Raman spectroscopy to evaluate the conditions of crystallization. The measurement result for each of the thin films is shown in FIG. 45, respectively indicated by the reference character P or R. As is evident from FIG. 45, it was confirmed that a higher Raman scattering intensity and a better crystallinity was obtained in the case (P) where both the laser beam 531a of XeCl excimer laser 531 and the laser beam 532a of the Ar laser 532 were employed than in the case (R) where the laser beam 532a of the Ar laser 532 alone was employed.

In another test, the laser beam 531a, 532a were also applied to the entire area of the amorphous silicon thin film 522 while moving the glass substrate 521 provided with the amorphous silicon thin film 522 at a speed of, for example, 3 mm/sec., and a plurality of regions of the formed polysilicon thin film 523 were subjected to Raman spectroscopy to evaluate a distribution of crystallization. The test result confirmed that a remarkably high degree of uniformity was achieved.

It is noted here that in order to enhance the uniformity of crystallization, it is preferable that the region 532b to be irradiated with the laser beam 532a be a larger region than the region 531b to be irradiated with the laser beam 531a, and include the region 531b.

EXAMPLE 5-2

Figure 46:
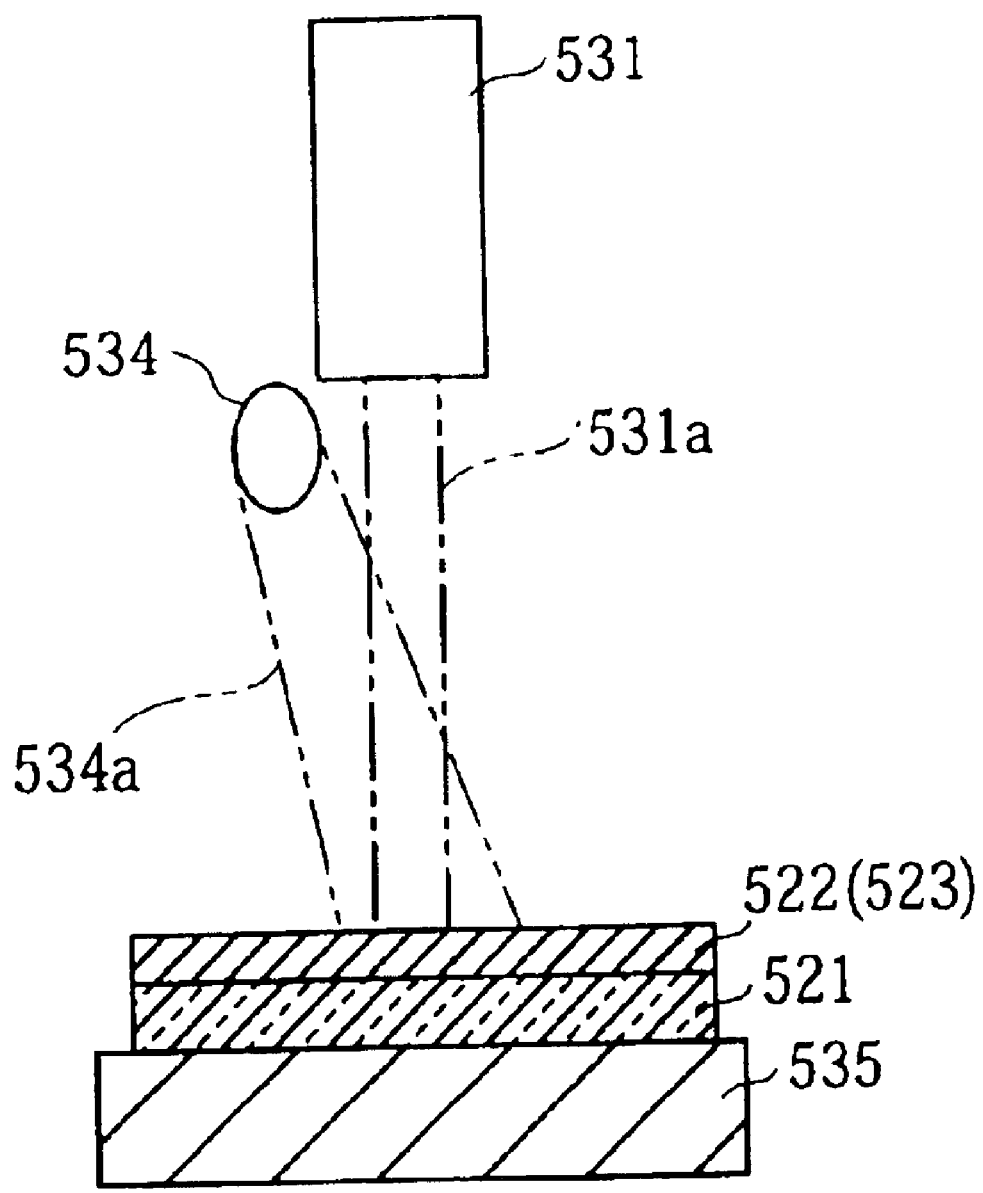
FIG. 46 is a schematic view illustrating a method of producing a polysilicon thin film of Example 5-2.
Figure 47:
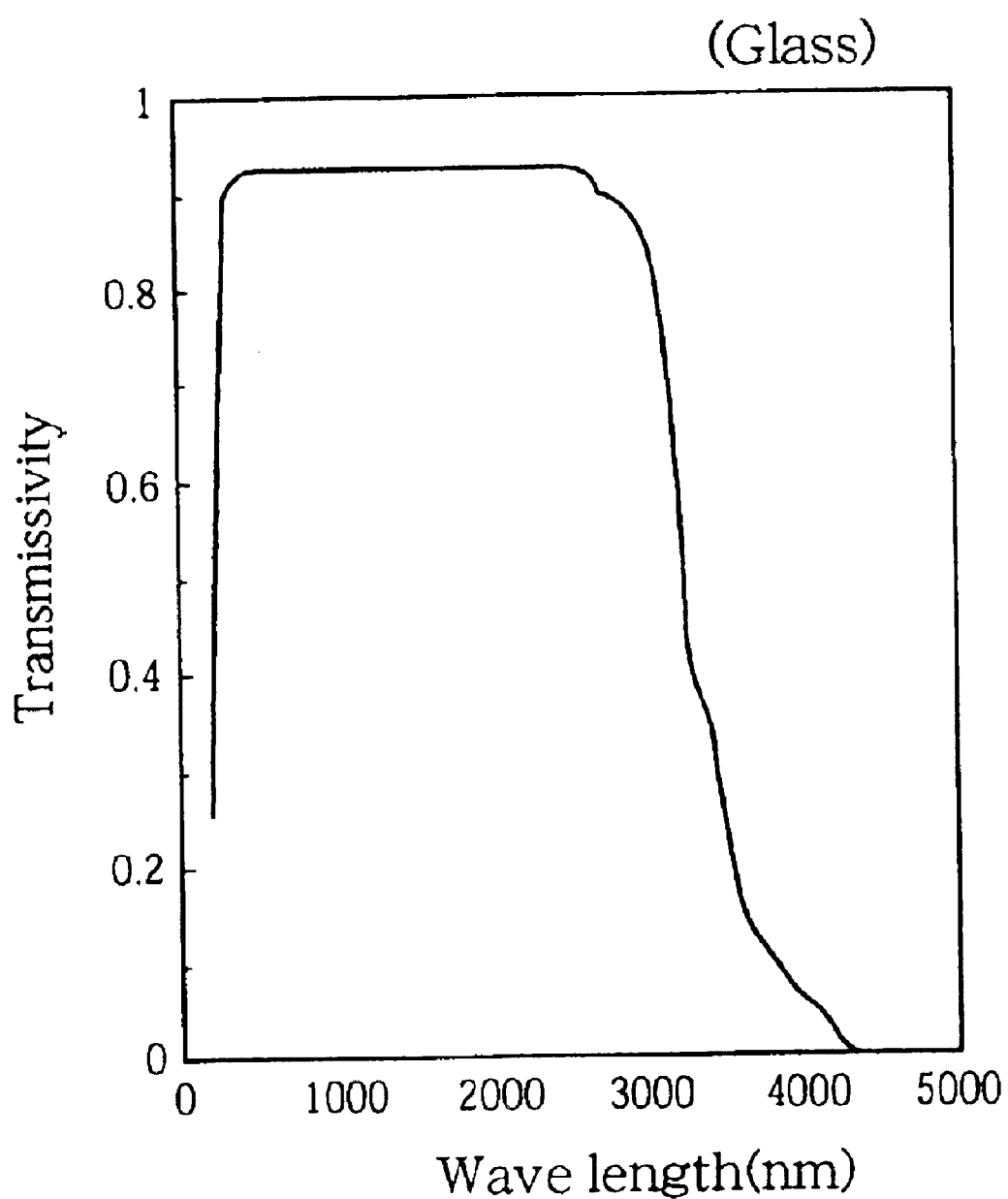
FIG. 47 is a graph showing a transmissivity characteristic of glass.

As shown in FIG. 46, an infrared lamp 534 having a wavelength of for example 4 µm may be employed in place of the Ar laser 532 employed in the foregoing Example 5-1. The glass substrate 521 has a transmissivity characteristic as shown in FIG. 47, and therefore infrared ray 534a emitted from the infrared lamp 534 transmits through the amorphous silicon thin film 522, most of the ray being absorbed by the glass substrate 521. When the laser beam 531a of the XeCl excimer laser 531 is applied thereto, mainly the amorphous silicon thin film 522 is heated by the laser beam 531a, whereas mainly the glass substrate 521 is heated by the infrared ray 534a of the infrared lamp 534, as in an analogous manner to that in the foregoing Example 5-1. Thereby, after being irradiated with the laser beam 531a and the infrared ray 534a, the amorphous silicon thin film 522 is annealed and crystal growth is promoted. Thus, a polysilicon thin film 523 having large crystal grains is formed.

The polysilicon thin film 523 formed under the same conditions as in the foregoing Example 5-1 except that the infrared lamp 534 was employed was subjected to Raman spectroscopy. The measurement result is shown in FIG. 45, designated by the reference character Q. As is evident from the FIG. 45, it was confirmed that the Raman scattering intensity and crystallinity were higher than those in the case (R) where the laser beam 531a of the XeCl excimer laser 531 alone was employed.

It was also proved that uniformity of the crystal grains is excellent, as in the foregoing Example 5-1.

In addition to the infrared ray 534a, the laser beam 532a of the Ar laser 532 may also be employed, as in the foregoing Example 5-1. Further, the infrared ray 534a as well may be applied perpendicular to the amorphous silicon thin film 522, such as by using a semitransparent mirror as in the foregoing Example 5-1.

EXAMPLE 5-3

Figure 49:
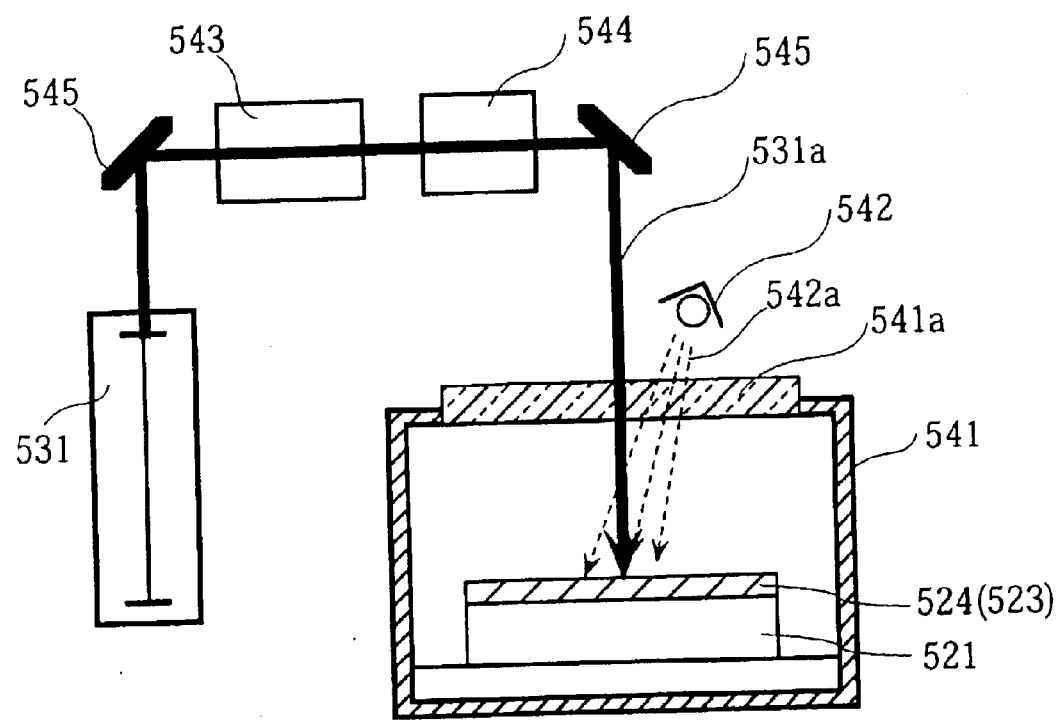
FIG. 49 is a schematic view illustrating a method of producing a polysilicon thin film of Example 5-3.
Figure 50:
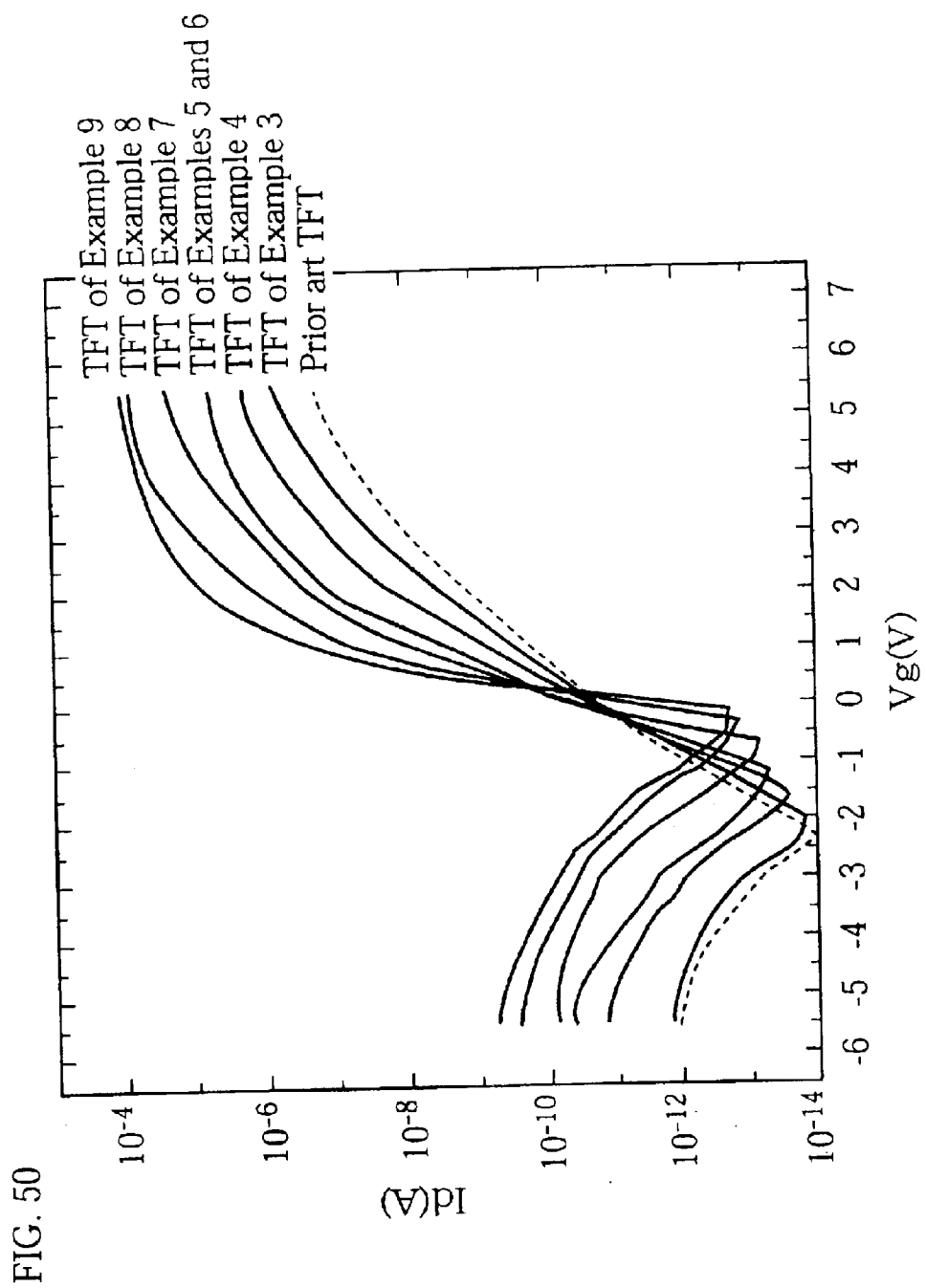
FIG. 50 is a graph showing characteristics of TFTs of Examples 5-3 to 5-9.

Example 5-3 of the present invention is now detailed with reference to FIGS. 48 through 50.

Figure 48:
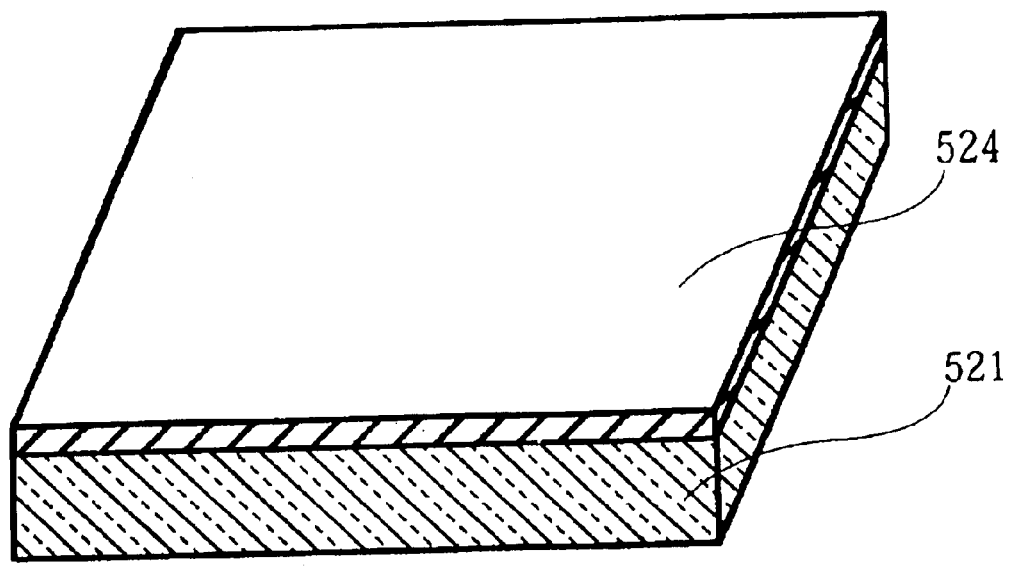
FIG. 48 is a perspective view showing a configuration of a glass substrate on which a microcrystalline silicon thin film of Example 5-3 is formed.

First, as shown in FIG. 48, a microcrystalline silicon thin film 524 as a precursor semiconductor thin film is formed on a glass substrate 521 by using an inductively-coupled plasma CVD method. Specifically, for example, a microcrystalline silicon thin film 524 having a thickness of 85 nm is formed by using as the reaction gas a 2:3 mixture of monosilane gas ($SiH_4$) and hydrogen gas under the reaction conditions of the substrate temperature (reaction temperature) being 350–530° C. and the pressure being several torr. It is noted that in place of the microcrystalline silicon thin film 524, the amorphous silicon thin film 522 may be formed, as in the foregoing Example 5-1. Other systems usable as an alternative to the plasma CVD system include an LP (low power) CVD system and a sputtering system.

Second, the glass substrate 521 provided with the microcrystalline silicon thin film 524 was heat-treated for 30 minutes or longer at 400–500° C., as a dehydrogenation treatment in which hydrogen in the microcrystalline silicon thin film 524 is removed. The treatment is intended to prevent a damage to the microcrystalline silicon thin film 524 resulting from the rapid release of the hydrogen incorporated into the microcrystalline silicon thin film 524 during the laser annealing described below.

Third, a laser annealing is performed. Specifically, as shown in FIG. 49, the glass substrate 521 is placed in a chamber 541 provided with an irradiation window 541a made of a quartz plate. The glass substrate 521 is then irradiated with the laser beam 531a of the XeCl excimer laser 531 and an incandescent light 542a of an incandescent lamp 542 to crystallize the microcrystalline silicon thin film 524. Thus, a polysilicon thin film 523 is formed. More specifically, the laser beam 531a is 10 shots of a pulsed laser having a pulse width of several tens of nanoseconds, a wavelength of 308 nm, and an irradiation energy 350 mJ/cm². The laser beam 531a is applied via a laser beam attenuator 543, a homogenizer (apparatus for homogenizing the laser beam) 544, and a reflector 545. The incandescent light 542a is applied so that the microcrystalline silicon thin film 524 is heated to about 400° C.

Thereafter, the polysilicon thin film 523 is heated to 350° C. or higher in a hydrogen plasma atmosphere to perform a hydrogenation treatment by which dissociated dangling bonds in the polysilicon thin film 523 are terminated by hydrogen.

The crystal grain size in the polysilicon thin film 523 thus formed was measured by using SEM and TEM. The grain size was found to be 0.7 μm, and it was thereby confirmed that the grain size increased over the grain size in the prior art polysilicon films, which was 0.3 μm. The field effect mobility also increased to 80 cm²/V·sec, which was also an improvement over 50 cm²/V·sec of the prior art. Furthermore, the total of the density of defects in the interface and the inside of the polysilicon thin film 523 was reduced to $1.0 \times 10^{12}$ cm$^{-2}$eV$^{-1}$, from $1.3 \times 10^{12}$ cm$^{-2}$eV$^{-1}$ of the prior art. This demonstrates that the use of the incandescent lamp 542 in combination with the irradiation with the laser beam 531a increases the crystal grain size and improves the film quality in the polysilicon thin film 523.

The conditions in applying the laser beam 531a were varied experimentally. As a result, it was found that crystallization takes place when the irradiation energy is 200 mJ/cm² or greater, whereas microcrystalline silicon disappears when the irradiation energy is 500 mJ/cm² or greater. In addition, it was found that in the range of 300 mJ/cm² to 450 mJ/cm², sufficient crystal growth takes place and a large grain size results. It was also found that when the number of times of the irradiation is five times or more, the occurrence of crystal defects is suppressed and crystallinity is improved.

Thereafter, a thin film transistor (TFT) is prepared by, for example, forming predetermined insulating films and conductive films, performing a patterning by etching, and then performing an ion implantation. The patterning of the polysilicon thin film 523 may be performed before the laser annealing.

The gate voltage (Vg)-drain current (Id) characteristic of the TFT thus prepared was measured. As shown in FIG. 50, the TFT of the present example showed that the rise of the drain current versus gate voltage became more abrupt, which confirms that the subthreshold characteristic was improved. The threshold voltage was also reduced.

Figure 51:
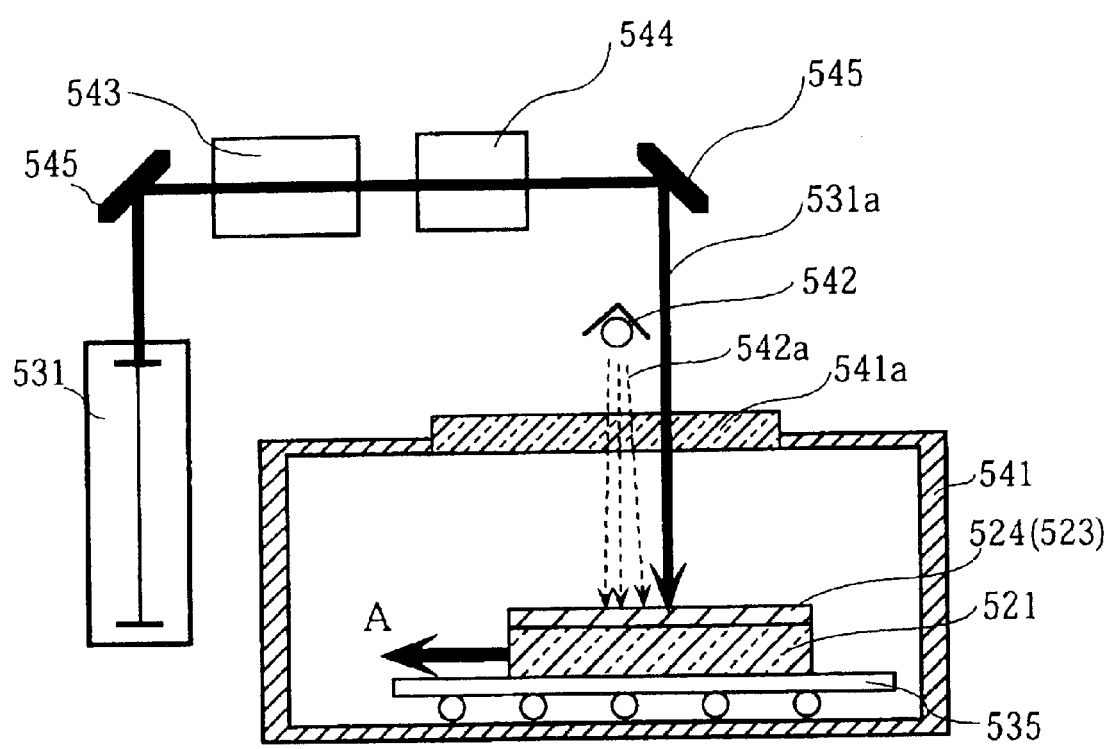
FIG. 51 is a schematic view illustrating another example of the method of producing a polysilicon thin film of Example 5-3.

It is noted that, in place of simultaneously applying the laser beam 531a and the incandescent light 542a as described above, the irradiation may be performed in the following manner as shown in FIG. 51. That is, the glass substrate 521 is placed on a substrate stage 535 capable of moving in the horizontal direction, and the incandescent light 542a is applied to a more forward position in the microcrystalline silicon thin film 524 with respect to a direction of moving of the substrate than a position where the laser beam 531a is applied, while the substrate stage 535 is being moved in the direction indicated by the arrow A in FIG. 51. Thereby, heating by the incandescent light 542a is performed before the heating by the laser beam 531a. This also achieves the same advantageous effects.

EXAMPLE 5-4

A TFT of Example 5-4 according to the present invention will now be described with reference to FIGS. 52 and 50.

Figure 52:
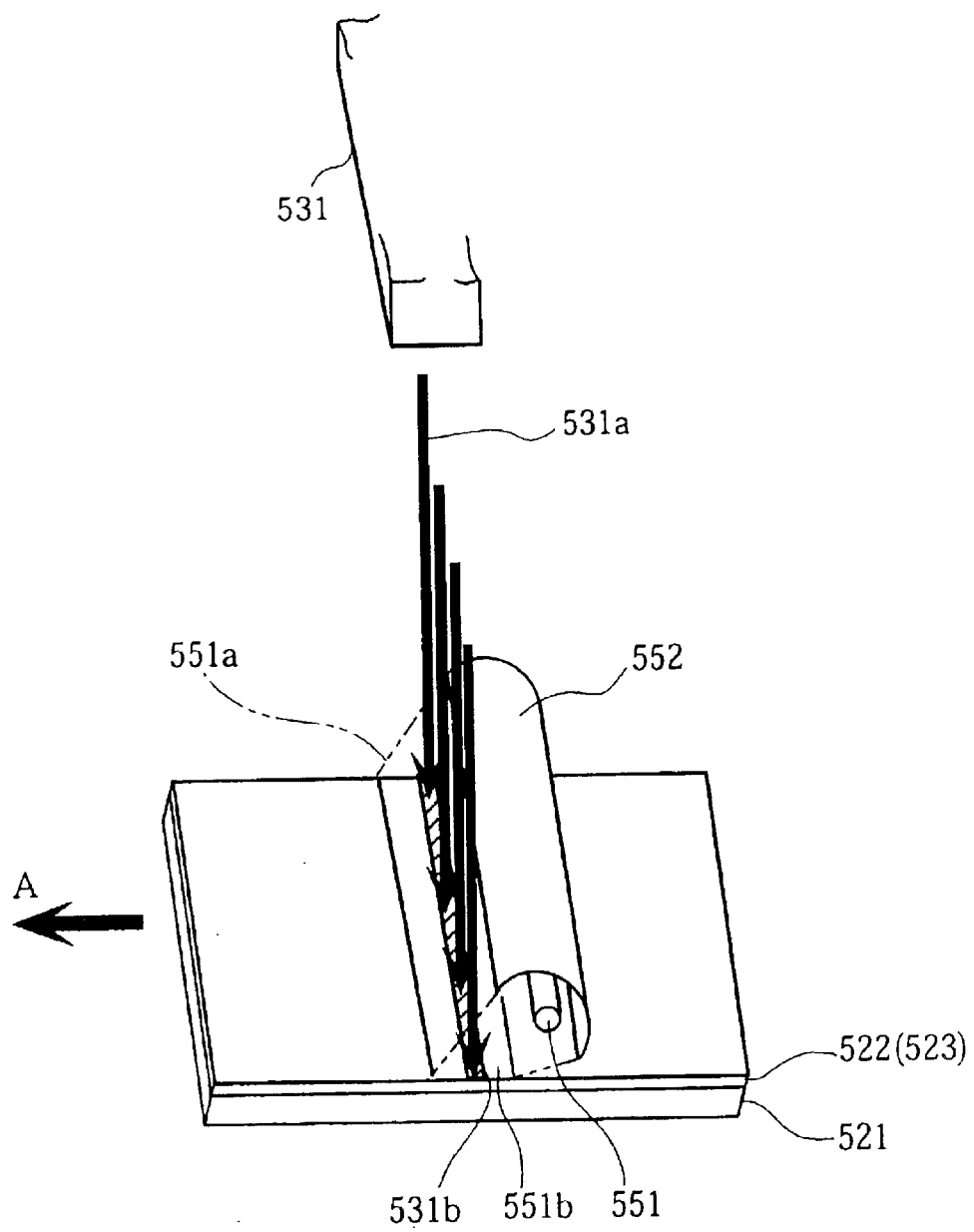
FIG. 52 is a schematic view illustrating a method of producing a polysilicon thin film of Example 5-4.

First, an amorphous silicon thin film 522 is formed on the glass substrate 521 by a plasma CVD method, as shown in FIG. 52. More specifically, for example, an amorphous silicon thin film 522 having a thickness of 85 nm is formed by using as reaction gas a mixture of monosilane gas ($SiH_4$) and hydrogen gas under the reaction conditions of the substrate temperature being 180–300° C. and the pressure being 0.8 torr.

Second, the glass substrate 521 provided with the amorphous silicon thin film 522 is subjected to a dehydrogenation treatment in the same manners as in the foregoing Example 5-3.

Third, the amorphous silicon thin film 522 is irradiated with the laser beam 531a of the XeCl excimer laser 531 and an excimer lamp light 551a of an excimer lamp 551, while the glass substrate 521 is being moved in the direction of the arrow A in FIG. 52. Thus, the amorphous silicon thin film 522 is crystallized and a polysilicon thin film 523 is formed. Specifically, the laser beam 531a has an irradiation energy of 350 mJ/cm$^2$, and is applied in such a manner that the irradiated region 531b in the amorphous silicon thin film 522 result is a 500 μm×70 mm belt-like shape. In addition, accompanying with the movement of the glass substrate 521, each shot of the laser beam 531a is applied so that the region 531b to be irradiated overlaps with 90 percent of the preceding already-irradiated region, and the entire region of the amorphous silicon thin film 522 is irradiated 10 times with the laser beam 531a. Meanwhile, the excimer lamp light 551a is a light in the range from visible rays to ultraviolet rays, and is applied directly and via a concave reflector 552 on a 5 mm×70 mm region 551b to be irradiated, which includes the region 531b to be irradiated with the laser beam 531a, so as to heat the amorphous silicon thin film 522 to about 500° C.

Thereafter, a hydrogenation treatment is performed as in the foregoing Example 5-3.

The crystal grain size in the polysilicon thin film 523 thus formed was measured by using SEM and TEM. The grain size was found to be 1 μm, and it was thereby confirmed that the grain size increased over the grain size in the prior art polysilicon films, which was 0.3 μm. The field effect mobility also increased to 120 cm$^2$/V·sec, which was also an improvement over 50 cm$^2$/V·sec of the prior art. Furthermore, the total of the density of defects in the interface and the inside of the polysilicon thin film 523 was reduced to 1.1×10$^{12}$ cm$^{-2}$eV$^{-1}$, from 1.3×10$^{12}$ cm$^{-2}$eV$^{-1}$ of the prior art. This demonstrates that the use of the excimer lamp 551 in combination with the irradiation with the laser beam 531a increases the crystal grain size and improves the film quality in the polysilicon thin film 523.

Thereafter, as in the foregoing Example 5-3, a TFT is prepared by, for example, forming predetermined insulating films and conductive films, performing a patterning by etching, and then performing an ion implantation.

The gate voltage (Vg)-drain current (Id) characteristic of the TFT thus prepared was measured. As shown in FIG. 50, the TFT of the present example as well showed that the rise of the drain current versus gate voltage became more abrupt, which confirms that the subthreshold characteristic was improved. The threshold voltage was also reduced to 4.2 V, from 5.0 V of the prior art.

EXAMPLE 5-5

Example 5-5 of the present invention will now be detailed with reference to FIGS. 53 and 50.

First, an amorphous silicon thin film 522 is formed on the glass substrate 521, followed by the dehydrogenation treatment performed in the same manner as in the foregoing Example 5-4.

Figure 53:
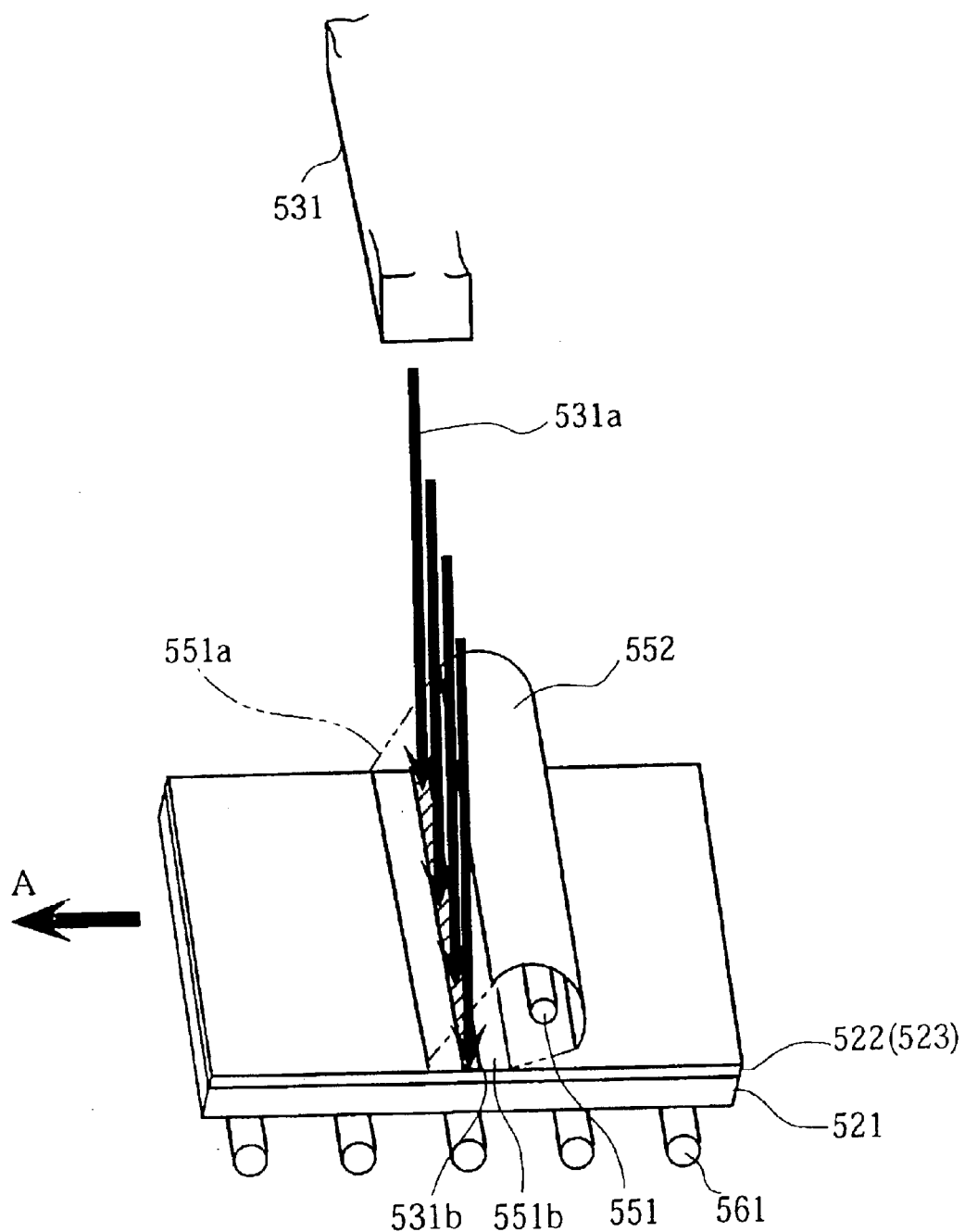
FIG. 53 is a schematic view illustrating a method of producing a polysilicon thin film of Example 5-5.

Subsequently, as shown in FIG. 53, while the glass substrate 521 is being moved in the direction of the arrow A, the laser beam 531a of the XeCl excimer laser 531 and the excimer lamp light 551a of the excimer lamp 551 are applied, and in addition, with the use of a heater 561, the glass substrate 521 was heated from the bottom side, thus forming a polysilicon thin film 523. Specifically, the present example is identical to the foregoing Example 5-4 in the conditions of irradiation with the laser beam 531a and the excimer lamp light 551a, but differs in that the entire glass substrate 521 is heated to 450° C. with the use of the heater 561 in addition to the irradiation.

Thereafter, a hydrogenation treatment is performed as in the foregoing Example 5-3.

The crystal grain size in the polysilicon thin film 523 thus formed was measured by using SEM and TEM. The grain size was found to be 1.5 μm, and it was thereby confirmed that the grain size increased over the grain size in the prior art polysilicon films, which was 0.3 μm. The field effect mobility also increased to 150 cm$^2$/V·sec, which was also an improvement over 50 cm$^2$/V·sec of the prior art. Furthermore, the total of the density of defects in the interface and the inside of the polysilicon thin film 523 was reduced to 8.7×10$^{11}$ cm$^{-2}$eV$^{-1}$, from 1.3×10$^{12}$ cm$^{-2}$eV$^{-1}$ of the prior art. This demonstrates that the use of the excimer lamp 551 and the heater 561 in combination with the irradiation with the laser beam 531a further increases the crystal grain size and improves the film quality in the polysilicon thin film 523.

In addition, a TFT was produced as in the foregoing Example 5-3 and the gate voltage (Vg)-drain current (Id) characteristic of the TFT thus prepared was measured. As shown in FIG. 50, the TFT of the present example showed that the rise of the drain current versus gate voltage became further more abrupt, which confirms that the subthreshold characteristic was improved.

The temperature of the glass substrate 521 was varied experimentally. As a result, it was found that the improvement in crystal quality was obtained when the temperature of the glass substrate 521 was 300° C. or higher, whereas deformation occurs in the glass substrate 521 and thereby the fabrication of TFTs and the like becomes difficult when the temperature was 600° C. or higher.

EXAMPLE 5-6

Example 5-6 of the present invention will now be detailed with reference to FIGS. 54 and 50.

First, an amorphous silicon thin film 522 is formed on the glass substrate 521, followed by the dehydrogenation treatment performed in the same manner as in the foregoing Example 5-4.

Figure 54:
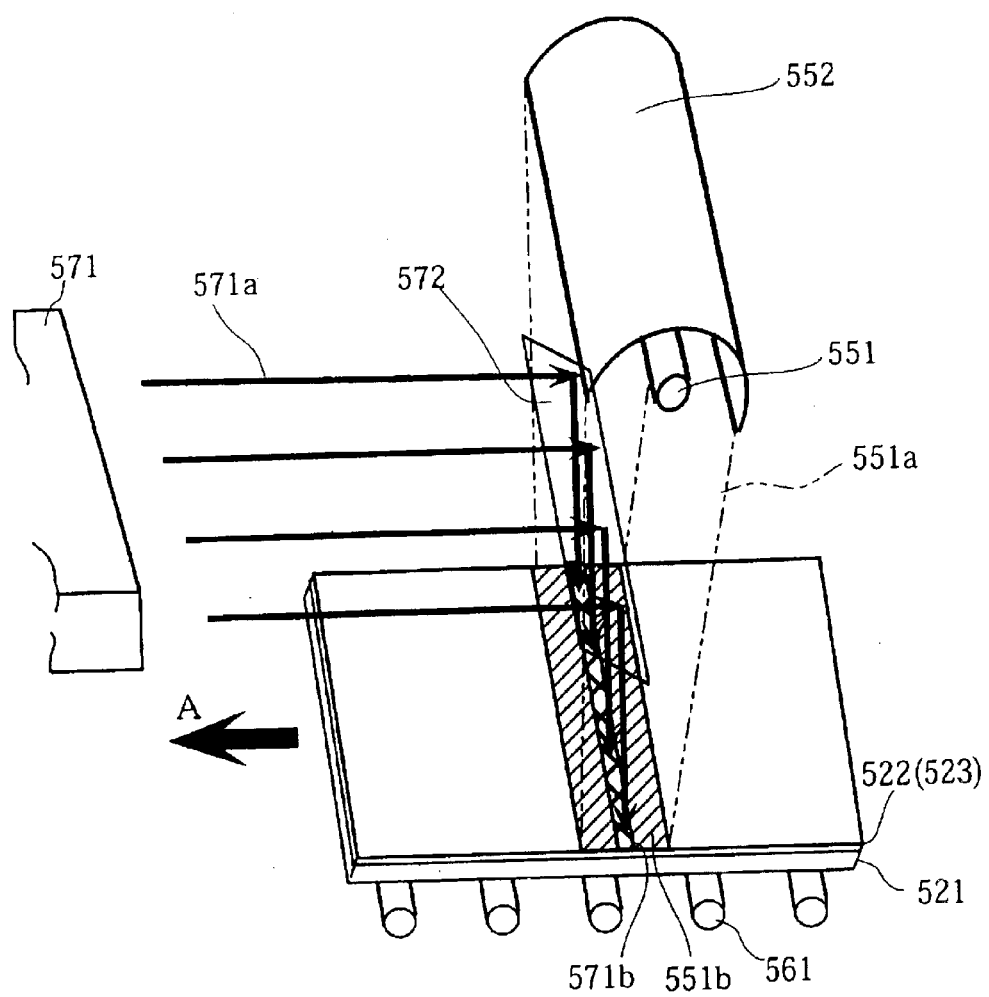
FIG. 54 is a schematic view illustrating methods of producing a polysilicon thin film of Examples 5-6 and 5-7.

Subsequently, as shown in FIG. 54, while the glass substrate 521 is being moved in the direction of the arrow A, the laser beam 571a of a KrF excimer laser 571 and the excimer lamp light 551a of the excimer lamp 551 are applied, and in addition, with the use of the heater 561, the glass substrate 521 was heated from the bottom side, thus forming a polysilicon thin film 523. Compared with the foregoing Example 5-5, the present example differs from the foregoing Example 5-5 mainly in that the excimer lamp light 551a is applied from directly above the glass substrate 521, transmitting through a wavelength selective reflector 572, and that the KrF excimer laser 571 is used in place of the XeCl excimer laser 531 and the laser beam 571a is applied via the wavelength selective reflector 572. In addition, the excimer lamp light 551a is applied to a 5 mm×100 mm region 551b to be irradiated including a region 571b to be irradiated with the laser beam 571a. Other conditions such as those of heating are identical to the foregoing Example 5-5.

The wavelength selective reflector 572 used here reflects a light having a wavelength shorter than 280 nm, but transmits a light having a wavelength longer than 280 nm. Therefore, the laser beam 571a (the wavelength being 248 nm) of the KrF excimer laser 571, in which KrF is used for discharge, is reflected by the wavelength selective reflector 572, and then applied substantially perpendicular to the amorphous silicon thin film 522. At the same time, the excimer lamp light 551a in the range from visible rays to ultraviolet rays transmits through the wavelength selective reflector 572, and is applied substantially perpendicular to the amorphous silicon thin film 522.

Thereafter, a hydrogenation treatment is performed as in the foregoing Example 5-3.

The polysilicon thin film 523 thus formed by applying the laser beam 571a and the excimer lamp light 551a perpendicular to the amorphous silicon thin film 522 exhibited a crystal grain size of 1.5 μm, a field effect mobility of 150 cm$^2$/V·sec, and a density of defects of 8.7×10$^{11}$ cm$^{-2}$eV$^{-1}$, all of which were the same as those in the foregoing Example 5-5. The uniformities of the crystal grain size and field effect mobility in the respective regions of the polysilicon thin film 523 were further increased, and uniform characteristics were obtained throughout the entire surface of the polysilicon thin film 523.

In addition, a TFT was produced as in the foregoing Example 5-3 and the gate voltage (Vg)-drain current (Id) characteristic of the TFT thus prepared was measured. As shown in FIG. 50, the TFT of the present example showed the same characteristics as in the foregoing Example 5-5.

The selective reflection or transmission of laser beams and the like by the wavelength selective reflector 572 depending upon the wavelengths can be readily realized by using the KrF excimer laser 571, as described above. However, the present example is not limited thereto, but other short wavelength lasers employing XeBr, KrCl, ArF, ArCl, or the like may be employed.

EXAMPLE 5-7

Example 5-7 of the present invention will now be detailed with reference to FIGS. 54 to 56 and 50.

The present example 5-7 differs from the foregoing Example 5-6 in that the region 551b to be irradiated with the excimer lamp light 551a is 5 mm×70 mm, and the heating temperature of the amorphous silicon thin film 522 by the excimer lamp 551 is set at various temperatures. Other heating conditions and the like are identical to the foregoing Example 5-6. Specifically, the irradiation intensity of the excimer lamp light 551a shown in FIG. 54 was regulated to set the heating temperature of the amorphous silicon thin film 522 at various temperatures in the range of from a room temperature to 1200° C., thereby polysilicon thin films 523 were formed, and the crystal grain sizes and field effect mobilities were measured.

Figure 55:
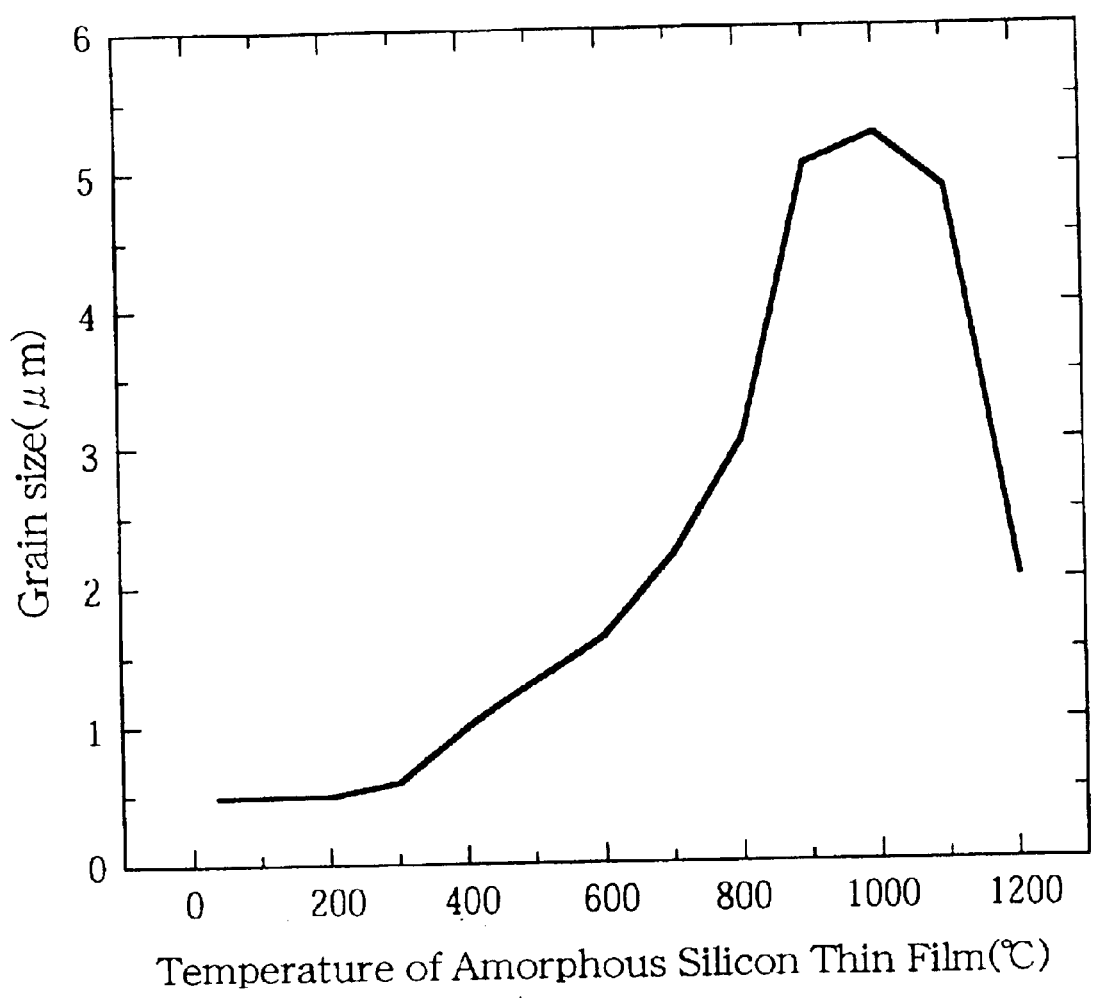
FIG. 55 is a graph showing the relationship between heating temperatures and crystal grain diameters in Example 5-7.

If the amorphous silicon thin film 522 is heated to about 300° C. or higher, the crystal grain size of the polysilicon thin film 523 increases along with the increase in the heating temperature as shown in FIG. 55, reaching the maximum of 5 μm at 1000° C. If the temperature exceeds 1000° C., the surface of the glass substrate 521 partly fuses, hindering the crystal growth, and as a result, the crystal grain size decreases.

Figure 56:
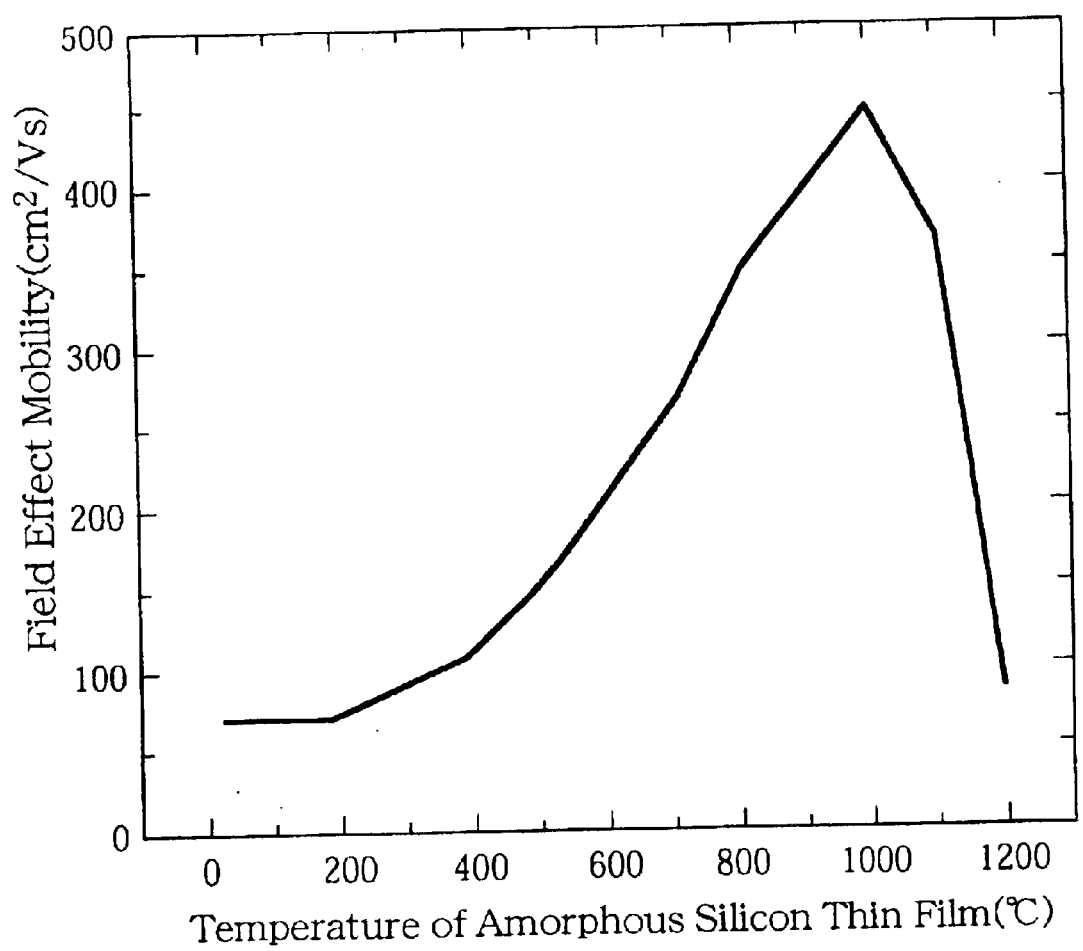
FIG. 56 is a graph showing the relationship between heating temperatures and field effect mobilities in Example 5-7.

In addition, the field effect mobility of the polysilicon thin film 523 increases along with the temperature increase as shown in FIG. 56, if the amorphous silicon thin film 522 is heated to about 300° C. or higher, reaching the maximum of 450 cm$^2$/V·sec at 1000° C. If the temperature exceeds 1,000° C., the field effect mobility also decreases.

In other words, it is especially effective in increasing the crystal grain size and improving the film quality of the polysilicon thin film 523 that the glass substrate 521 is heated by the heater 561 in addition to the irradiation with the laser beam 571a and at the same time the amorphous silicon thin film 522 is heated to the temperature in the range of 600 to 1100° C. by the irradiation with the excimer lamp light 551a.

In addition, a TFT was produced as in the foregoing Example 5-3 and the gate voltage (Vg)-drain current (Id) characteristic of the TFT thus prepared was measured. As shown in FIG. 50, which includes an example of the TFT in which the heating temperature of the amorphous thin film 522 is 600° C., the present example exhibited even better TFT characteristics than the foregoing Examples 5-5 and 5-6.

EXAMPLE 5-8

Example 5-8 of the present invention will now be detailed with reference to FIGS. 57 and 58, in addition to FIG. 50.

The present Example 5-8 differs from the foregoing Example 5-7 mainly in that a pulsed Xe flash lamp 581 is used in place of the excimer lamp 551.

Figure 57:
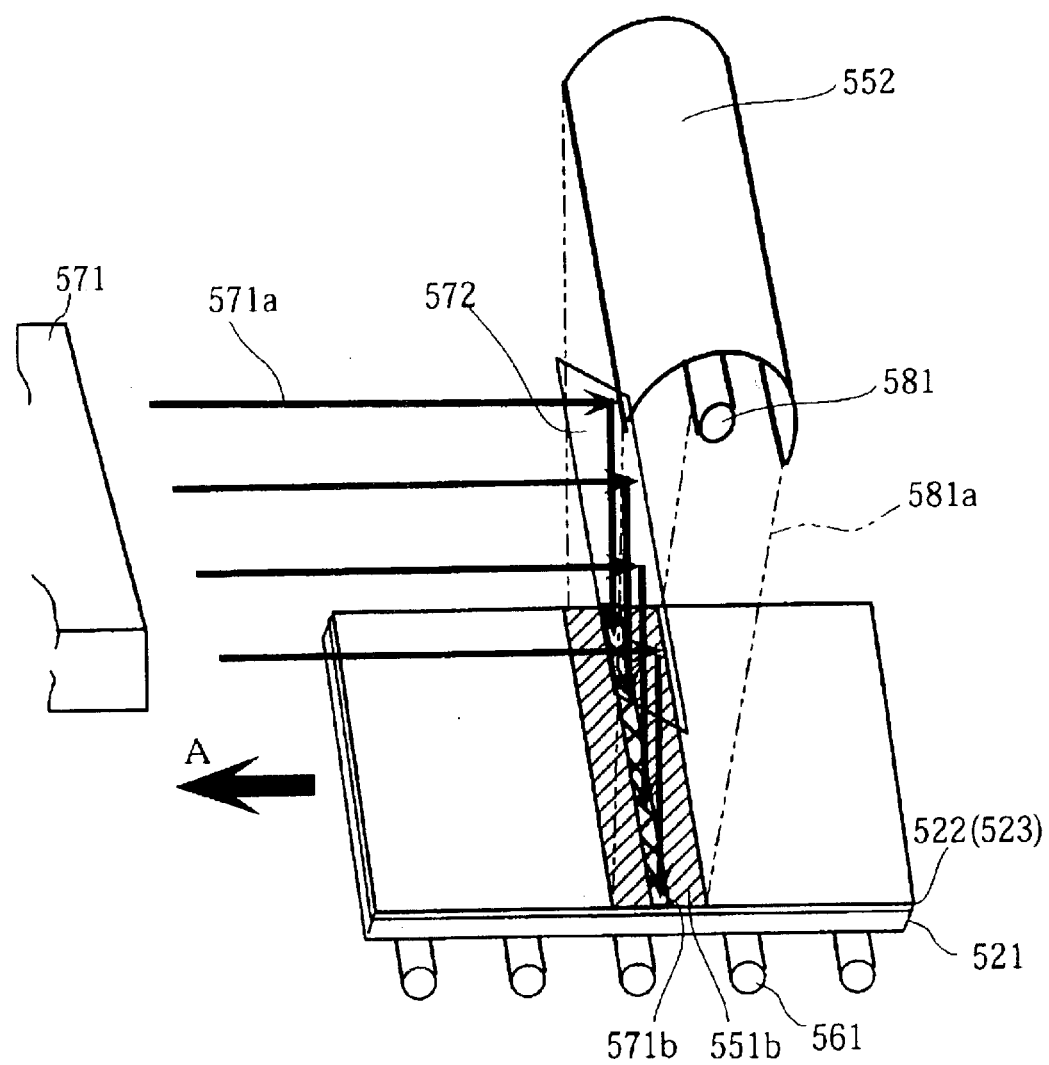
FIG. 57 is a schematic view illustrating a method of producing a polysilicon thin film of Example 5-8.
Figure 58:
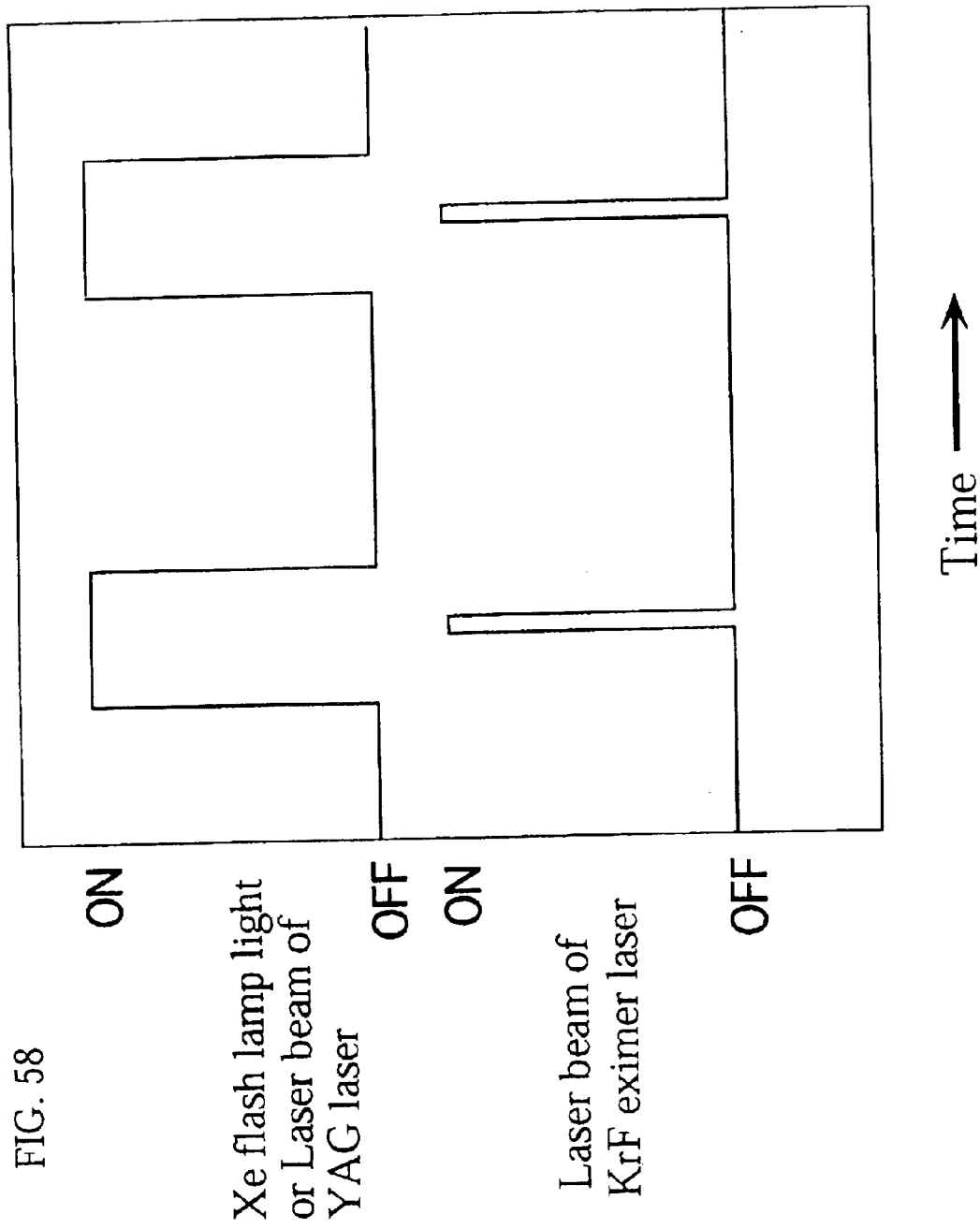
FIG. 58 illustrates timings of irradiation in Example 5-8.

Specifically, as shown in FIG. 57, the laser beam 571a of the KrF excimer laser 571 as in Example 5-7 is applied in such a manner that the region 571b to be irradiated in the amorphous silicon thin film 522 has a belt-like shape of 500 μm×200 mm. On the other hand, the Xe flash lamp beam 581a in the range from visible rays to ultraviolet rays, emitted from a flash Xe lamp 581, is applied to the region 581b to be irradiated of 5 mm×200 mm including the region 571b to be irradiated with the laser beam 571a so that the amorphous silicon thin film 522 is heated to about 1000° C. The Xe flash lamp beam 581a is, as shown in FIG. 58, synchronized with the irradiation pulse of the laser beam 571a, and applied so as to have a pulse width extending from before to after the pulse width of the laser beam 571a. The laser beam 571a is also so applied that the width of the irradiation pulse is not larger than ⅔ of its irradiation cycle. Other conditions such as heating conditions are the same as those in the foregoing Example 5-7.

The crystal grain size and field effect mobility of the polysilicon thin film 523 thus formed were substantially equal to those of the case where the amorphous silicon thin film 522 was heated to 1000° C. in the foregoing Example 5-7. Whereas in Example 5-7, some deformation was caused in the glass substrate 521, no deformation was observed in the present Example 5-8, which facilitates the production of proper semiconductor circuits more reliably Furthermore, the Xe flash lamp 581 has a high heating efficiency and therefore can heat a large area per one time of the irradiation, which can readily improve the productivity.

In addition, a TFT was produced as in the foregoing Example 5-3 and the gate voltage (Vg)-drain current (Id) characteristic of the TFT thus prepared was measured. As shown in FIG. 50, the present example exhibited still better TFT characteristics than the foregoing Examples 5-7.

EXAMPLE 5-9

Example 5-9 of the present invention will now be detailed with reference to FIGS. 59 and 50.

Figure 59:
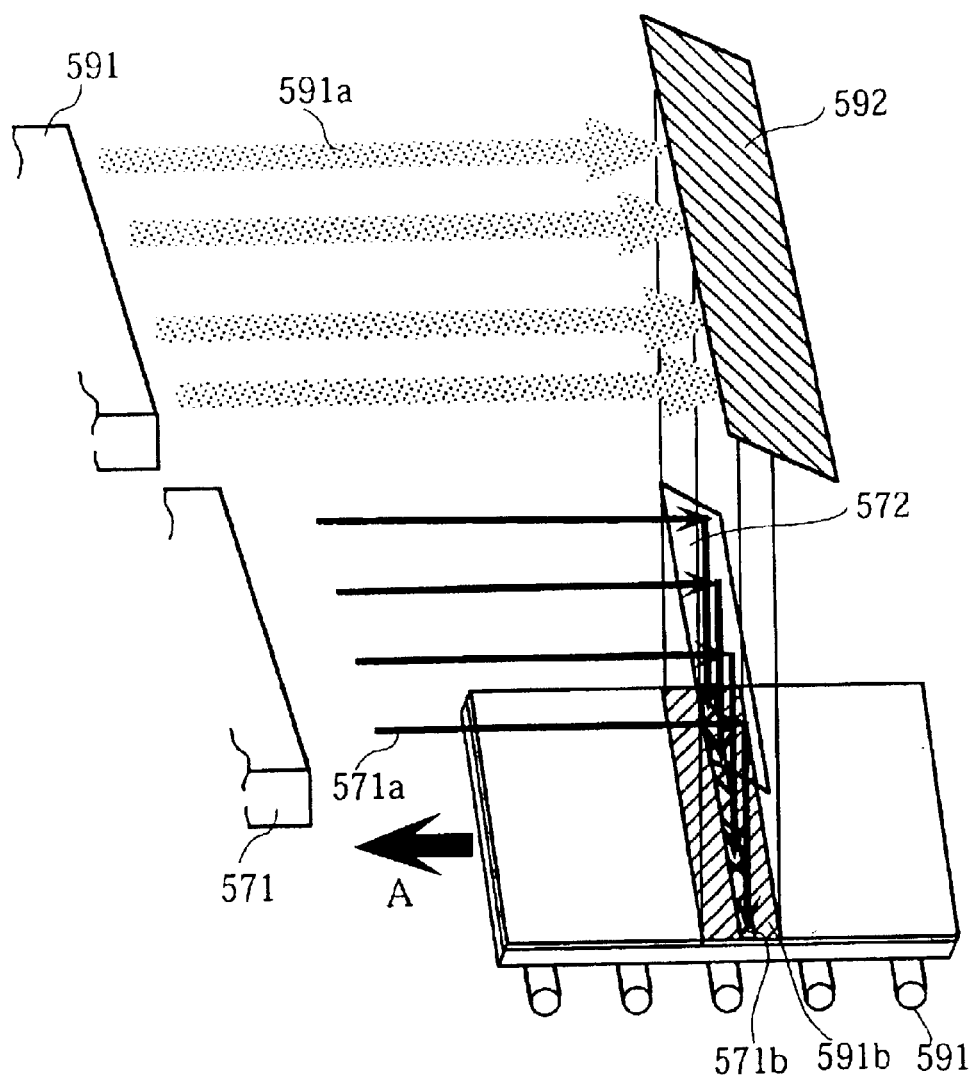
FIG. 59 is a schematic view illustrating a method of producing a polysilicon thin film of Example 5-9.

In the present example 5-9, as shown in FIG. 59, the laser beam 571a emitted from the same KrF excimer laser 571 as in Example 5-8 is reflected by the wavelength selective reflector 572 and applied to a belt-like shaped region 571b to be irradiated having an area of about 500 μm×200 mm in the amorphous silicon thin film 522. In addition, a laser beam 591a from a YAG laser system 591, in which the laser beam emitted from a YAG laser is converted into a beam having a half of the wavelength by using a KTP crystal, is reflected by a reflector 592 and applied to a region 591b to be irradiated having an area of 5 mm×200 mm in the amorphous silicon thin film 522. As described above, the laser beam 571a and laser beam 591a are reflected by the wavelength selective reflector 572 and the reflector 592, and then enter the amorphous silicon thin film 522 perpendicularly. The conditions such as the timing of irradiation with the laser beam 571a and the laser beam 591a, the pulse width, the irradiation energy of the laser beam 571a, and the heating temperature of the glass substrate 521 by the heater 561, are the same as those in the foregoing Example 5-8.

The heating temperatures of the amorphous silicon thin film 522 by the laser beam 591a of the YAG laser system 591 were varied from room temperature to 1200° C. in the formation of the polysilicon thin films 523, and the crystal grain sizes and field effect mobilities were measured. When the heating temperature of the amorphous silicon thin film 522 was 1100° C., both crystal grain size and field effect mobility reached the maximums of 5.5 μm and 600 cm$^2$/V·sec respectively. That is, because the YAG laser system 591 was used for preheating, the glass substrate 521 did not cause deformation or melt to cause impurities to mix into the polysilicon thin film 523, even if the amorphous silicon thin film 522 is heated to a relatively high temperature. Therefore, still better crystalline polysilicon thin film 523 was obtained than that of the foregoing Example 5-7 where the amorphous silicon thin film 522 was heated by the excimer lamp 551. However, when the amorphous silicon thin film 522 was further heated to 1200° C., both crystal grain size and field effect mobility were decreased. The reason is that microcrystalline silicon is already formed by the preheating with the YAG laser system 591, and this causes an adverse effect on the crystal growth process by the KrF excimer laser 571.

In addition, a TFT was produced as in the foregoing Example 5-3 and the gate voltage (Vg)-drain current (Id) characteristic of the TFT thus prepared was measured. As shown in FIG. 50, the present example exhibited still better TFT characteristics than the foregoing Examples 5-8.

The laser system for preheating is not limited to the YAG laser system 591 described above. The same advantageous effects can be achieved by using, for example, a pulsed laser such as an XeCl excimer laser if the irradiation is implemented with a wavelength different from the wavelength of the KrF excimer laser 571 and with a pulse width longer than the KrF excimer laser 571 depending on the mixing ratio of the gas, and further with the timing shown in FIG. 58. In addition, a continuous-wave laser system such as an Ar laser or the like may also be employed.

The foregoing examples describe the examples in which silicon (Si) is employed as a semiconductor, but the invention is not so limited. It has been confirmed that the same advantageous effects can be obtained by III–V compound semiconductors such as germanium (Ge) and gallium arsenide (GaAs), and II–VI compound semiconductors such as zinc selenide (ZnSe). Further possible examples include silicon carbide (SiC) and silicon germanium (SiGe).

It is also noted that the irradiation of the amorphous silicon thin film 522 with the laser beam 531a may be performed in such a manner that the laser beam 531a is applied from the direction of the glass substrate 521, or from both directions of the amorphous silicon thin film 522 and the glass substrate 521.

In addition, in place of the glass substrate 521, other substrates may be used, and the examples of usable substrates include a substrate made of quartz or organic materials such as plastics and a substrate having an insulating film formed on a surface of a conductive substrate.

Further, the laser beam 532a or the like for preheating may be applied in such a manner that the laser beam 532a or the like is applied not to the entire region of the amorphous silicon thin film 522 but only to a region where high TFT characteristics are required, while the other region is, as in the prior art, irradiated only with the laser beam 531a or the like for crystallization.

EXAMPLE 6-1

An example in which a thin film transistor as a semiconductor device is employed for a liquid crystal display device will be explained in the following.

In an active matrix-type liquid crystal display device, thin film transistors in the image display region are required to have a high uniformity in transistor characteristics in order to reduce unevenness in the displayed images, whereas thin film transistors for the driving circuit disposed in a peripheral region adjacent to the image display region are required to have a high response characteristic. However, despite the extensive research on various methods for growing crystals, it is not easy to achieve both the uniformity in characteristics and the high response characteristic at the same time. In view of this, in the present example, a plurality of regions are provided in a semiconductor film (amorphous silicon layer) and the regions are irradiated in different manners of irradiation, thereby making it possible that each region obtains required characteristics. Specifically, a first laser light is applied to the entire surface or to only the image display region, and thereafter, a second laser light is applied, with the second laser light having a higher energy density than the first laser light. With reference to the drawings, a laser annealing apparatus and a method of laser annealing are specifically detailed below.

Figure 9:
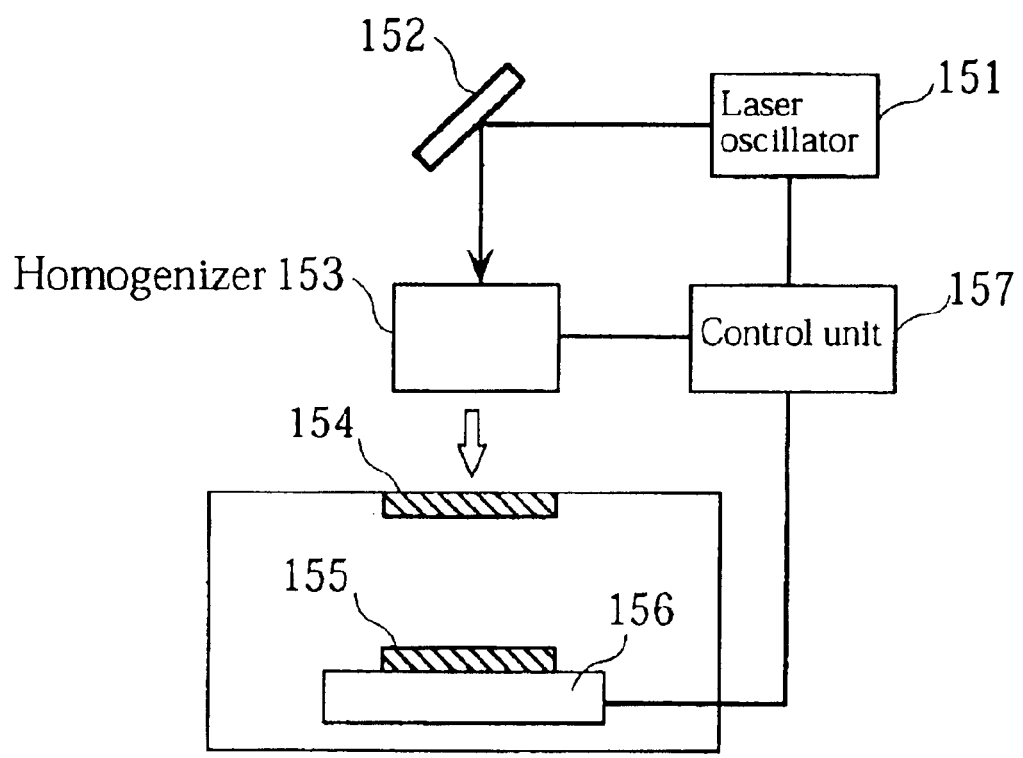
FIG. 9 is a schematic view showing a prior art laser anneal apparatus.
Figure 10:
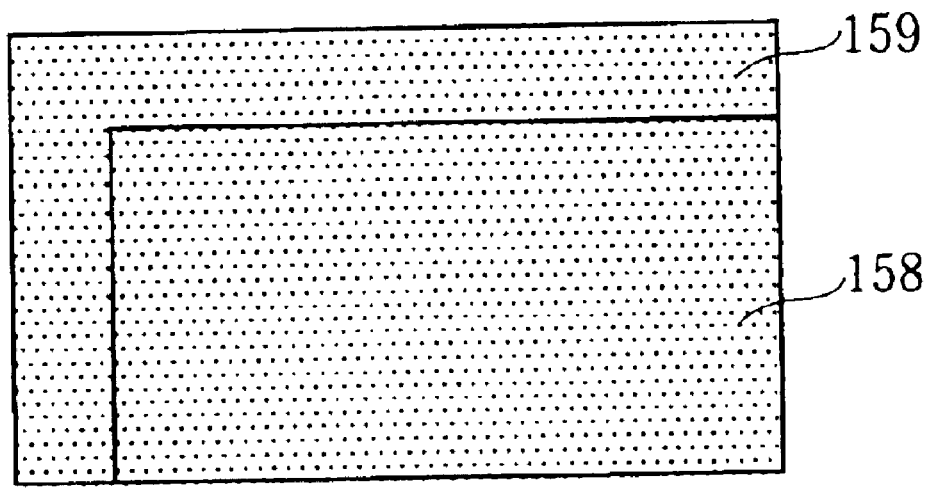
FIG. 10 illustrates a laser-annealed region in a liquid crystal display.
Figure 11:
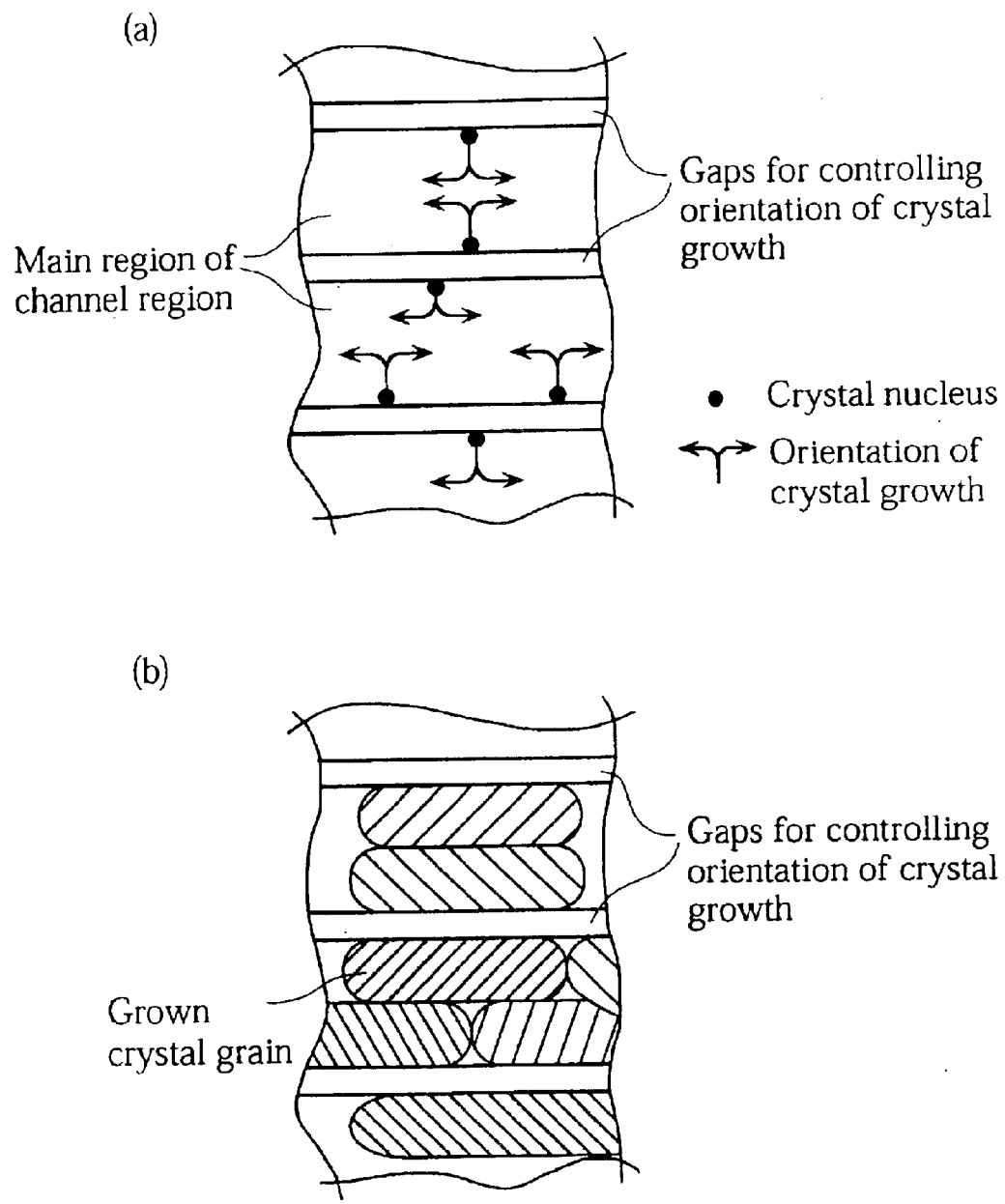
FIGS. 11(a) and (b) illustrate an orientation of crystal growth in an a-Si film provided with gaps for controlling an orientation of crystal growth.

A laser annealing apparatus employed in the present example may have a configuration similar to the prior art apparatus shown in FIG. 9. In FIG. 9, there are shown a laser oscillator 151, a reflector 152, a homogenizer 153, a window 154, a substrate 155 having an amorphous silicon layer formed thereon, a stage 156, and a control unit 157.

In the laser annealing of the amorphous silicon layer, the laser light emitted from the laser oscillator 151 is led to the homogenizer 153 by the reflector 152, so as to be shaped in a predetermined shape with a uniform energy, and the shaped laser beam is applied through the window 154 to the substrate 155 mounted on the stage 156 in the treatment chamber. In the present example, however, the control unit 157 is so configured that the laser light can be applied exclusively each of a plurality of predetermined regions in the substrate 155 and the irradiation conditions can be varied for each region to be irradiated.

Figure 60:
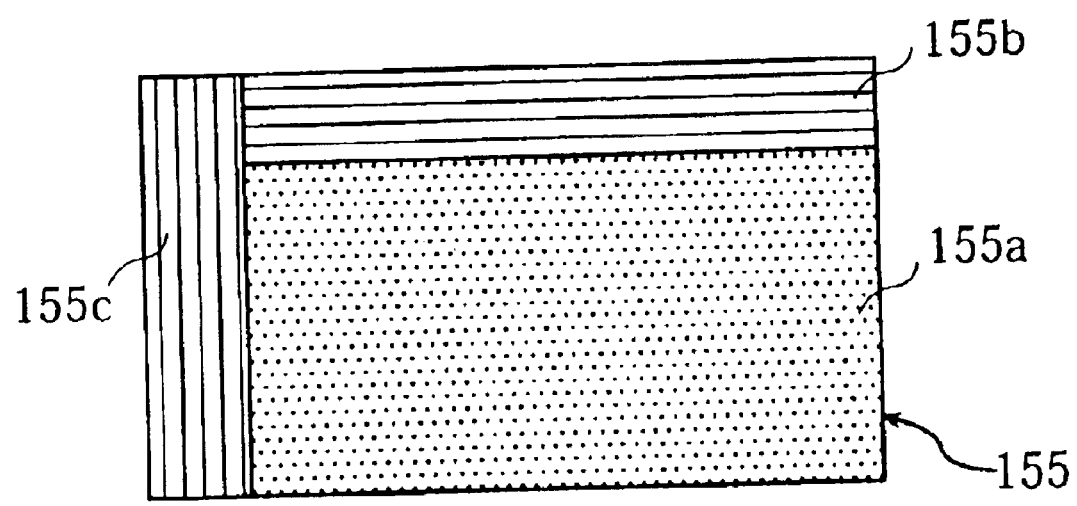
FIG. 60 illustrates a region in a liquid crystal display to be irradiated with a laser light in Example 6-1.

Using the laser annealing apparatus described above, a first laser light irradiation is performed in the following manner; a laser light shaped by using the homogenizer 153 into a line-like cross-sectional shape (for example, 300 μm wide and 10 cm long) is applied to the entire region of the substrate 155 so that the energy density becomes 280 mJ/cm$^2$, while the substrate 155 is being moved so that the regions to be irradiated are partially overlapped each other (scan irradiation using a line-like shaped laser light). This laser light irradiation may be performed exclusively in the image display region 155a in FIG. 60.

Next, a second laser light irradiation is performed in the following manner; a laser light is applied to the driving circuit regions 155b and 155c with an energy density of 400 mJ/cm$^2$, which is higher than that in the first laser light irradiation (scan irradiation using a line-like shaped laser light).

Figure 61:
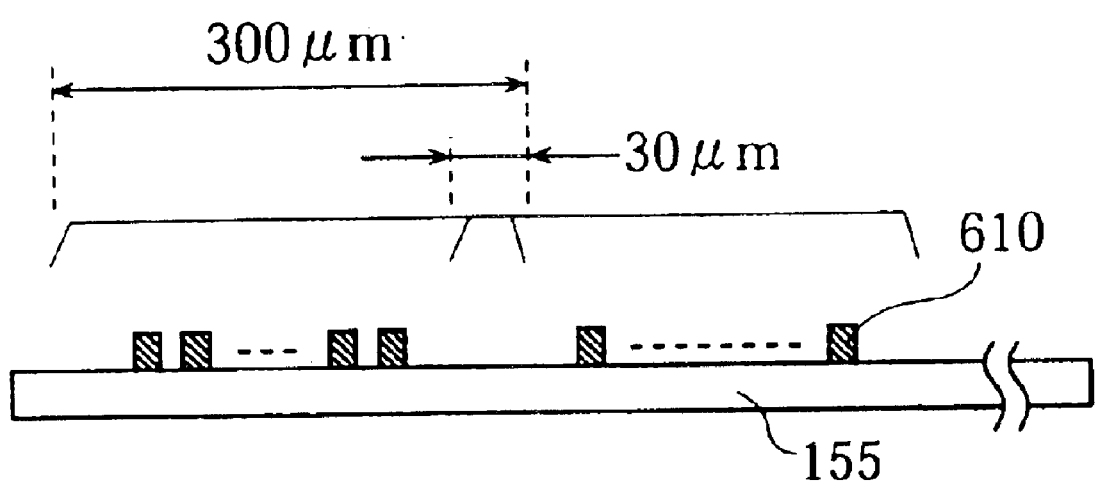
FIG. 61 a schematic view illustrating a method of applying a laser light in Example 6-1.

The substrate 155 is, for example, such a substrate that an amorphous silicon layer is formed on a glass substrate by plasma CVD to have a thickness of 500 Å, and thereafter the substrate with the amorphous silicon layer is dehydrogenation-treated for one hour at 450° C. The laser light is, for example, such that a laser light oscillates with a pulse width of 25 ns and an interval of 300 Hz. The laser light scans the substrate 155 in a relative manner by moving the substrate 155 at a predetermined speed. In the second laser light irradiation, the scan is performed so that, as shown in FIG. 61, the regions to be irradiated overlap by 30 μm in each of the regions (the rate of overlap being 10%). In this case, unevenness is caused in characteristics such as mobilities between an overlapped region in which the laser light is repeatedly applied and the rest of the regions. However, as shown in the figure, such unevenness in TFT characteristics and so forth can be readily minimized by forming the TFT 610 or the like so as to avoid the overlapped region, and using the overlapped region for wiring pattern or the like. Further, in the second laser light irradiation, a total time for the irradiation can be reduced if the direction of line-like shaped beam is made parallel to each of the sides of the substrate 155 (the directions designated by the solid lines in the driving circuit regions 155b and 155c) and the scanning is performed in the directions perpendicular to each of the sides. To make this possible, the stage on which the substrate 155 is mounted is rotated 90 degrees in the laser irradiation. (It is possible to rotate 90 degrees the direction of the line-like shaped beam, but generally, this is difficult.)

By the first laser light irradiation described above, crystallization is performed in such a manner as to ensure the uniformity of semiconductor film characteristics required for the image display region 155a, while by the second layer light irradiation, high field effect mobilities are achieved in the driving circuit regions 155b and 155c. Specifically, while performing laser light irradiations under various irradiation conditions, the present inventors found that in a scan irradiation with an energy density of 300 mJ/cm$^2$ or greater, unevenness in field effect mobilities tends to occur in the overlapped region in each scan. In view of this problem, the laser light is applied with an energy density lower than 300 mJ/cm$^2$ to the image display region 155a, in which uniformity of characteristics of polycrystal silicon in a plane is required, whereas the laser light is applied with an energy density higher than 300 mJ/cm$^2$ to the driving circuit regions 155b and 155c, in which good characteristics such as a high field effect mobility are required. Thereby, without achieving both uniformity and improvement of film characteristics at the same time, polycrystal silicon layers having different characteristics from each other, each layers in which a different requirement is met, can be formed respectively in the image display region 155a and the driving circuit regions 155b and 155c.

EXAMPLE 6-2

Another example in which a thin film transistor is employed for a liquid crystal display device will be explained in the following.

The present example differs from the foregoing Example 6-1 in that the second laser light irradiation employs a laser beam having a square-like cross-sectional shape, whereas the first laser light irradiation employs a laser beam having a line-line cross-sectional shape as in the foregoing Example 6-1.

The laser annealing apparatus in the present example differs from the apparatus in FIG. 9 in that, as shown in FIGS. 62(a) and 62(b), a homogenizer A 621 for shaping the cross-sectional beam shape of a laser light into a line-like shape and a homogenizer B 622 for shaping the cross-sectional beam shape into a square-like shape (1 cm square, for example) are employed in place of the homogenizer 153. (Like or corresponding parts shown in FIG. 9 are designated by like reference numerals or characters in FIGS. 62(a) and 62(b) and will not be further elaborated upon.)

Figure 63:
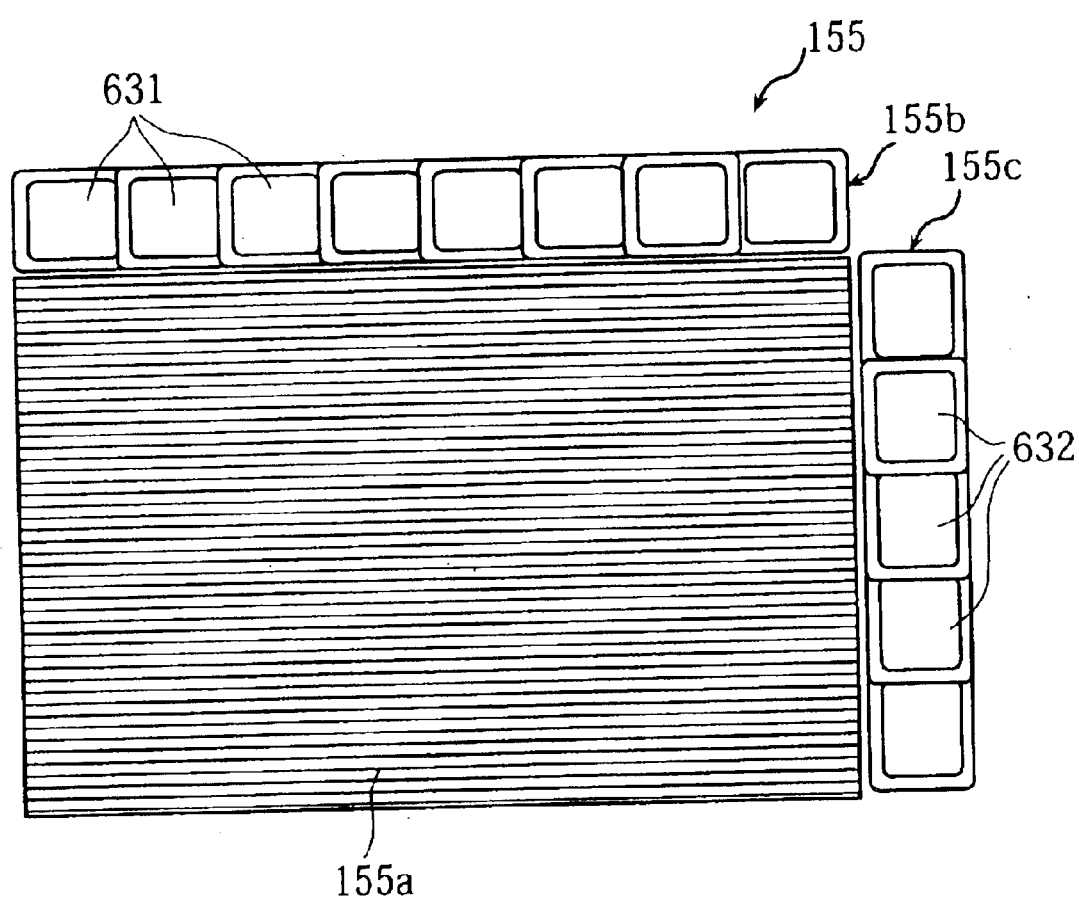
FIG. 63 illustrates a region to be irradiated with a laser light in Examples 6-2 and 6-3.

Using the laser annealing apparatus described above, firstly as shown in FIG. 62(a), a laser light having a line-like cross-sectional shape is applied via the homogenizer A 621 to the entire region of the substrate 155 or only the image display region 155a with an energy density of 280 mJ/cm$^2$, at which energy density the uniformity is ensured (scan irradiation using a line-like shaped laser light). Thereafter, using the homogenizer B 622 as shown in FIG. 62(b), a laser light having a square-like cross-sectional shape is applied, as shown in FIG. 63, to each of the irradiated regions 631 and 632 with an energy density of 400 mJ/cm$^2$ (scan irradiation using a square-like shaped laser light).

By employing a laser light having a square-like cross-sectional beam shape as above, it is made possible to laser-anneal the driving circuit regions 155b and 155c without rotating the substrate 155 by 90 degrees as in the case of the foregoing Example 6-1. Accordingly, in the present example, polycrystal silicons having different characteristics in the pixel region and the driving circuit region can be obtained as well as in the foregoing Example 6-1, and in addition, the simplification in the apparatus and the fabrication steps can be readily achieved.

EXAMPLE 6-3

The second laser light irradiation in the foregoing Example 6-2 may be performed a plurality of times. Specifically, in the second laser light irradiation as in the foregoing Example 6-2, the substrate 155 is not moved, and by fixing the regions to be irradiated with the laser light, the laser irradiation may be performed in a stationary sate for each of the regions 631 and 632 corresponding to the square-like laser beam shape. When each of the regions 631, 632 to be irradiated is overlapped by, for example, about 30 μm in the case of the laser light having 1 cm square cross-sectional shape, the field effect mobility in the region where the laser light is not overlapped can be readily increased to a remarkable degree, and the uniformity in the region can also be improved. Here, if the energy density of the laser light is high as described above, unevenness is caused in characteristics such as mobilities between an overlapped region in which the laser light is repeatedly applied and the rest of the regions. However, for the driving circuit regions 155b and 155c, the uniformity throughout the entire region as required for the image display region 155a is not necessarily required. In view of this, the driving circuit should be formed so that the pattern of the semiconductor film (TFT pattern) avoids the overlapped region of the laser shot (the edge of the laser beam), and the overlapped region should be used for wiring pattern or the like. In other words, only the portion of the polysilicon in which characteristics are uniform should be used for forming TFTs or the like. If the overlapped regions are not used as such, the area of the overlapped regions is relatively small, and therefore the utilization efficiency of the driving circuit regions 155b and 155c is not so degraded.

Figure 64:
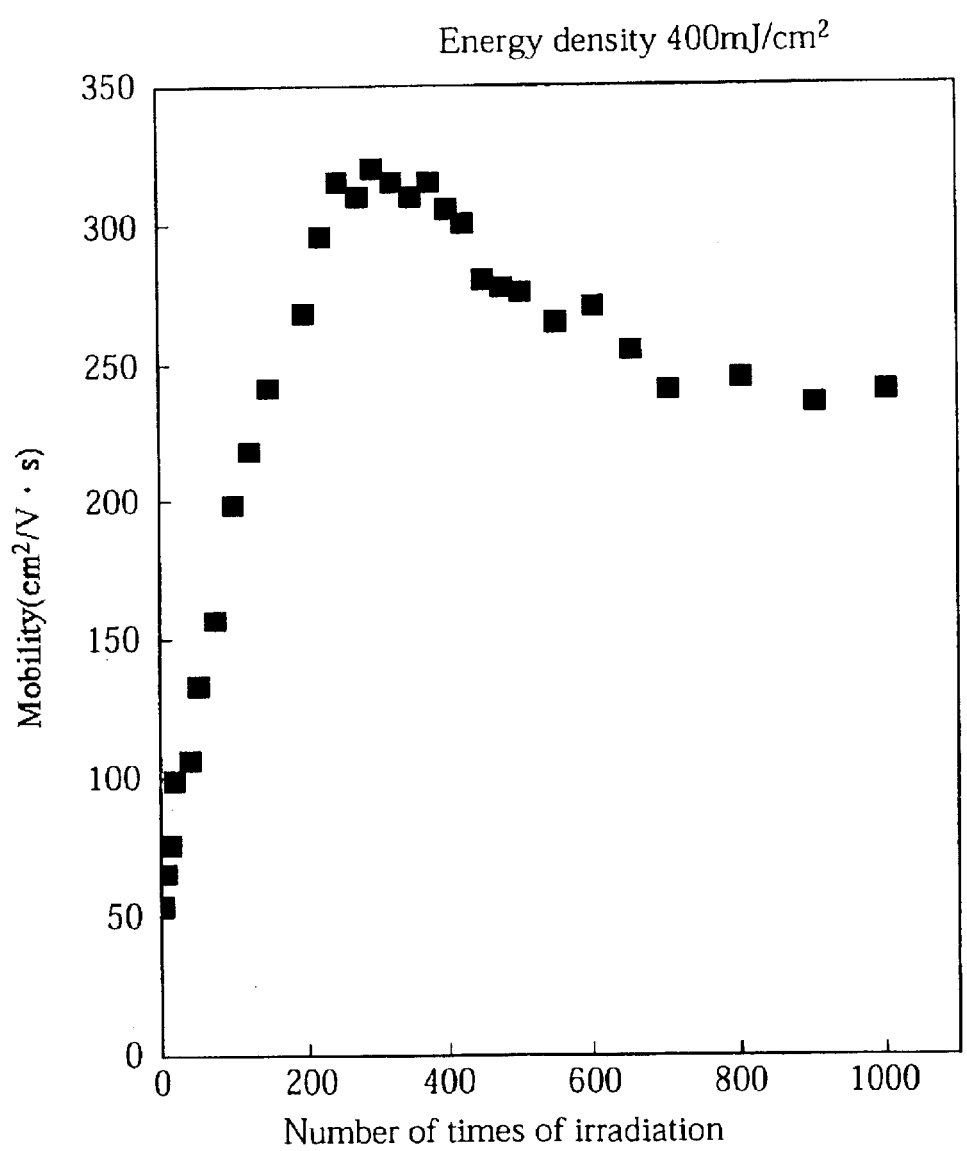
FIG. 64 is a graph showing a dependency of mobilities on numbers of laser irradiation times in Example 6-3.

In addition, the film characteristics can be further improved by performing the laser light irradiation a plurality of times (for example 30 times) for each of the regions 631 and 632. FIG. 64 illustrates the relationship between the number of the irradiation in the stationary state and the mobility of the resulting polycrystal silicon. As apparent from FIG. 64, the number of the laser irradiation has a preferable range, and the mobility decreases outside the preferable range. In the case of the energy density in the stationary irradiation being 400 mJ/cm$^2$, the number of the irradiation is preferable to be 50 times or more, or more preferably in the range of 80 times to 400 times, to obtain a polycrystal silicon having a high field effect mobility. It is noted that the effect of improving the field effect mobility by performing the laser light irradiation in a stationary state can be also obtained in the case of employing a line-like shaped laser light, although the effect is not as great as that in the case of the square like shaped laser light.

EXAMPLE 6-4

The conditions of the laser light irradiation for the image display region 155a are differentiated from that for the driver circuit regions 155b, 155c in the foregoing Examples 6-1 to 6-3. Additionally, the conditions of the laser light irradiation may be further varied by dividing the region to be irradiated into further more regions in the driving circuit region, in order to obtain polycrystal silicons having different characteristics within the driving circuit region. Specifically, for example, in the second laser light irradiation in the foregoing Example 6-3, a region in the driving circuit regions 155b and 155c in which a transfer gate in the latch or shift resistor is formed may be irradiated with a high energy density (or example 400 mJ/cm$^2$) since such a region requires a high mobility, and the other region may be irradiated with an energy density of about 330 mJ/cm$^2$, in order to achieve, rather than the mobility, the uniformity obtained by the reduction in noises and adjustment variations and the improvement in productivity attained by making the region to be irradiated large. The variations in the conditions of the irradiation can be also attained by varying the number of times of the irradiation, which will results in substantially the same effect.

EXAMPLE 6-5

Still another example of the laser annealing apparatus will be described.

Figure 65:
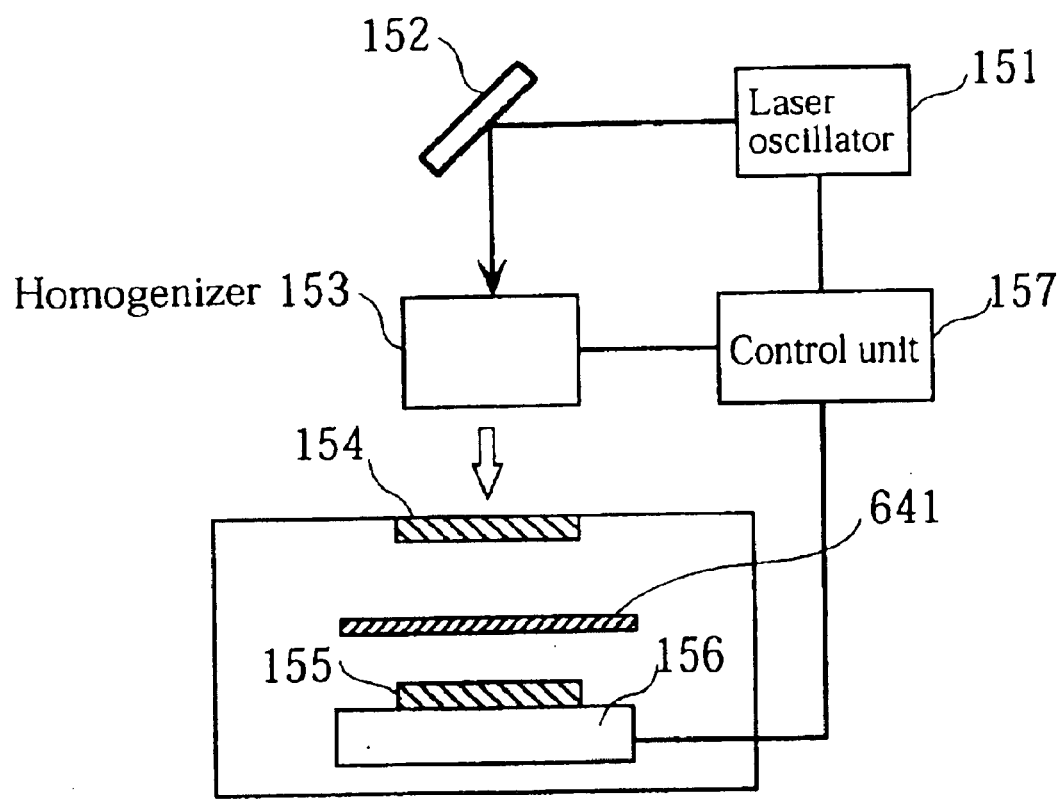
FIG. 65 is a schematic view showing a laser annealing apparatus in Example 6-5.
Figure 66:
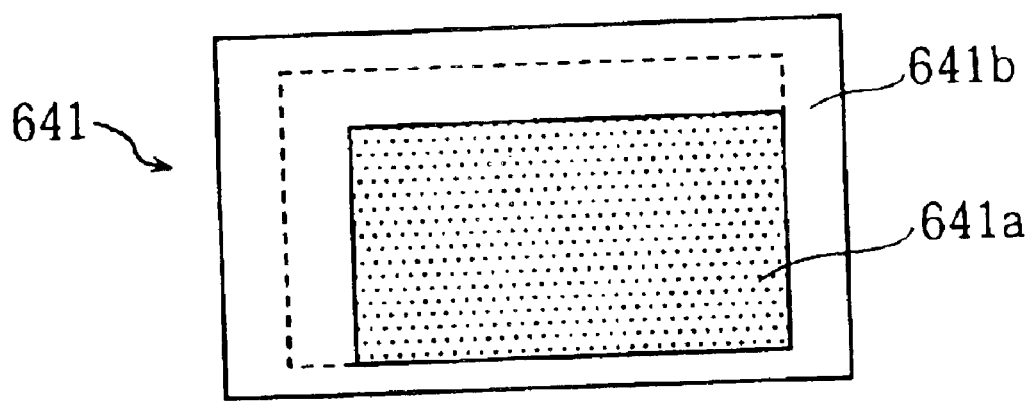
FIG. 66 is a plan view showing a configuration of a mask material in Example 6-5.

The laser annealing apparatus in this example differs from the apparatus in FIG. 9 in that a mask 641 in which a transmissivity of a laser light is partially different is provided between the window 154 and the stage 156, as shown in FIG. 65. The mask 641 comprises an attenuating region 641a corresponding to the image display region 155a of the substrate 155 and a transmitting region 641b corresponding to the driver circuit regions 155b, 155c, as shown in FIG. 66. Specifically, for example, transmissivities of the laser light can be partially determined at a desired value by a quartz plate being partially covered with such an optical thin film as an ND filter or a dielectric multilayer film, and thereby the energy density of the laser light irradiation can be reduced in the pixel region.

By employing the laser annealing apparatus described above, the laser light shaped into a line-like cross-sectional shape is applied to the entire region in the substrate with an energy density of 400 mJ/cm$^2$ while the laser beam or the mask 641 is/are being moved. This makes it possible for the image display region 155a to be laser-annealed with an energy density of 280 mJ/cm$^2$, as in the foregoing Example 6-1. That is, it is made possible to form semiconductor films having different characteristics between a pixel region and a driving circuit region at one time.

Although the mask 641 is disposed so that a certain distance is provided between the mask 641 and the window 154 and between the mask 641 and the substrate 155 as shown in FIG. 65, but the present example is not so limited. The mask 641 may be disposed so as to be in contact with the substrate 155 to improve the flatness of the surface to be irradiated, or may be integrally formed with the window 154. Further, the mask 641 may be provided in the homogenizer 153, or may be not such a mask that the intensity of laser light is attenuated, but such that the intensity of the laser light is varied by a refracting optical system or the like.

EXAMPLE 6-6

An example of a laser annealing apparatus that can further improve the uniformity in the image display region will be given below.

Figure 67:
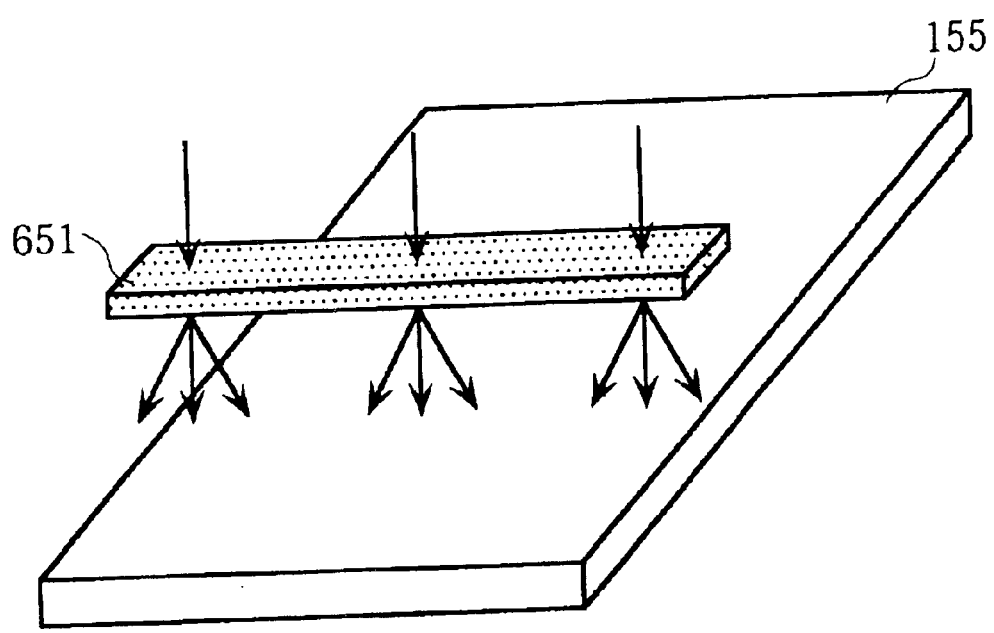
FIG. 67 is a schematic view illustrating a method of laser annealing of Example 6-6.

In the laser annealing apparatus of Example 6-6, a homogenizing optical element 651 for scattering an incoming laser beam is provided over the substrate 155, as shown in FIG. 67. Thereby, it is made possible to reduce unevenness in the luminous energy caused by such as diffraction, the shape of the laser beam, and the like. It is also made possible to prevent instability of the laser pulse resulting from the reflected light from the substrate 155 returning to the laser oscillator.

Figure 68:
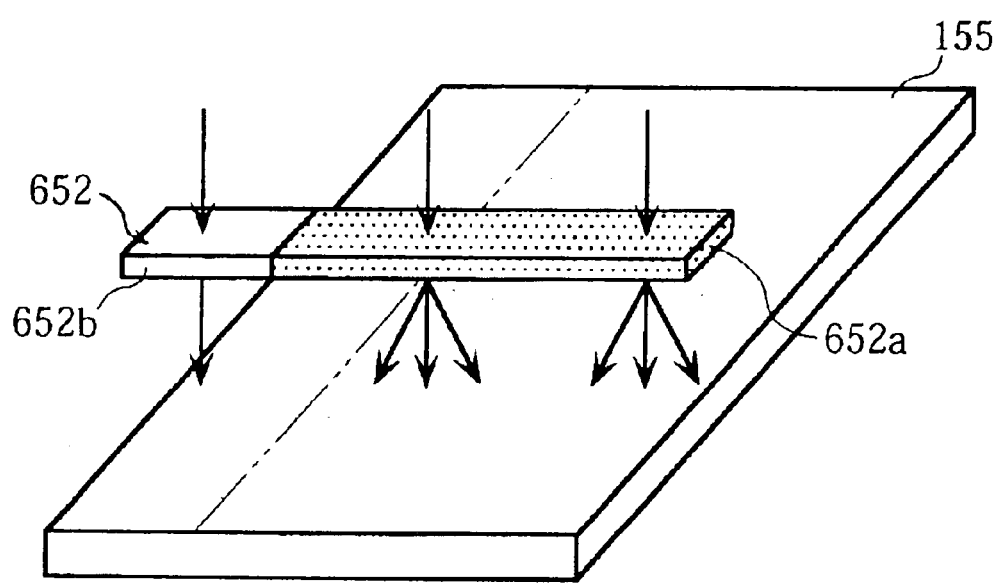
FIG. 68 is a schematic view illustrating another example of a method of laser annealing of Example 6-6.

In addition, as shown in FIG. 68, a combined homogenizing optical element 652 may be employed to simultaneously form a region having a high uniformity and a region having a high crystallinity in the semiconductor layer. The combined homogenizing optical element 652 has a scattering region 652a and a transmission region 652b having a mirror finish or the like.

It is to be understood that while the respective examples described above can achieve the respective advantageous effects as described above, the foregoing examples may be combined with each other to obtain synergistic effects in addition to the respective effects, insofar as the achieved effects are consistent with each other.

Industrial Applicability

As has been described thus far, according to the present invention, the following advantageous effects are achieved.

Firstly, according to the present invention, it is possible to produce a polycrystal silicon thin film in which the region where a transistor is to be formed has a larger grain size, thereby to remarkably improve transistor characteristics such as the field effect mobility, and a large scale driving circuit can be integrated for example in a liquid crystal display device and so forth. In addition, the hydrogen content and the stress in the thin film can be reduced by employing a silicon oxynitride thin film in which oxygen is added to silicon nitride as an insulating film, and thereby, a more stable transistor can be obtained. Furthermore, the grain size and orientation of crystals can be controlled, and the interference between the crystals in the process of growth can be prevented, which leads to a sufficient grain size. Furthermore, in the present invention, crystal nuclei starts to be formed in the peripheral regions earlier than in prior art, and as a result, it is possible for crystal growth to proceed quicker than in prior art.

In addition, according to the present invention, at least the channel region on the non-single crystalline semiconductor layer is provided with a region for controlling the orientation of crystal growth such as a gap for controlling an orientation of crystal growth or the like, which controls the crystal growth in the directions of the source region and the drain region. Thus, large crystal grains longitudinally extending in the direction linking the source region and the drain region are formed, and thereby a crystalline thin film transistor having a small density of crystal boundaries is attained, the transistor being excellent in TFT characteristics such as the field effect mobility.

According to the present invention, furthermore, the uniformity and crystallinity of crystal grains are further improved by a means of appropriately adjusting an intensity pattern of the light beam. Thus, a crystallized region having a high degree of field effect mobility can be formed on a limited or specific region on the substrate without producing adverse effects on other circuits. As a consequence, it is made possible to integrally form pixel transistors and a driving circuit, which requires several tens of times to several hundreds of times higher mobility, on the same substrate. It is also made possible to integrally form CPUs and the like on a single substrate, and therefore, according to the invention, high-performance AM-LCDs having a high degree of integration can be produced at low cost.

In addition, by applying at least two types of energy beams resulting in different absorption indices of a precursor semiconductor film, the precursor semiconductor film is heated throughout the thickness direction and the substrate is also heated. As a result, the precursor semiconductor film is crystallized while being annealed. Thereby, crystal growth is promoted, enabling relatively large crystal grains, and further, crystal defects are reduced, improving electrical characteristics of the semiconductor film. Moreover, in comparison with the case of using a heater or the like, the time for heating the substrate can be reduced, which leads to an improvement in the productivity.

In addition, it is possible to form a plurality of regions having different characteristics, one region having good semiconductor film characteristics and another having a high uniformity. Thereby, both the good characteristics necessary for the circuit region and the high uniformity required for the pixel region are achieved in, for example, a thin film transistor array for use in a liquid crystal panel having a built-in peripheral driving circuits.

What is claimed is:

1. A semiconductor device comprising a crystalline semiconductor layer located on a substrate, said crystalline semiconductor layer comprising a non-single crystalline thin film, a channel region, a source region and a drain region each located on opposing sides of the channel region, wherein:

said channel region comprises a main portion and an early-crystallization region, and material comprises said early-crystallization region has a first crystallization-starting temperature higher than a second crystallization-starting temperature of material comprising said main portion of said channel region.

2. A semiconductor device according to claim 1, wherein said early-crystallization region has a shape longitudinally extending in a direction linking said source region and said drain region.

3. A semiconductor device according to claim 1, wherein said early-crystallization region and said main portion of said channel region both comprise a same material component, and said early-crystallization region material further comprises and impurity.

4. A semiconductor device according to claim 1, wherein said crystalline semiconductor layer comprises a material selected from the group consisting of silicon and a compound of silicon and germanium.

* * * * *

UNITED STATES PATENT AND TRADEMARK OFFICE
CERTIFICATE OF CORRECTION

PATENT NO. : 6,806,498 B2  Page 1 of 1
DATED : October 19, 2004
INVENTOR(S) : Yoshinao Taketomi et al.

It is certified that error appears in the above-identified patent and that said Letters Patent is hereby corrected as shown below:

Title page,
Item [75], Inventors, change "Yoshinao Taketomi, Kytanabe" to -- Yoshinao Taketomi, Kyotanabe --.
Item [56], References Cited, FOREIGN PATENT DOCUMENTS, change "JP02-695462" to -- JP2695462 --.

Column 68,
Line 18, change "comprises" to -- comprising --.
Line 30, change "and" to -- an --.

Signed and Sealed this

Twenty-second Day of March, 2005

JON W. DUDAS
*Director of the United States Patent and Trademark Office*